(12) United States Patent
Kamimura et al.

(10) Patent No.: US 12,210,287 B2
(45) Date of Patent: Jan. 28, 2025

(54) RESIST PATTERN FORMING METHOD AND SEMICONDUCTOR CHIP MANUFACTURING METHOD

(71) Applicant: FUJIFILM Corporation, Tokyo (JP)

(72) Inventors: Tetsuya Kamimura, Shizuoka (JP); Yukihisa Kawada, Shizuoka (JP); Masahiro Yoshidome, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 672 days.

(21) Appl. No.: 17/465,834

(22) Filed: Sep. 2, 2021

(65) Prior Publication Data

US 2021/0405535 A1 Dec. 30, 2021

Related U.S. Application Data

(63) Continuation of application No. PCT/JP2020/005951, filed on Feb. 17, 2020.

(30) Foreign Application Priority Data

Mar. 4, 2019 (JP) ................. 2019-038595

(51) Int. Cl.
  *G03F 7/40* (2006.01)
  *G03F 7/32* (2006.01)
  *H01L 21/027* (2006.01)

(52) U.S. Cl.
  CPC ............. *G03F 7/40* (2013.01); *G03F 7/327* (2013.01); *H01L 21/0274* (2013.01)

(58) Field of Classification Search
  CPC ......... G03F 7/40; G03F 7/327; H01L 21/0274
  See application file for complete search history.

(56) References Cited

U.S. PATENT DOCUMENTS

| | | | |
|---|---|---|---|
| 2008/0187860 A1 | 8/2008 | Tsubaki et al. | |
| 2011/0300485 A1* | 12/2011 | Tsubaki | G03F 7/325 430/296 |
| 2012/0058436 A1 | 3/2012 | Tsubaki et al. | |
| 2012/0315449 A1 | 12/2012 | Tsubaki et al. | |
| 2015/0079522 A1 | 3/2015 | Tsubaki et al. | |
| 2016/0103395 A1 | 4/2016 | Tsubaki et al. | |
| 2016/0154314 A1 | 6/2016 | Hatakeyama et al. | |
| 2016/0349619 A1 | 12/2016 | Tsubaki et al. | |

FOREIGN PATENT DOCUMENTS

| | | |
|---|---|---|
| JP | 2008281980 | 11/2008 |
| JP | 2008292975 | 12/2008 |
| JP | 2010217884 | 9/2010 |
| JP | 2015084122 | 4/2015 |
| JP | 2016110088 | 6/2016 |

OTHER PUBLICATIONS https://www.chemicalbook.com/ProductDetail_EN_4-methyl-2-pentanol_2335065.htm (Year: 2024).*
Office Action of Japan Counterpart Application, with English translation thereof, issued on Jul. 12, 2022, pp. 1-6.
"International Search Report (Form PCT/ISA/210) of PCT/JP2020/005951," mailed on Mar. 24, 2020, with English translation thereof, pp. 1-5.
"Written Opinion of the International Searching Authority (Form PCT/ISA/237)" of PCT/JP2020/005951, mailed on Mar. 24, 2020, with English translation thereof, pp. 1-10.
Office Action of Japan Counterpart Application, with English translation thereof, issued on Jan. 10, 2023, pp. 1-8.

* cited by examiner

*Primary Examiner* — Sean M DeGuire
*Assistant Examiner* — Alexander N. Lee
(74) *Attorney, Agent, or Firm* — JCIPRNET

(57) ABSTRACT

An object of the present invention is to provide a resist pattern forming method that has excellent pattern forming properties and generates few residues and a semiconductor chip manufacturing method. The resist pattern forming method according to an embodiment of the present invention has a step A of forming a film on a substrate by using an actinic ray-sensitive or radiation-sensitive resin composition containing a photoacid generator and a resin whose polarity is increased by the action of an acid, a step B of exposing the film, step C of developing the exposed film by using an alkali developer, a step D of washing the developed film by using water, and a step E of washing the film washed in the step D by using a chemical liquid containing an alcohol-based solvent, in which the alkali developer contains a quaternary ammonium salt.

19 Claims, No Drawings

RESIST PATTERN FORMING METHOD AND SEMICONDUCTOR CHIP MANUFACTURING METHOD

CROSS-REFERENCE TO RELATED APPLICATIONS

This application is a Continuation of PCT International Application No. PCT/JP2020/005951 filed on Feb. 17, 2020, which claims priority under 35 U.S.C. § 119(a) to Japanese Patent Application No. 2019-038595 filed on Mar. 4, 2019. Each of the above applications is hereby expressly incorporated by reference, in its entirety, into the present application.

BACKGROUND OF THE INVENTION

1. Field of the Invention

The present invention relates to a resist pattern forming method and a semiconductor chip manufacturing method.

2. Description of the Related Art

In a case where semiconductor devices are manufactured by a wiring forming process including photolithography, as a treatment liquid such as a developer or a rinsing solution, a chemical liquid containing water and/or an organic solvent is used.

Regarding the chemical liquid of the related art used in forming a resist pattern, JP2015-084122A discloses "method for manufacturing an organic treatment liquid for patterning a chemically amplified resist film, the organic treatment liquid capable of suppressing the occurrence of particles in pattern forming technology (paragraph "0010")". JP2015-084122A discloses an aspect in which the organic treatment liquid is used as a developer or a rinsing solution.

SUMMARY OF THE INVENTION

In recent years, as photolithography techniques have become advanced, miniaturization has also advanced.

Particularly, the techniques are required to cause little variation in line width in forming a line pattern with and to cause little variation in dimensions (hole size) in forming a hole pattern. Hereinafter, being excellent on these performances will be also simply described as "having excellent pattern forming properties"

Furthermore, the techniques are required to generate few residues in forming a resist pattern.

The inventors of the present invention have found that there is room for improvement in the above characteristics of the resist pattern forming methods of the related art.

An object of the present invention is to provide a resist pattern forming method that has excellent pattern forming properties and generates few residues.

Another object of the present invention is to provide a semiconductor chip manufacturing method.

In order to achieve the above objects, the inventors of the present invention conducted intensive studies. As a result, the inventors have found that the objects can be achieved by the following constitutions.

(1) A resist pattern forming method, including a step A of forming a film on a substrate by using an actinic ray-sensitive or radiation-sensitive resin composition containing a photoacid generator and a resin whose polarity is increased by the action of an acid, a step B of exposing the film, a step C of developing the exposed film by using an alkali developer, a step D of washing the developed film by using water, and a step E of washing the film washed in the step D by using a chemical liquid containing an alcohol-based solvent, in which the alkali developer contains a quaternary ammonium salt.

(2) The resist pattern forming method described in (1), in which a content of the quaternary ammonium salt is 0.75% to 7.5% by mass with respect to a total mass of the alkali developer.

(3) The resist pattern forming method described in (1) or (2), further including a step F of drying a resist pattern obtained in the step E after the step E.

(4) The resist pattern forming method described in any one of (1) to (3), further including a step G of heating the film between the step A and the step B.

(5) The resist pattern forming method described in any one of (1) to (4), in which the alkali developer contains at least one kind of component selected from the group consisting of a surfactant and a chelating agent.

(6) The resist pattern forming method described in any one of (1) to (5), in which a C log P value of the alcohol-based solvent is more than −1.00 and 3.00 or less.

(7) The resist pattern forming method described in any one of (1) to (6), in which the alcohol-based solvent has 3 to 12 carbon atoms.

(8) The resist pattern forming method described in any one of (1) to (7), in which a ratio of the number of carbon atoms contained in the alcohol-based solvent to the number oxygen atoms contained in the alcohol-based solvent is 3.0 or more.

(9) The resist pattern forming method described in any one of (1) to (8), in which the alcohol-based solvent has a vapor pressure of 0.01 to 10.0 kPa at 25° C.

(10) The resist pattern forming method described in any one of (1) to (9), in which the alcohol-based solvent is selected from the group consisting of methyl isobutyl carbinol, 2,6-dimethyl-4-heptanol, 2,4-diethyl-1,5-pentanediol, 2-ethyl-1-hexanol, 3-methyl-1,5-pentanediol, 2-octanol, 3-methyl-1-butanol, 2,4-dimethyl-3-pentanol, 2-methylpentane-2,4-diol, 3,5,5-trimethyl-1-hexanol, 2-methylcyclohexanol, 1,3-butanediol, 2-ethyl-1,3-hexanediol, 2-butyl-2-ethyl-1,3-propanediol, 3-methyl-1,3-butanediol, and trimethylolpropane.

(11) The resist pattern forming method described in any one of (1) to (10), in which the alcohol-based solvent is methyl isobutyl carbinol, 3-methyl-1-butanol, or 2,4-dimethyl-3-pentanol.

(12) The resist pattern forming method described in any one of (1) to (11), in which a content of the alcohol-based solvent is 85.000% to 99.999% by mass with respect to a total mass of the chemical liquid.

(13) The resist pattern forming method described in any one of (1) to (12), in which the chemical liquid further contains a metal component, and a content of the metal component is 0.10 to 100 ppt by mass with respect to a total mass of the chemical liquid.

(14) A semiconductor chip manufacturing method, including the resist pattern forming method described in any one of (1) to (13).

According to an embodiment of the present invention, it is possible to provide a resist pattern forming method that has excellent pattern forming properties and generates few residues.

Furthermore, according to an embodiment of the present invention, it is possible to provide a semiconductor chip manufacturing method.

DESCRIPTION OF THE PREFERRED EMBODIMENTS

Hereinafter, the present invention will be specifically described.

The following constituents will be described based on typical embodiments of the present invention in some cases, but the present invention is not limited to the embodiments.

In the present specification, the range of numerical values described using "to" means a range including the numerical values listed before and after "to" as the lower limit and the upper limit.

Furthermore, in the present invention, "ppm" means "parts-per-million ($10^{-6}$)", "ppb" means "parts-per-billion ($10^{-9}$)", and "ppt" means "parts-per-trillion ($10^{-2}$)".

In the present invention, regarding the description of a group (atomic group), in a case where whether the group is substituted or unsubstituted is not described, as long as the effects of the present invention are not impaired, the group includes a group which does not contain a substituent and a group which contains a substituent. For example, "hydrocarbon group" includes not only a hydrocarbon group which does not contain a substituent (unsubstituted hydrocarbon group) but also a hydrocarbon group which contains a substituent (substituted hydrocarbon group). The same is true of each compound.

In the present invention, "radiation" means, for example, far ultraviolet, extreme ultraviolet (EUV), X-rays, electron beams, and the like. In addition, in the present invention, light means actinic rays or radiation. In the present invention, unless otherwise specified, "exposure" includes not only exposure by far ultraviolet, X-rays, EUV, and the like, but also lithography by particle beams such as electron beams or ion beams.

The inventors of the present invention examined the problems of techniques of the related art. As a result, the inventors have found that a predetermined effect can be obtained by performing a development step using an alcohol developer, a washing step using water, and a washing step using an alcohol-based solvent in this order.

<Resist Pattern Forming Method>

The resist pattern forming method according to an embodiment of the present invention has the following steps A to E.

Step A: a step of forming a film on a substrate by using an actinic ray-sensitive or radiation-sensitive resin composition containing a photoacid generator and a resin whose polarity is increases by action of an acid Step B: a step of exposing the film Step C: a step of developing the exposed film by using an alkali developer Step D: a step of washing the developed film by using water Step E: a step of washing the film washed in the step D by using a chemical liquid containing an alcohol-based solvent As will be described later, a heating step (PB; Prebake) (Step G) may be performed between Step A and Step B, and a heating step (PEB; Post Exposure Bake) may be performed between Step B and Step C.

In addition, after Step E, Step F of drying the resist pattern obtained in Step E may be performed.

It is preferable that the resist pattern forming method be used for manufacturing semiconductor chips.

Hereinafter, these steps will be described.

(Step A)

Step A is a step of forming a film on a substrate by using an actinic ray-sensitive or radiation-sensitive resin composition containing a photoacid generator and a resin whose polarity is increases by action of an acid The actinic ray-sensitive or radiation-sensitive resin composition will be specifically described later.

As the method of forming a film on a substrate by using the actinic ray-sensitive or radiation-sensitive resin composition, known methods can be adopted without particular limitations. Among these, for example, a method of forming a film by coating the substrate with the actinic ray-sensitive or radiation-sensitive resin composition is preferable because this method makes it easier to adjust the film thickness.

As the coating method, known methods can be adopted without particular limitation. Among these, spin coating is preferably used in the field of semiconductor manufacturing.

Furthermore, after the substrate is coated with the actinic ray-sensitive or radiation-sensitive resin composition, if necessary, a drying treatment for removing solvents may be performed. The method of the drying treatment is not particularly limited, and examples thereof include a heating treatment, an air drying treatment, and the like.

The substrate on which a film is to be formed is not particularly limited, and it is possible to use inorganic substrates such as silicon, SiN, and $SiO_2$, inorganic coating substrates such as Spin On Glass (SOG), and substrates such as Integrated Circuit (IC) generally used in a semiconductor manufacturing process, a manufacturing process of circuit boards of liquid crystals and thermal heads, and other lithography processes of photofabrication.

Furthermore, if necessary, an organic antireflection film may be disposed between the film and the substrate.

At a temperature of 23±3° C. and a humidity of 45±5%, a receding contact angle of the film (resist film) formed using the actinic ray-sensitive or radiation-sensitive resin composition is preferably 70° or more, more preferably 75° or more, and even more preferably 75° to 85°. In a case where the receding contact angle of the resist film is in the above range, the film is suited for being exposed through an immersion medium.

In order to realize the preferred receding contact angle, it is preferable to incorporate a hydrophobic resin into the actinic ray-sensitive or radiation-sensitive resin composition. Alternatively, a coating layer (so-called "topcoat") made of a hydrophobic resin composition may be formed on the resist film so that the receding contact angle is increased. As the topcoat, those known in the related art can be appropriately used.

Furthermore, as the topcoat, it is preferable to use the topcoat described in JP2013-061647A, particularly, in OC-5 to OC-11 of Table 3 of Examples in the document, which contains not only a resin but also a basic compound (quencher).

The thickness of the resist film is not particularly limited, but is preferably 1 to 500 nm and more preferably 1 to 100 nm, because a fine pattern with higher accuracy can be formed on such a film.

(Step G (Heating Step (PB; Prebake)))

The resist pattern forming method may include Step G of heating the film between Step A and Step B which will be described later.

The heating temperature is preferably 70° C. to 130° C., and more preferably 80° C. to 120° C. The heating time is preferably 30 to 300 seconds, and more preferably 30 to 180 seconds.

The heating can be performed using a unit comprising a general exposure machine and/or a development machine, or may be performed using a hot plate or the like. Baking accelerates the reaction of the exposed portion and improves sensitivity and/or pattern profile.

(Step B)

Step B is a step of exposing the film formed by Step A. More specifically, Step B is a step of selectively exposing the film so that a desired pattern is formed. By Step B, the film is exposed in a patterned manner, and the solubility of the resist film changes only in the exposed portion.

"Exposing" means irradiation with actinic rays or radiation.

The wavelength of the light source used for exposure is not particularly limited, and examples thereof include infrared light, visible light, ultraviolet light, far ultraviolet light, extreme ultraviolet light, X-rays, electron beams, and the like. Examples of the light source include far ultraviolet light preferably having a wavelength of 250 nm or less, more preferably having a wavelength of 220 nm or less, and even more preferably having a wavelength of 1 to 200 nm, which is specifically a KrF excimer laser (248 nm), an ArF excimer laser (193 nm), or a $F_2$ excimer laser (157 nm), X-rays, EUV (13 nm), electron beams, and the like. Among these, a KrF excimer laser, an ArF excimer laser, EUV, or electron beams are preferable, and an ArF excimer laser is more preferable.

As the method of selectively exposing the film, known methods can be used without particular limitations. For example, it is possible to use a binary-mask with a light shielding unit having a transmittance of 0% or a halftone-type phase shift mask (HT-Phase Shift Mask) with a light shielding unit having a transmittance of 6%.

As the binary mask, generally, a mask is used which includes a quartz glass substrate overlaid with a chromium film and/or a chromium oxide film or the like formed as a light shielding unit.

As the halftone-type phase shift mask, generally, a mask is used which includes a quartz glass substrate overlaid with a molybdenum-silicide (MoSi) film, a chromium film, a chromium oxide film, and/or a silicon oxynitride film or the like formed as a light shielding unit.

In the present invention, there are no limitations on the exposure through a photo mask, and selective exposure (pattern exposure) may be performed by exposure without a photo mask, for example, by drawing with electron beams or the like.

In Step B, exposure may be performed multiple times.

(Suitable Aspect: Immersion Exposure)

As an aspect of exposure, for example, immersion exposure is suitable. By using immersion exposure, a finer pattern can be formed. The immersion exposure can be combined with super-resolution techniques such as a phase shift method and a modified illumination method.

As an immersion liquid used for immersion exposure, a liquid is preferable which is transparent to the exposure wavelength and has as low temperature coefficient of refractive index as possible so as to minimize the distortion of an optical image projected on the resist film. Particularly, in a case where the exposure light source is an ArF excimer laser (wavelength; 193 nm), it is preferable to use water because water corresponds to such a liquid and is easy to acquire and handle.

In a case where water is used as an immersion liquid, an additive (liquid) that reduces the surface tension of water and increases the surface activity may be added in a small proportion. It is preferable that this additive do not dissolve the resist film and exert a negligible influence on the optical coat under a lens element.

As such an additive, for example, an aliphatic alcohol having a refractive index substantially equal to that of water is preferable. Specifically, examples thereof include methyl alcohol, ethyl alcohol, and isopropyl alcohol. Adding an alcohol having a refractive index substantially equal to that of water to the immersion liquid brings an advantage of being able to minimize the overall change in refractive index of the liquid even though the concentration of alcohol components contained in water changes due to evaporation.

Distilled water is preferable as the water to be used. Furthermore, pure water filtered through an ion exchange filter or the like may also be used.

The water to be used as an immersion liquid preferably has an electric resistance of 18.3 MΩcm or more. Alternatively, TOC (concentration of organic matter) in the water is preferably 20 ppb by mass or less. Furthermore, the water is preferably degassed.

In addition, increasing the refractive index of the immersion liquid makes it possible to improve lithography performance. From this point of view, an additive being likely to increase the refractive index may be added to water, or heavy water ($D_2O$) may be used instead of water.

During the immersion exposure, the surface of the resist film may be washed with an aqueous chemical liquid before the exposure and/or after the exposure (before the heating treatment).

(Heating Step (PEB; Post Exposure Bake))

The resist pattern forming method preferably includes a post-exposure heating step (PEB; Post Exposure Bake) that follows Step B and precedes Step C.

The heating temperature is preferably 70° C. to 130° C., and more preferably 80° C. to 120° C. The heating time is preferably 30 to 300 seconds, more preferably 30 to 180 seconds, and even more preferably 30 to 90 seconds.

The heating can be performed by a unit comprising a general exposure-development machine, or may be performed using a hot plate or the like. Baking accelerates the reaction of the exposed portion and improves sensitivity or pattern profile.

(Step C)

Step C is a step of developing the exposed film by using an alkali developer. By performing this step, a desired pattern is formed. By this method, a portion having strong exposure intensity is removed.

The alkali developer contains a quaternary ammonium salt.

Examples of the quaternary ammonium salt include tetraalkylammonium hydroxide, trimethylphenylammonium hydroxide, trimethylbenzylammonium hydroxide, and triethylbenzylammonium hydroxide such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, and dibutyldipentylammonium hydroxide.

The content of the quaternary ammonium salt in the alkali developer is not particularly limited, but is preferably 0.1% to 20% by mass. In view of obtaining at least one of the effect of further improving pattern forming properties or the effect of further reducing residues (hereinafter, also simply described as "in view of further improving the effect of the present invention"), the content of the quaternary ammonium salt is more preferably 0.75% to 15% by mass, and even more preferably 0.75 to 7.5% by mass.

The pH of the alkali developer is preferably 10.0 to 15.0.

The alkali developer may contain a chelating agent.

The chelating agent is a compound having a function of forming a chelate with a metal ion. Particularly, a compound is preferable which has two or more functional groups (coordinating groups) forming a coordinate bond with a metal ion in one molecule.

Examples of the coordinating groups include carboxyl groups and the like.

Examples of the coordinating groups contained in the chelating agent include an acid group and a cationic group. Examples of the acid group include a carboxyl group, a phosphonic acid group, a sulfo group, and a phenolic hydroxyl group.

Examples of the chelating agent include an organic chelating agent and an inorganic chelating agent.

The organic chelating agent is a chelating agent consisting of an organic compound, and examples thereof include a carboxylic acid-based chelating agent having a carboxyl group as a coordinating group and a phosphonic acid-based chelating agent having a phosphonic acid group as a coordinating group. Among these, a carboxylic acid-based chelating agent is preferable.

Examples of the inorganic chelating agent include condensed phosphate.

The carboxylic acid-based chelating agent is a chelating agent having a carboxyl group as a coordinating group in the molecule. Examples thereof include an aminopolycarboxylic acid-based chelating agent (for example, butylenediaminetetraacetic acid, diethylenetriaminepentaacetic acid, or the like), an amino acid-based chelating agent (for example, glycine or the like), a hydroxycarboxylic acid-based chelating agent (for example, malic acid, citric acid, or the like), and aliphatic carboxylic acid-based chelating agent (for example, oxalic acid, malonic acid, or the like).

The content of the chelating agent with respect to the total mass of the alkali developer is preferably 10 to 10,000 ppm by, and more preferably 100 to 1,000 ppm by mass.

The alkali developer may contain a surfactant.

The surfactant to be incorporated into the alkali developer is not particularly limited, and examples thereof include a cationic surfactant, an anionic surfactant, and a nonionic surfactant. The surfactant is preferably an anionic surfactant or a nonionic surfactant.

The content of the surfactant with respect to the total mass of the alkali developer is preferably 0.001% to 5% by mass, more preferably 0.005% to 2% by mass, and even more preferably 0.01% to 0.5% by mass.

Examples of the development method include a method of immersing the substrate in a tank filled with a developer for a certain period of time (dipping method), a method of heaping up a developer on a surface of the substrate by surface tension and left the developer to stand for development (puddle method), a method of spraying a developer on a surface of the substrate (spray method), and a method of continuously jetting a developer onto a substrate rotating at a constant speed from a developer jetting nozzle while scanning the substrate with the developer jetting nozzle (dynamic dispensing method).

In a case where the aforementioned various development methods include a step of jetting the developer to a resist film from a developing nozzle of a development machine, a jetting pressure of the jetted developer (flow rate of the jetted developer per unit area) is preferably 2 mL/sec/mm$^2$ or less, more preferably 1.5 mL/sec/mm$^2$ or less, and even more preferably 1 mL/sec/mm$^2$ or less. The lower limit of the flow rate is not particularly limited. However, from the viewpoint of throughput, the lower limit is preferably 0.2 mL/sec/mm$^2$ or more.

Setting the jetting pressure of the jetted developer within the above range makes it possible to significantly reduce pattern defects resulting from the resist residues after development.

The details of the mechanism unclear. However, presumably, setting the jetting pressure within the above range may reduce the pressure that the developer applies to the resist film, and the resist film-resist pattern may be accordingly inhibited from being accidentally peeled off or collapsing, which may lead to the reduction of pattern defects.

The jetting pressure of the developer (mL/sec/mm$^2$) is a value at the outlet of the developing nozzle in the development machine.

Examples of the method of adjusting the jetting pressure of the developer include a method of adjusting the jetting pressure by using a pump or the like and a method of adjusting the pressure by supplying the developer from a pressure tank.

(Step D)

Step D is a step of washing the developed film by using water.

The type of water to be used is not particularly limited, and ultrapure water generally used in a semiconductor process is preferable.

The method of washing treatment is not particularly limited, and examples thereof include a method of continuously jetting water onto the substrate rotating at a constant speed (spin coating method), a method of immersing the substrate in a tank filled with water for a certain period of time (dipping method), and a method of spraying water on the surface of the substrate (spray method).

It is preferable to use a method of performing the washing treatment by the spin coating method among the above and to rotate the washed substrate at a rotation speed of 2,000 to 4,000 rpm so that water is removed from the substrate.

(Step E)

Step E is a step of washing the film washed in the step D by using a chemical liquid containing an alcohol-based solvent.

The chemical liquid used will be specifically described later.

The method of washing treatment is not particularly limited, and examples thereof include a method of continuously jetting the chemical liquid onto the substrate rotating at a constant speed (spin coating method), a method of immersing the substrate in a tank filled with the chemical liquid for a certain period of time (dipping method), and a method of spraying the chemical liquid on the surface of the substrate (spray method).

(Step F)

After Step D, a step F of drying the resist pattern may be performed.

Examples of the method of the drying treatment include a post-heating treatment (Post Bake).

By performing Step D, the developer, the rinsing solution, and the like remaining between and on the inside of the patterns are removed.

In a case where the heating treatment is performed as the drying treatment, the heating temperature during the heating treatment is preferably 40° C. to 250° C., and more preferably 150° C. to 220° C. The heating time is preferably 10 seconds to 10 minutes, and more preferably 100 to 360 seconds.

(Alcohol-Based Solvent)

The chemical liquid contains an alcohol-based solvent.

The C log P value of the alcohol-based solvent is not particularly limited. In view of further improving the effect of the present invention, the C log P value is preferably more than −1.00 and 3.00 or less, more preferably −0.50 to 3.00, even more preferably −0.50 to −2.50, and particularly preferably 0.00 to 2.00.

The C log P value is a value obtained by calculating the common logarithm log P of the 1-octanol/water partition coefficient P. For calculating the C log P value, known methods and software can be used. In the present invention, unless otherwise specified, the C log P program incorporated into ChemBioDraw Ultra 12.0 from CambridgeSoft is used.

The alcohol-based solvent contains hydroxyl groups, and the number of hydroxyl groups contained is not particularly limited. In view of further improving the effect of the present invention, the number of hydroxyl groups is preferably 1 to 3, and more preferably 1.

The alcohol-based solvent may be linear or branched or may have a ring structure.

The number of carbon atoms contained in the alcohol-based solvent is not particularly limited. In view of further improving the effect of the present invention, the number of carbon atoms is preferably 3 to 12, more preferably 4 to 10, and even more preferably 5 to 9.

The ratio of the number of carbon atoms contained in the alcohol-based solvent to the number of oxygen atoms contained in the alcohol-based solvent (C/O ratio) is not particularly limited, and is often 2.0 or more. In view of further improving the effect of the present invention, the C/O ratio is preferably 3.0 or more, more preferably 4.0 or more, and even more preferably 5.0 or more. The upper limit thereof is not particularly limited. In view of further improving the effect of the present invention, the upper limit of the C/O ratio is preferably 10.0 or less, more preferably 9.0 or less, and even more preferably 8.0 or less.

The vapor pressure of the alcohol-based solvent at 25° C. is not particularly limited, and is often 0.01 to 15 kPa. In view of further improving the effect of the present invention, the vapor pressure is more preferably 0.01 to 10.0 kPa, even more preferably 0.10 to 1.0 kPa, and particularly preferably 0.30 to 0.60 kPa.

The type of alcohol-based solvent is not particularly limited. In view of further improving the effect of the present invention, the alcohol-based solvent is preferably methyl isobutyl carbinol, 2,6-dimethyl-4-heptanol, 2,4-diethyl-1,5-pentanediol, 2-ethyl-1-hexanol, 3-methyl-1,5-pentanediol, 2-octanol, 3-methyl-1-butanol, 2,4-dimethyl-3-pentanol, 2-methylpentane-2,4-diol, 3,5,5-trimethyl-1-hexanol, 2-methylcyclohexanol, 1,3-butanediol, 2-ethyl-1,3-hexanediol, 2-butyl-2-ethyl-1,3-propanediol, 3-methyl-1,3-butanediol, or trimethylolpropane, and more preferably methyl isobutyl carbinol, 3-methyl-1-butanol, or 2,4-dimethyl-3-pentanol.

The content of the alcohol-based solvent in the chemical liquid is not particularly limited. In view of further improving the effect of the present invention, the content of the alcohol-based solvent with respect to the total mass of the chemical liquid is preferably 85.000% to 99.999% by mass, more preferably 95.000% to 99.999% by mass, even more preferably 99.500% to 99.995% by mass, particularly preferably 99.700% to 99.990% by mass, and most preferably 99.900% to 99.990% by mass.

The chemical liquid may contain other components in addition to the alcohol-based solvent.

Hereinafter, those other components will be specifically described.

<Metal Component>

The chemical liquid may contain a metal component.

In the present invention, examples of the metal component include metal particles and metal ions. For example, the content of the metal component means the total content of metal particles and metal ions.

The chemical liquid may contain either metal particles or metal ions, or may contain both of them.

Examples of metal elements in the metal component include Na (sodium), K (potassium), Ca (calcium), Fe (iron), Cu (copper), Mg (magnesium), Mn (manganese), Li (lithium), Al (aluminum), Cr (chromium), Ni (nickel), Ti (titanium), and Zr (zirconium). The metal component may contain only one kind of metal element or two or more kinds of metal elements.

The metal particles may be simple metal particles or metal alloy particles.

The metal component may be a metal component which is inevitably incorporated into each component (raw material) of the chemical liquid or a metal component inevitably incorporated into the chemical liquid during the manufacturing, storage, and/or transfer of the chemical liquid. Alternatively, the metal component may be intentionally added.

In a case where the chemical liquid contains a metal component, the content of the metal component is not particularly limited and may be, for example, 0.01 to 500 ppt by mass with respect to the total mass of the chemical liquid. Particularly, in view of further improving the effect of the present invention, the content of the metal component is preferably 0.10 to 100 ppt by mass.

The type and content of metal ions and metal particles in the chemical liquid can be measured by single particle inductively coupled plasma mass spectrometry (SP-ICP-MS).

The device used in SP-ICP-MS is the same as the device used in general inductively coupled plasma mass spectrometry (ICP-MS). The only difference between SP-ICP-MS and ICP-MS is how to analyze data. With SP-ICP-MS, data can be analyzed using commercial software.

With ICP-MS, the content of a metal component as a measurement target is measured regardless of the way the metal component is present. Accordingly, the total mass of metal particles and metal ions as a measurement target is quantified as the content of the metal component.

With SP-ICP-MS, the content of metal particles can be measured. Accordingly, by subtracting the content of the metal particles from the content of the metal component in a sample, the content of metal ions in the sample can be calculated.

Examples of the device for SP-ICP-MS include Agilent 8800 triple quadrupole inductively coupled plasma mass spectrometry (ICP-MS, for semiconductor analysis, option #200) manufactured by Agilent Technologies, Inc. By using this device, the content of the metal-containing particles can be measured by the method described in Examples. In addition to the device described above, it is possible to use NexION350S manufactured by PerkinElmer Inc. and Agilent 8900 manufactured by Agilent Technologies, Inc.

<Hydrocarbon>

The chemical liquid may contain a hydrocarbon selected from the group consisting of alkane having 8 or more carbon atoms and alkene having 8 or more carbon atoms.

The number of carbon atoms in the alkane is 8 or more, and often 8 to 30.

The number of carbon atoms in the alkene is 8 or more, and often 8 to 30.

In a case where the chemical liquid contains the aforementioned hydrocarbon, the content thereof is not particularly limited. In view of further improving the effect of the present invention, the content of the hydrocarbon is preferably 0.001 to 10 ppb by mass.

The chemical liquid may contain water in addition to the above.

<Chemical Liquid Manufacturing Method>

The method for manufacturing the aforementioned chemical liquid is not particularly limited, and examples thereof include known manufacturing methods.

For example, the chemical liquid may be manufactured by adding predetermined amounts of optional components to the alcohol-based solvent or manufactured by purchasing a commercially available product and performing a purification treatment on the product. One of the examples of the chemical liquid manufacturing methods is a method including at least a step of distilling a substance to be purified (distillation step) or a step of filtering a substance to be purified (filtration step). Examples of the substance to be purified include commercially available products of alcohol-based solvents. Commercially available products contain impurities in some cases.

Hereinafter, the procedures of the distillation step and the filtration step will be specifically described.

(Distillation Step)

The distillation step is a step of distilling the substance to be purified so as to obtain a substance to be purified having undergone distillation.

The method of distilling the substance to be purified is not particularly limited, and known methods can be used. Typically, examples thereof include a method of disposing a distillation column on a primary side of the purification device used in the filtration step, which will be described later, and introducing the distilled substance to be purified into a manufacturing tank.

At this time, the liquid contact portion of the distillation column is not particularly limited, but is preferably formed of the anticorrosive material which will be described later.

In the distillation step, the substance to be purified may be passed through the same distillation column multiple times, or the substance to be purified may be passed through different distillation columns. In a case where the substance to be purified is passed through different distillation columns, for example, a method may be used in which a rough distillation treatment is performed to remove low-boiling-point components and the like by passing the substance to be purified through a distillation column and then a fractionation treatment is performed to remove other components by passing the substance to be purified through a distillation column different from the distillation column used in the rough distillation treatment.

Examples of the distillation column include a plate distillation column and a pressure-reducing plate distillation column.

Furthermore, in order to satisfy both the thermal stability and purification accuracy during distillation, distillation under reduced pressure may also be performed.

(Filtration Step)

The filtration step is a step of filtering the aforementioned substance to be purified by using a filter.

The method of filtering the substance to be purified by using a filter is not particularly limited. However, it is preferable to use a method of passing the substance to be purified through a filter unit (letting the substance to be purified run through a filter unit) including a housing and a filter cartridge stored in the housing under pressure or under no pressure.

The pore size of the filter is not particularly limited, and a filter having a pore size that is generally used for filtering the substance to be purified can be used. Especially, the pore size of the filter is preferably 200 nm or less, more preferably 20 nm or less, and even more preferably 10 nm or less. The lower limit thereof is not particularly limited. From the viewpoint of productivity, the lower limit is preferably 1 nm or more in general.

In the present specification, the pore size of a filter means a pore size determined by the bubble point of isopropanol.

The way the two or more kinds of filters having different pore sizes are used in order is not particularly limited. For example, a method may be used in which a plurality of filter units including filters is arranged along a pipe line through which the substance to be purified is transferred. At this time, in a case where an attempt is made to set the flow rate of the substance to be purified per unit time to be constant throughout the entire pipe line, sometimes the pressure applied to a filter having a smaller pore size is higher than the pressure applied to a filter having a larger pore size. In this case, it is preferable to dispose a pressure control valve, a damper, or the like between the filters such that constant pressure is applied to the filter having a smaller pore size, or to arrange filter units housing the same filters in a row along the pipe line such that the filtration area is enlarged.

The material of the filter is not particularly limited, and examples thereof include materials known as filter materials. Specifically, examples of the material of the filter include a resin like polyamide such as nylon (for example, 6-nylon and 6,6-nylon); polyolefin such as polyethylene and polypropylene; polystyrene; polyimide; polyamide imide; poly(meth)acrylate; a fluororesin such as polytetrafluoroethylene, perfluoroalkoxyalkane, a perfluoroethylene propene copolymer, an ethylene-tetrafluoroethylene copolymer, an ethylene-chlorotrifluoroethylene copolymer, polychlorotrifluoroethylene, polyvinylidene fluoride, and polyvinyl fluoride; polyvinyl alcohol; polyester; cellulose; cellulose acetate, and the like.

Among these, at least one kind of resin selected from the group consisting of nylon (particularly preferably 6,6-nylon), polyolefin (particularly preferably polyethylene), poly(meth)acrylate, and a fluororesin (particularly preferably polytetrafluoroethylene (PTFE) or perfluoroalkoxyalkane (PFA)) is preferable, because this resin has higher solvent resistance and makes it possible to obtain a chemical liquid having further improved defect inhibition performance. One kind of each of these polymers can be used alone, or two or more kinds of these polymers can be used in combination.

In addition to the resin, diatomite, glass, and the like may be used.

Furthermore, a polymer (such as nylon-grafted UPE) obtained by bonding polyamide (for example, nylon such as nylon-6 or nylon-6,6) to polyolefin (such as UPE (ultra-high-molecular-weight polyethylene) which will be described later) by graft copolymerization may be used as the material of the filter.

Furthermore, the filter may be a filter having undergone a surface treatment. The surface treatment method is not particularly limited, and known methods can be used. Examples of the surface treatment method include a chemical modification treatment, a plasma treatment, a hydrophobization treatment, coating, a gas treatment, sintering, and the like.

As the chemical modification treatment, a method of introducing ion exchange groups into the filter is preferable.

That is, as the filter, a filter having ion exchange groups may be used.

Examples of the ion exchange groups include cation exchange groups and anion exchange groups. Examples of the cation exchange groups include a sulfonic acid group, a carboxyl group, and a phosphoric acid group. Examples of the anion exchange groups include a quaternary ammonium group. The method of introducing ion exchange groups into the filter is not particularly limited, and examples thereof include a method of reacting a compound containing ion exchange groups and polymerizable groups with the filter (typically, a method of grafting the compound on the filter).

The method of introducing the ion exchange groups is not particularly limited. For example, the filter is irradiated with ionizing radiation (such as α-rays, β-rays, γ-rays, X-rays, or electron beams) so that active portions (radicals) are generated. After being irradiated, the filter is immersed in a monomer-containing solution so that the monomer is graft-polymerized with the filter. As a result, the polymer obtained by the polymerization of the monomer is grafted on the filter. By bringing the generated polymer into contact with a compound containing anion exchange groups or cation exchange groups so that a reaction occurs, ion exchange groups can be introduced into the polymer.

In a case where the filter containing ion exchange groups is used, the content of metal particles and metal ions in the chemical liquid is more easily controlled within a desired range. The material constituting the filter having ion exchange groups is not particularly limited, and examples thereof include materials obtained by introducing ion exchange groups into a fluororesin and a polyolefin. Among these, the material obtained by introducing ion exchange groups into a fluororesin is more preferable.

The pore size of the filter containing ion exchange groups is not particularly limited, but is preferably 1 to 30 nm and more preferably 5 to 20 nm.

As the filter used in the filtration step, two or more kinds of filters made of different materials may be used. For example, two or more kinds of filters may be used which are selected from the group consisting of filters made of a polyolefin, a fluororesin, a polyamide, and a material obtained by introducing ion exchange groups into these materials.

The pore structure of the filter is not particularly limited, and may be appropriately selected depending on the components in the substance to be purified. In the present specification, the pore structure of the filter means a pore size distribution, a positional distribution of pores in the filter, a pore shape, and the like. Typically, the pore structure can be controlled by the filter manufacturing method.

For example, in a case where powder of a resin or the like is sintered to form a filter, a porous membrane is obtained. Furthermore, in a case where a method such as electrospinning, electroblowing, or melt blowing is used to form a filter, a fiber membrane is obtained. These have different pore structures.

"Porous membrane" means a membrane which retains components in a substance to be purified, such as gel, particles, colloids, cells, and oligomers, but allows the components substantially smaller than the pores of the membrane to pass through the pores. The retention of components in the substance to be purified by the porous membrane depends on operating conditions, for example, the surface velocity, the use of a surfactant, the pH, and a combination of these in some cases. Furthermore, the retention of components can depend on the pore size and structure of the porous membrane, and the size and structure of particles supposed to be removed (such as whether the particles are hard particles or gel).

The pore structure of the porous membrane (for example, a porous membrane containing UPE, PTFE, and the like) is not particularly limited. The pores have, for example, a lace shape, a string shape, a node shape, and the like.

The size distribution of pores in the porous membrane and the positional distribution of pore size in the membrane are not particularly limited. The size distribution may be narrower, and the positional distribution of pore size in the membrane may be symmetric. Furthermore, the size distribution may be wider, and the positional distribution of pore size in the membrane may be asymmetric (this membrane is also called "asymmetric porous membrane"). In the asymmetric porous membrane, the size of the holes changes in the membrane. Typically, the pore size increases toward the other surface of the membrane from one surface of the membrane. In this case, the surface with many pores having a large pore size is called "open side", and the surface with many pores having a small pore size is also called "tight side".

Examples of the asymmetric porous membrane include a membrane in which the pore size is minimized at a position in the thickness direction of the membrane (this is also called "hourglass shape").

It is preferable that the filters be used after being thoroughly washed before use.

In a case where an unwashed filter (or a filter that has not been thoroughly washed) is used, the impurities contained in the filter are easily mixed into the chemical liquid.

As described above, the filtration step may be a multi-stage filtration step in which the substance to be purified is passed through two or more kinds of different filters. The different filters mean filters different from each other in terms of at least one of the pore size, pore structure, or material.

Furthermore, the substance to be purified may be passed through the same filter multiple times or passed through a plurality of filters of the same type.

In addition, in view of ease of manufacturing the chemical liquid according to an embodiment of the present invention, it is preferable to use a fluororesin-containing filter. The fluororesin-containing filter is particularly preferably for multi-stage filtration using a plurality of filters. As the fluororesin-containing filter, a filter having a pore size of 20 nm or less is preferable.

Especially, in view of ease of manufacturing the chemical liquid according to an embodiment of the present invention, it is preferable to perform a first filtration step of filtering a substance to be purified by using a filter having a pore size of 100 nm or greater and a second filtration step of filtering the substance to be purified by using a fluororesin-containing filter (preferably a filter made of PTFE) having a pore size of 10 nm or less in this order. In the first filtration step, coarse particles are removed.

The material of a liquid contact portion of the purification device used in the filtration step is not particularly limited (the liquid contact portion means an inner wall surface or the like that is likely to come into contact with the substance to be purified and the chemical liquid). However, it is preferable that the liquid contact portion be formed of at least one kind of material selected from the group consisting of a nonmetallic material (such as a fluororesin) and an electropolished metallic material (such as stainless steel) (hereinafter, these materials will be collectively called "anticorrosive material").

The aforementioned nonmetallic material is not particularly limited, and examples thereof include known materials.

Examples of the nonmetallic material include at least one kind of material selected from the group consisting of a polyethylene resin, a polypropylene resin, a polyethylene-polypropylene resin, and a fluororesin (for example, polytetrafluoroethylene, a polytetrafluoroethylene-perfluoroalkyl vinyl ether copolymer, a polytetrafluoroethylene-hexafluoropropylene copolymer resin, a polytetrafluoroethylene-ethylene copolymer resin, a chlorotrifluoroethylene-ethylene copolymer resin, a vinylidene fluoride resin, a chlorotrifluoroethylene copolymer resin, a vinyl fluoride resin, and the like).

The aforementioned metallic material is not particularly limited, and examples thereof include known materials.

Examples of the metallic material include a metallic material in which the total content of chromium and nickel is greater than 25% by mass with respect to the total mass of the metallic material. The total content of chromium and nickel is more preferably 30% by mass or more. The upper limit of the total content of chromium and nickel in the metallic material is not particularly limited, but is preferably 90% by mass or less in general.

Examples of the metallic material include stainless steel and a nickel-chromium alloy.

The stainless steel is not particularly limited, and examples thereof include known stainless steel. Among these, an alloy with a nickel content of 8% by mass or more is preferable, and austenite-based stainless steel with a nickel content of 8% by mass or more is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

The nickel-chromium alloy is not particularly limited, and examples thereof include known nickel-chromium alloys. Among these, a nickel-chromium alloy is preferable in which the nickel content is 40% to 75% by mass and the chromium content is 1% to 30% by mass.

Examples of the nickel-chromium alloy include HASTELLOY (trade name, the same is true of the following description), MONEL (trade name, the same is true of the following description), and INCONEL (trade name, the same is true of the following description). More specifically, examples thereof include HASTELLOY C-276 (Ni content: 63% by mass, Cr content: 16% by mass), HASTELLOY C (Ni content: 60% by mass, Cr content: 17% by mass), and HASTELLOY C-22 (Ni content: 61% by mass, Cr content: 22% by mass).

Furthermore, if necessary, the nickel-chromium alloy may further contain boron, silicon, tungsten, molybdenum, copper, cobalt, and the like in addition to the aforementioned alloy.

The method of electropolishing the metallic material is not particularly limited, and known methods can be used. For example, it is possible to use the methods described in paragraphs "0011" to "0014" in JP2015-227501A, paragraphs "0036" to "0042" in JP2008-264929A, and the like.

Presumably, in a case where the metallic material is electropolished, the chromium content in a passive layer on the surface thereof may be higher than the chromium content in the parent phase. Therefore, presumably, in a case where a purification device having a liquid contact portion formed of the electropolished metallic material is used, metal particles may be hardly eluted into the substance to be purified.

The metallic material may have undergone buffing. As the buffing method, known methods can be used without particular limitation. The size of abrasive grains used for finishing the buffing is not particularly limited, but is preferably #400 or less because such grains make it easy to further reduce the surface asperity of the metallic material. The buffing is preferably performed before the electropolishing.

During the purification of the substance to be purified, it is preferable that all of the opening of a container, washing of a container and a device, storage of a solution, analysis, and the like that included in the purification be performed in a clean room. It is preferable that the clean room have a class 4 cleanliness or higher cleanliness specified in the international standard ISO14644-1:2015 established by International Organization for Standardization. Specifically, the clean room preferably meets any of ISO class 1, ISO class 2, ISO class 3, or ISO class 4, more preferably meets ISO class 1 or ISO class 2, and even more preferably meets ISO class 1.

<Chemical Liquid Storage Body>

The chemical liquid may be stored in a container and kept as it is until use. The container and the chemical liquid stored in the container are collectively called chemical liquid storage body. The preserved chemical liquid is used after being taken out of the chemical liquid storage body.

As the container storing the chemical liquid, a container for manufacturing semiconductor devices is preferable which has a high internal cleanliness and hardly causes elution of impurities.

The container that can be used is not particularly limited, and examples thereof include a "CLEAN BOTTLE" series manufactured by AICELLO CORPORATION, "PURE BOTTLE" manufactured by KODAMA PLASTICS Co., Ltd., and the like.

As the container, for the purpose of preventing mixing of impurities into the chemical liquid (contamination), it is also preferable to use a multilayer bottle in which the inner wall of the container has a 6-layer structure formed of 6 kinds of resins or a multilayer bottle having a 7-layer structure formed of 6 kinds of resins. Examples of these containers include the containers described in JP2015-123351A.

The liquid contact portion of the container may be the aforementioned anticorrosive material (preferably electropolished stainless steel or a fluororesin) or glass. In view of further improving the effect of the present invention, it is preferable that 90% or more of the area of the liquid contact portion be formed of the above material. It is more preferable that the entirety of the liquid contact portion be formed of the above material.

The void volume in the container of the chemical liquid storage body is preferably 2% to 35% by volume, and more preferably 5% to 30% by volume. That is, in the method for manufacturing the chemical liquid storage body, it is preferable to perform a storage step of storing the obtained chemical liquid in the container so that the void volume in the container is 2% to 35% by volume.

The void volume is calculated according to Equation (1).

$$\text{void volume} = \{1 - (\text{volume of chemical liquid in container}/\text{container volume})\} \times 100 \qquad \text{Equation (1):}$$

The container volume has the same definition as the internal volume (capacity) of the container.

In a case where the void volume is set within the above range, the contaminants such as impurities are inhibited, and storage stability can be ensured.

<Actinic Ray-Sensitive or Radiation-Sensitive Resin Composition>

The actinic ray-sensitive or radiation-sensitive resin composition (hereinafter, also simply called "composition") used in the above pattern forming method contains at least a resin (A) whose polarity is increased by the action of an acid and a photoacid generator (P).

Hereinafter, the components that can be contained in the actinic ray-sensitive or radiation-sensitive resin composition will be specifically described.

(Resin (A))

The actinic ray-sensitive or radiation-sensitive resin composition contains a resin (A) whose polarity is increased by the action of an acid.

(Repeating Unit (A-a) Having Acid-Decomposable Group)

The resin (A) has a repeating unit (A-a) having an acid-decomposable group (hereinafter, also simply called "repeating unit (A-a)").

The acid-decomposable group refers to a group which is decomposed by the action of an acid and generates a polar group. The acid-decomposable group preferably has a structure in which a polar group is protected by a leaving group that is dissociated by the action of an acid. That is, the resin (A) has a repeating unit (A-a) having a group that is decomposed by the action of an acid and generates a polar group. The polarity of the resin having the repeating unit (A-a) is increased by the action of the acid. The increase of polarity increases the solubility of the resin in the alkali developer and decreases the solubility of the resin in an organic solvent.

As the polar group, an alkali-soluble group is preferable. Examples thereof include acidic groups such as a carboxyl group, a phenolic hydroxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris (alkylcarbonyl)methylene group, and a tris(alkylsulfonyl)methylene group, an alcoholic hydroxyl group, and the like.

As the polar group, among these, a carboxyl group, a phenolic hydroxyl group, a fluorinated alcohol group (preferably a hexafluoroisopropanol group), or a sulfonic acid group is preferable.

Examples of the leaving group dissociated by the action of an acid include groups represented by Formulas (Y1) to (Y4).

| | |
|---|---|
| —C(Rx$_1$)(Rx$_2$)(Rx$_3$) | Formula (Y1): |
| —C(=O)OC(Rx$_1$)(Rx$_2$)(Rx$_3$) | Formula (Y2): |
| —C(R$_{36}$)(R$_{37}$)(OR$_{38}$) | Formula (Y3): |
| —C(Rn)(H)(Ar) | Formula (Y4): |

In Formula (Y1) and Formula (Y2), Rx$_1$ to Rx$_3$ each independently represent an alkyl group (linear or branched) or a cycloalkyl group (monocyclic or polycyclic). In a case where Rx$_1$ to Rx$_3$ all represent an alkyl group (linear or branched), at least two out of Rx$_1$ to Rx$_3$ preferably represent a methyl group.

Particularly, Rx$_1$ to Rx$_3$ preferably each independently represent a linear or branched alkyl group, and more preferably each independently represent a linear alkyl group.

Two out of Rx$_1$ to Rx$_3$ may be bonded to each other to form a monocyclic or polycyclic ring.

The alkyl group represented by Rx$_1$ to Rx$_3$ is preferably an alkyl group having 1 to 4 carbon atoms, such as a methyl group, an ethyl group, a n-propyl group, an isopropyl group, a n-butyl group, an isobutyl group, or a t-butyl group.

The cycloalkyl group represented by Rx$_1$ to Rx$_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group.

As the cycloalkyl group formed by the bonding of two out of Rx$_1$ to Rx$_3$, a monocyclic cycloalkyl group such as a cyclopentyl group or a cyclohexyl group and a polycyclic cycloalkyl group such as a norbornyl group, a tetracyclodecanyl group, a tetracyclododecanyl group, or an adamantyl group are preferable, and a monocyclic cycloalkyl group having 5 or 6 carbon atoms is more preferable.

In the cycloalkyl group formed by the bonding of two out of Rx$_1$ to Rx$_3$, for example, one methylene group constituting the ring may be substituted with a heteroatom such as an oxygen atom or a group having a heteroatom such as a carbonyl group.

As the group represented by Formula (Y1) or Formula (Y2), for example, an aspect is preferable in which Rx$_1$ is a methyl group or an ethyl group, and Rx$_2$ and Rx$_3$ are bonded to each other to form the aforementioned cycloalkyl group.

In Formula (Y3), R$_{36}$ to R$_{38}$ each independently represent a hydrogen atom or a monovalent organic group. R$_{37}$ and R$_{38}$ may be bonded to each other to form a ring. Examples of the monovalent organic group include an alkyl group, a cycloalkyl group, an aryl group, an aralkyl group, an alkenyl group, and the like. R$_{36}$ is preferably a hydrogen atom.

As Formula (Y3), a group represented by Formula (Y3-1) is preferable.

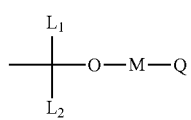

(Y3-1)

L$_1$ and L$_2$ each independently represent a hydrogen atom, an alkyl group, a cycloalkyl group, an aryl group, or a group consisting of a combination of these (for example, a group consisting of a combination of an alkyl group and an aryl group).

M represents a single bond or a divalent linking group.

Q represents an alkyl group which may have a heteroatom, a cycloalkyl group which may have a heteroatom, an aryl group which may have a heteroatom, an amino group, an ammonium group, a mercapto group, a cyano group, an aldehyde group, or a group consisting of a combination of these (for example, a group consisting of a combination of an alkyl group and a cycloalkyl group).

In the alkyl group and the cycloalkyl group, for example, one methylene group may be substituted with a heteroatom such as an oxygen atom or with a group having a heteroatom such as a carbonyl group.

It is preferable that one of L$_1$ and L$_2$ be a hydrogen atom and the other be an alkyl group, a cycloalkyl group, an aryl group, or a group consisting of a combination of an alkylene group and an aryl group.

At least two out of Q, M, and L$_1$ may be bonded to each other to form a ring (preferably a 5- or 6-membered ring).

In view of pattern miniaturization, $L_2$ is preferably a secondary or tertiary alkyl group, and more preferably a tertiary alkyl group. Examples of the secondary alkyl group include an isopropyl group, a cyclohexyl group, and a norbornyl group. Examples of the tertiary alkyl group include a tert-butyl group and an adamantane ring group. In these aspects, glass transition temperature (Tg) and activation energy are increased. Therefore, film hardness is ensured, and fogging can be suppressed.

In Formula (Y4), Ar represents an aromatic ring group. Rn represents an alkyl group, a cycloalkyl group, or an aryl group. Rn and Ar may be bonded to each other to form a non-aromatic ring. Ar is more preferably an aryl group.

As the repeating unit (A-a), a repeating unit represented by Formula (A) is also preferable.

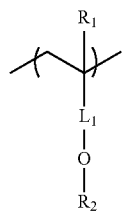

(A)

$L_1$ represents a divalent linking group which may have a fluorine atom or an iodine atom. $R_1$ represents a hydrogen atom, a fluorine atom, an iodine atom, an alkyl group which may have a fluorine atom or an iodine atom, or an aryl group which may have a fluorine atom or an iodine atom. $R_2$ represents leaving group which is dissociated by the action of an acid and may have a fluorine atom or an iodine atom. Here, at least one of $L_1$, $R_1$, or $R_2$ has a fluorine atom or an iodine atom.

$L_1$ represents a divalent linking group which may have a fluorine atom or an iodine atom. Examples of the divalent linking group which may have a fluorine atom or an iodine atom include —CO—, —O—, —S—, —SO—, —SO$_2$—, a hydrocarbon group which may have a fluorine atom or an iodine atom (for example, an alkylene group, a cycloalkylene group, an alkenylene group, an arylene group, or the like), a linking group consisting of a plurality of these groups linked to each other, and the like. As $L_1$, among these, —CO— or -arylene group -alkylene group having fluorine atom or iodine atom- is preferable.

As the arylene group, a phenylene group is preferable.

The alkylene group may be linear or branched. The number of carbon atoms in the alkylene group is not particularly limited, but is preferably 1 to 10 and more preferably 1 to 3.

The total number of fluorine atoms and iodine atoms contained in the alkylene group having a fluorine atom or an iodine atom is not particularly limited, but is preferably 2 or more, more preferably 2 to 10, and even more preferably 3 to 6.

$R_1$ represents a hydrogen atom, a fluorine atom, an iodine atom, an alkyl group which may have a fluorine atom or an iodine atom, or an aryl group which may have a fluorine atom or an iodine atom.

The alkyl group may be linear or branched. The number of carbon atoms in the alkyl group is not particularly limited, but is preferably 1 to 10 and more preferably 1 to 3.

The total number of fluorine atoms and iodine atoms contained in the alkyl group having a fluorine atom or an iodine atom is not particularly limited, but is preferably 1 or more, more preferably 1 to 5, and even more preferably 1 to 3.

The alkyl group may have a heteroatom such as an oxygen atom other than halogen atoms.

$R_2$ represents a leaving group which is dissociated by the action of an acid and may have a fluorine atom or an iodine atom.

Examples of the leaving group include groups represented by Formulas (Z1) to (Z4).

—C(Rx$_{11}$)(Rx$_{12}$)(Rx$_{13}$)  Formula (Z1):

—C(=O)OC(Rx$_{11}$)(Rx$_{12}$)(Rx$_{13}$)  Formula (Z2):

—C(R$_{136}$)(R$_{137}$)(OR$_{138}$)  Formula (Z3):

—C(Rn$_1$)(H)(Ar$_1$)  Formula (Z4):

In Formulas (Z1) and (Z2), Rx$_{11}$ to Rx$_{13}$ each independently represent an alkyl group (linear or branched) which may have a fluorine atom or an iodine atom or a cycloalkyl group (monocyclic or polycyclic) which may have a fluorine atom or an iodine atom. In a case where Rx$_{11}$ to Rx$_{13}$ all represent an alkyl group (linear or branched), at least two out of Rx$_{11}$ to Rx$_{13}$ preferably represent a methyl group.

Rx$_{11}$ to Rx$_{13}$ are the same as Rx$_1$ to Rx$_3$ in (Y1) and (Y2) described above, except that Rx$_{11}$ to Rx$_{13}$ may have a fluorine atom or an iodine atom. The definitions and preferred ranges of the alkyl group and cycloalkyl group represented by Rx$_{11}$ to Rx$_{13}$ are the same as those of the alkyl group and cycloalkyl group represented by Rx$_1$ to Rx$_3$.

In Formula (Z3), R$_{136}$ to R$_{138}$ each independently represent a hydrogen atom or a monovalent organic group which may have a fluorine atom or an iodine atom. R$_{137}$ and R$_{138}$ may be bonded to each other to form a ring. Examples of the monovalent organic group which may have a fluorine atom or an iodine atom include an alkyl group which may have a fluorine atom or an iodine atom, a cycloalkyl group which may have a fluorine atom or an iodine atom, an aryl group which may have a fluorine atom or an iodine atom, an aralkyl group which may have a fluorine atom or an iodine atom, and a group consisting of a combination of these (for example, a group consisting of a combination of an alkyl group and a cycloalkyl group).

The alkyl group, cycloalkyl group, aryl group, and aralkyl group described above may contain a heteroatom such as an oxygen atom in addition to a fluorine atom and an iodine atom. That is, in the alkyl group, cycloalkyl group, aryl group, and aralkyl group described above, for example, one methylene group may be substituted with a heteroatom such as an oxygen atom or a group having a heteroatom such as a carbonyl group.

As Formula (Z3), a group represented by Formula (Z3-1) is preferable.

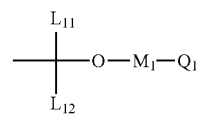

(Z3-1)

L$_{11}$ and L$_{12}$ each independently represent a hydrogen atom; an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; or a group consisting of a combination of these (for example, a group consisting of a combination of an alkyl group and a cycloalkyl group which may have a heteroatom selected from the group consisting of a fluorine atom, an iodine atom, and an oxygen atom).

$M_1$ represents a single bond or a divalent linking group.

$Q_1$ represents an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; an amino group; an ammonium group; a mercapto group; a cyano group; an aldehyde group; or a group consisting of a combination these (for example, a group consisting of a combination of an alkyl group and a cycloalkyl group which may have a heteroatom selected from the group consisting of a fluorine atom, an iodine atom, and an oxygen atom).

In Formula (Y4), $Ar_1$ represents an aromatic ring group which may have a fluorine atom or an iodine atom. $Rn_1$ represents an alkyl group which may have a fluorine atom or an iodine atom, a cycloalkyl group which may have a fluorine atom or an iodine atom, or an aryl group which may have a fluorine atom or an iodine atom. $Rn_1$ and $Ar_1$ may be bonded to each other to form a non-aromatic ring.

As the repeating unit (A-a), a repeating unit represented by General Formula (AI) is also preferable.

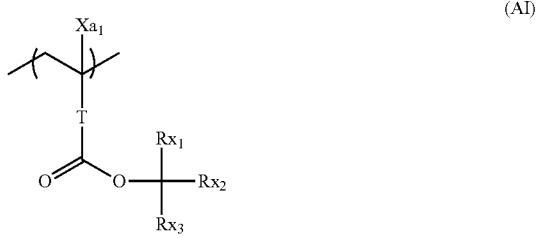

(AI)

In General Formula (AI), $Xa_1$ represents a hydrogen atom or an alkyl group which may have a substituent.

T represents a single bond or a divalent linking group.

$Rx_1$ to $Rx_3$ each independently represent an alkyl group (linear or branched) or a cycloalkyl group (monocyclic or polycyclic). In a case where $Rx_1$ to $Rx_3$ all represent an alkyl group (linear or branched), at least two out of $Rx_1$ to $Rx_3$ preferably represent a methyl group.

Two out of $Rx_1$ to $Rx_3$ may be bonded to each other to form a cycloalkyl group (monocyclic or polycyclic).

Examples of the alkyl group which is represented by $Xa_1$ and may have a substituent include a methyl group and a group represented by —$CH_2$—$R_{11}$. $R_{11}$ represents a halogen atom (such as a fluorine atom), a hydroxyl group, or a monovalent organic group. Examples of $R_{11}$ include an alkyl group having 5 or less carbon atoms which may be substituted with a halogen atom, an acyl group having 5 or less carbon atoms which may be substituted with a halogen atom, and an alkoxy group having 5 or less carbon atoms which may be substituted with a halogen atom. Among these, an alkyl group having 3 or less carbon atoms is preferable, and a methyl group is more preferable. $Xa_1$ is preferably a hydrogen atom, a methyl group, a trifluoromethyl group, or a hydroxymethyl group.

Examples of the divalent linking group represented by T include an alkylene group, an aromatic ring group, a —COO-Rt- group, a —O-Rt- group, and the like. In the formulae, Rt represents an alkylene group or a cycloalkylene group.

T is preferably a single bond or a —COO-Rt- group. In a case where T represents a —COO-Rt- group, Rt is preferably an alkylene group having 1 to 5 carbon atoms, and more preferably a —$CH_2$— group, a —$(CH_2)_2$— group, or a —$(CH_2)_3$— group.

The alkyl group represented by $Rx_1$ to $Rx_3$ is preferably an alkyl group having 1 to 4 carbon atoms, such as a methyl group, an ethyl group, a n-propyl group, an isopropyl group, a n-butyl group, an isobutyl group, or a t-butyl group.

The cycloalkyl group represented by $Rx_1$ to $Rx_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group.

The cycloalkyl group formed by the bonding of two out of $Rx_1$ to $Rx_3$ is preferably a monocyclic cycloalkyl group such as a cyclopentyl group or a cyclohexyl group. In addition, a polycyclic cycloalkyl group such as a norbornyl group, a tetracyclodecanyl group, a tetracyclododecanyl group, or an adamantyl group is also preferable. Among these, a monocyclic cycloalkyl group having 5 or 6 carbon atoms is preferable.

In the cycloalkyl group formed by the bonding of two out of $Rx_1$ to $Rx_3$, for example, one methylene group constituting the ring may be substituted with a heteroatom such as an oxygen atom or a group having a heteroatom such as a carbonyl group.

As the repeating unit represented by General Formula (AI), for example, an aspect is preferable in which $Rx_1$ is a methyl group or an ethyl group, and $Rx_2$ and $Rx_3$ are bonded to each other to form the aforementioned cycloalkyl group.

In a case where each of the above groups has a substituent, examples of the substituent include an alkyl group (having 1 to 4 carbon atoms), a halogen atom, a hydroxyl group, an alkoxy group (having 1 to 4 carbon atoms), a carboxyl group, an alkoxycarbonyl group (having 2 to 6 carbon atoms), and the like. The number of carbon atoms in the substituent is preferably 8 or less.

As the repeating unit represented by General Formula (AI), an acid-decomposable (meth)acrylic acid tertiary alkyl ester-based repeating unit is preferable (a repeating unit in which $Xa_1$ represents a hydrogen atom or a methyl group, and T represents a single bond).

The resin (A) may have only one kind of repeating unit (A-a) or two or more kinds of repeating units (A-a).

The content of the repeating unit (A-a) (total content in a case where the resin (A) has two or more kinds of repeating units (A-a)) with respect to the total content of repeating units in the resin (A) is preferably 15 to 80 mol %, and more preferably 20 to 70 mol %.

In the resin (A), the content of the repeating unit which is decomposed by the action of an acid and generates a carboxyl group is preferably 25 to 70 mol % with respect to the total content of repeating units in the resin (A).

The resin (A) preferably has, as the repeating unit (A-a), at least one repeating unit selected from the group consisting of repeating units represented by General Formulas (A-VIII) to (A-XII).

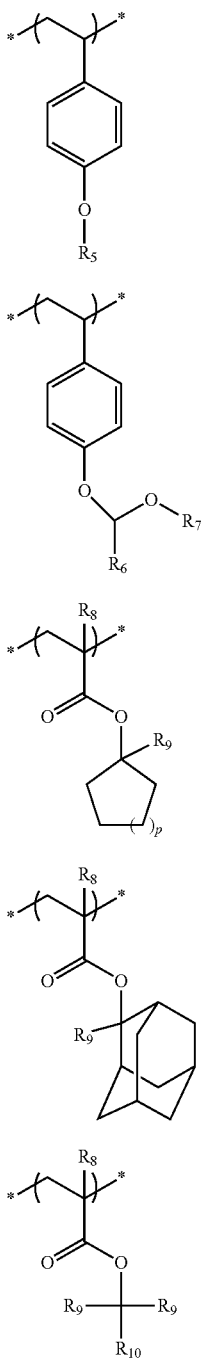

(A-VIII)

(A-IX)

(A-X)

(A-XI)

(A-XII)

In General Formula (A-VIII), $R_5$ represents a tert-butyl group or a —CO—O-(tert-butyl) group.

In General Formula (A-IX), $R_6$ and $R_7$ each independently represent a monovalent organic group. Examples of the monovalent organic group include an alkyl group, a cycloalkyl group, an aryl group, an aralkyl group, an alkenyl group, and the like.

In General Formula (A-X), p represents 1 or 2.

In General Formulas (A-X) to (A-XII), $R_8$ represents a hydrogen atom or an alkyl group having 1 to 3 carbon atoms, and $R_9$ represents an alkyl group having 1 to 3 carbon atoms.

In General Formula (A-XII), $R_{10}$ represents an alkyl group having 1 to 3 carbon atoms or an adamantyl group.

Specific examples of the repeating unit (A-a) will be shown below, but the present invention is not limited thereto. In the formulas, $Xa_1$ represents any of H, $CH_3$, $CF_3$, or $CH_2OH$, and Rxa and Rxb each represent a linear or branched alkyl group having 1 to 4 carbon atoms.

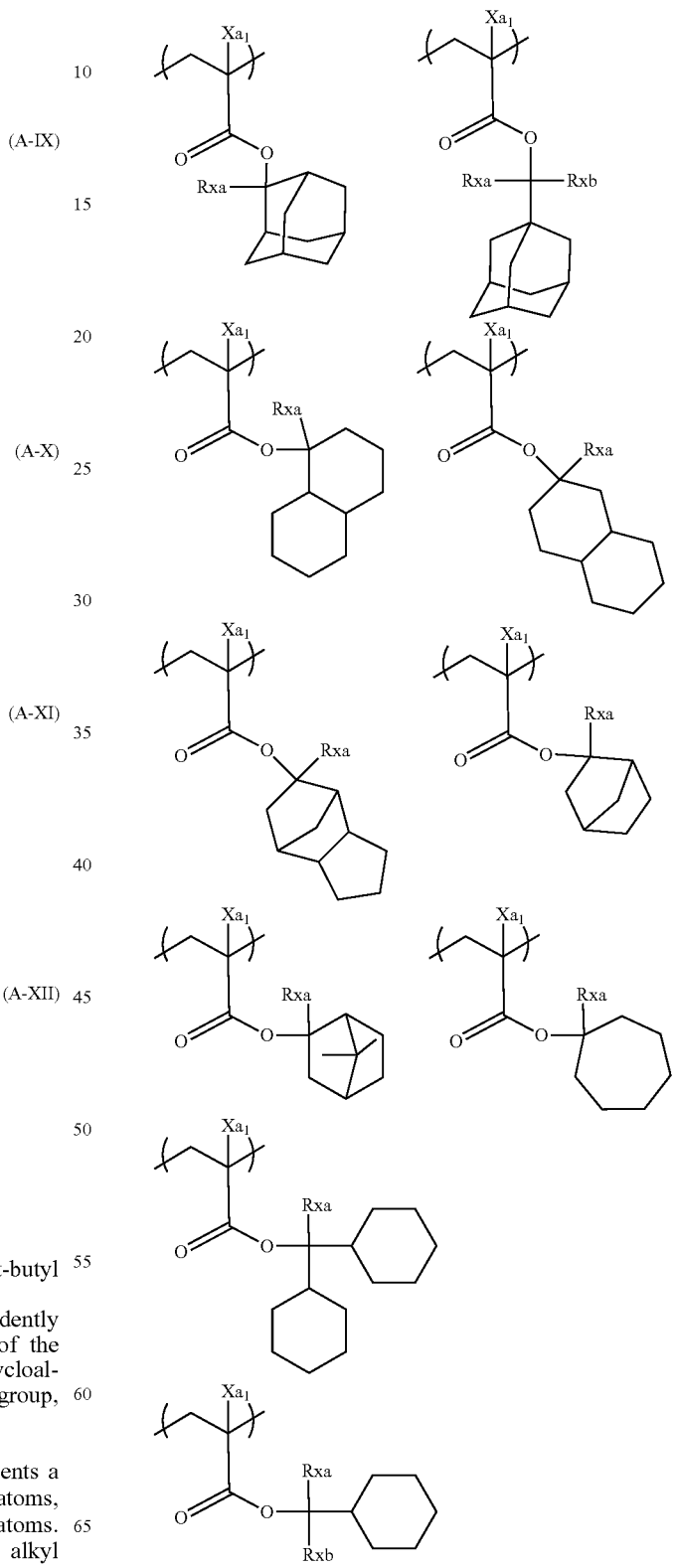

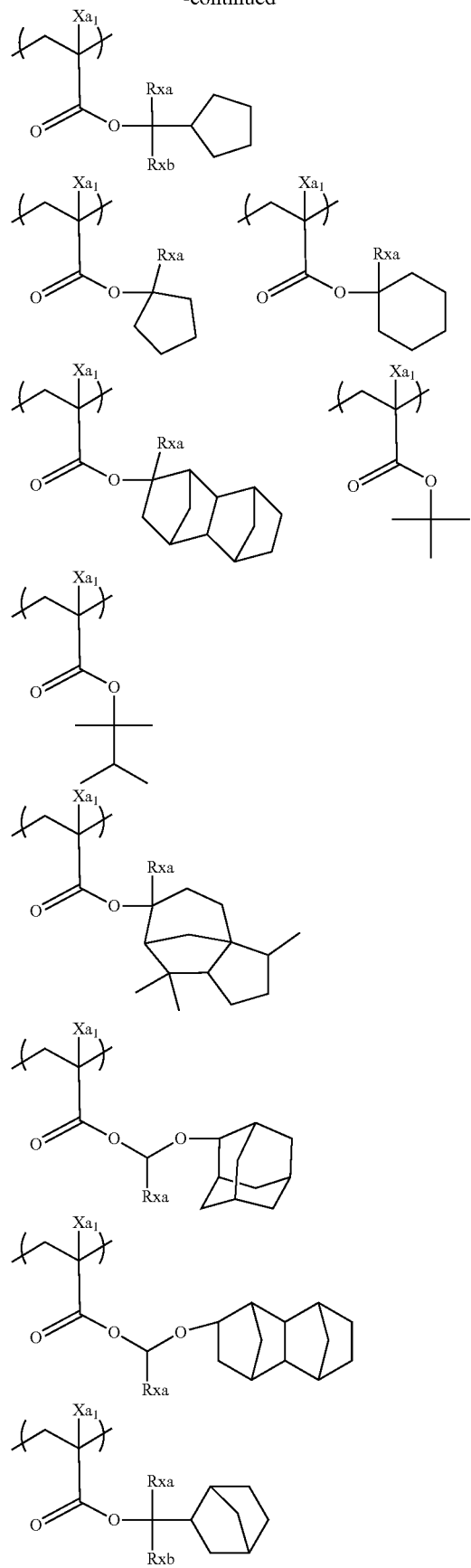
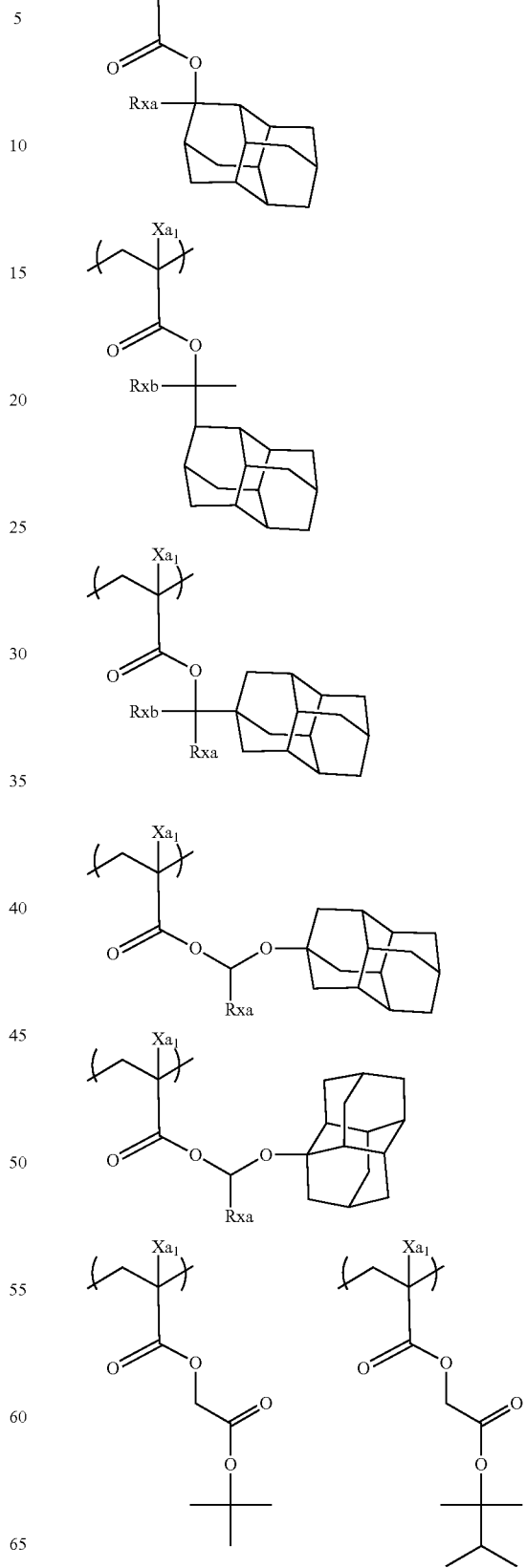

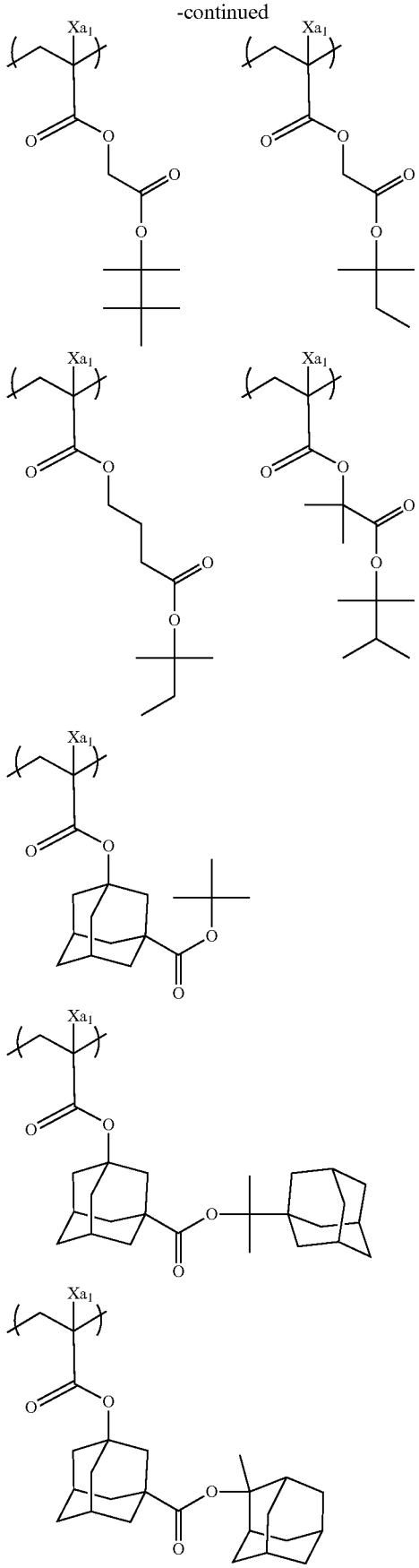
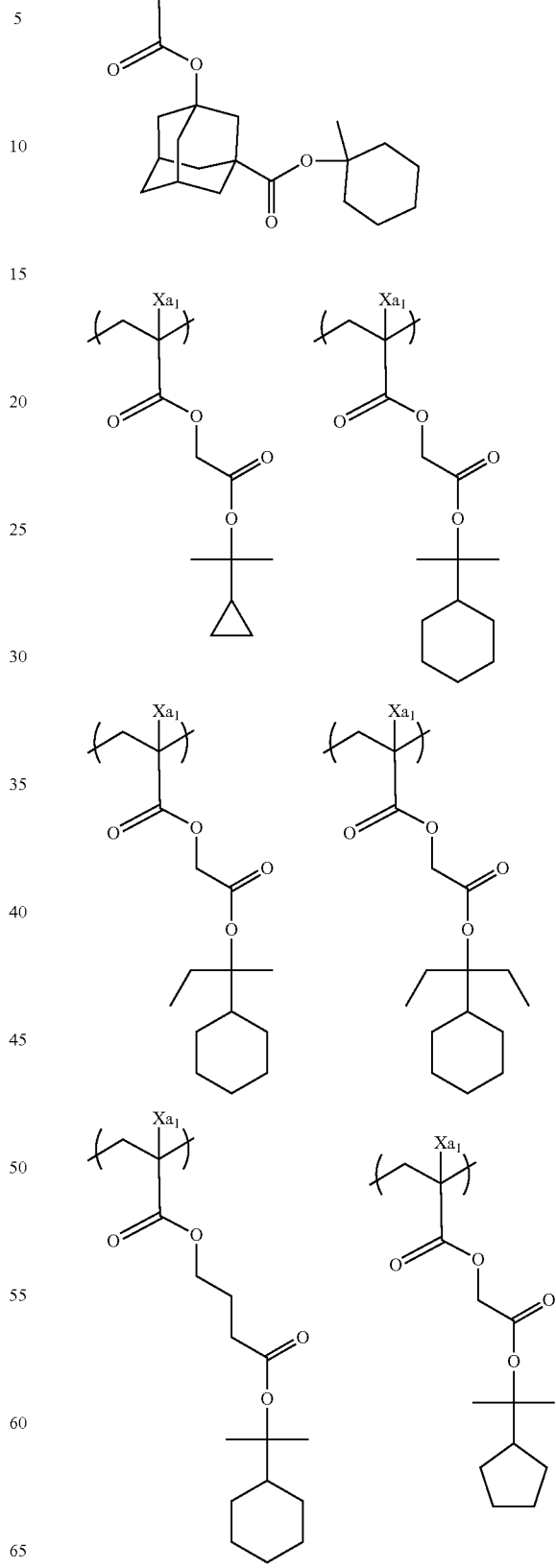

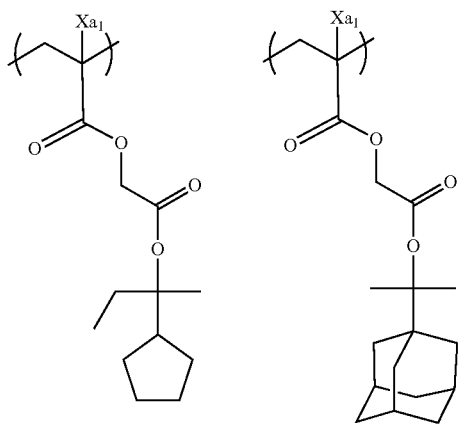
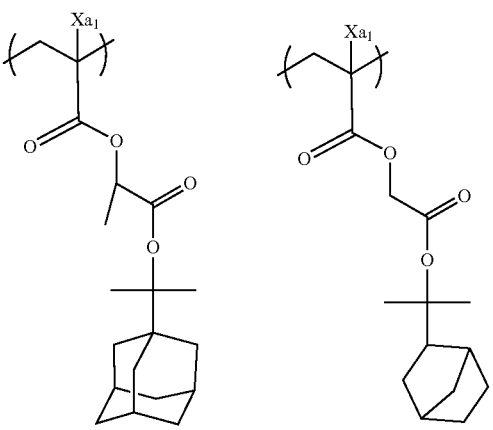
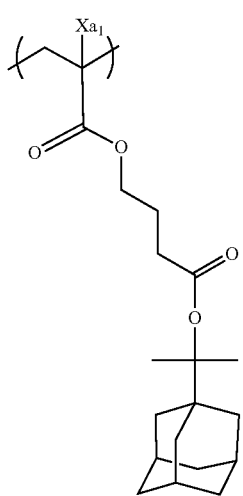
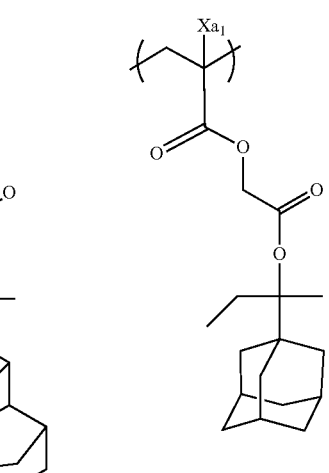
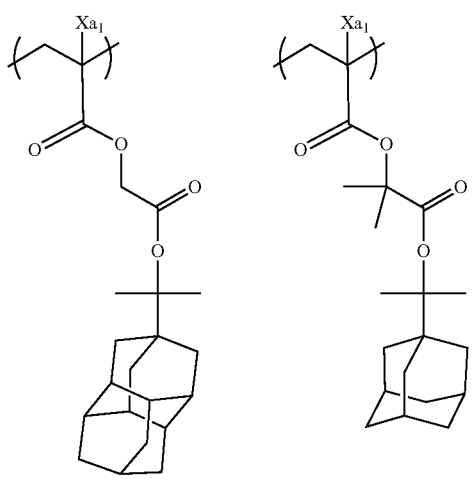
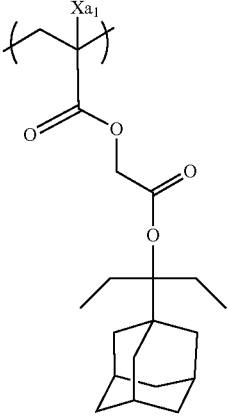

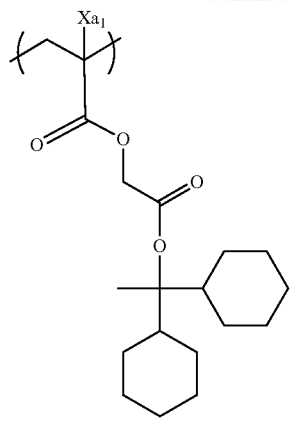
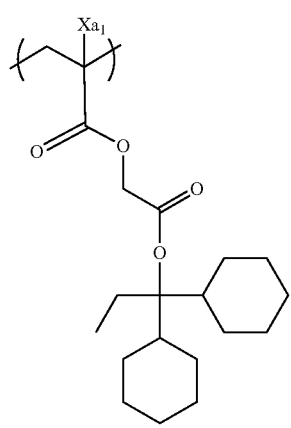
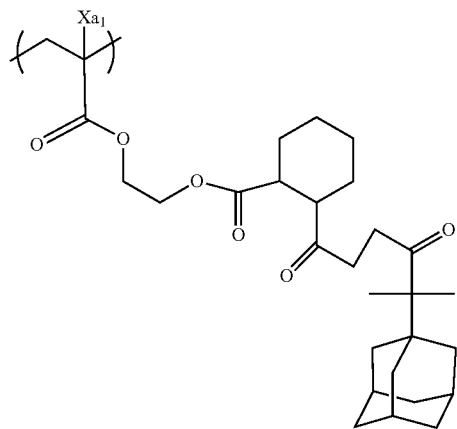
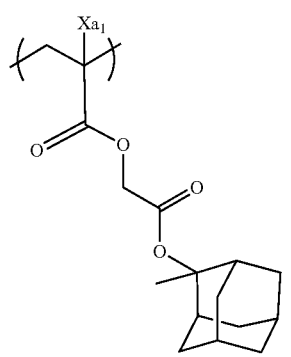
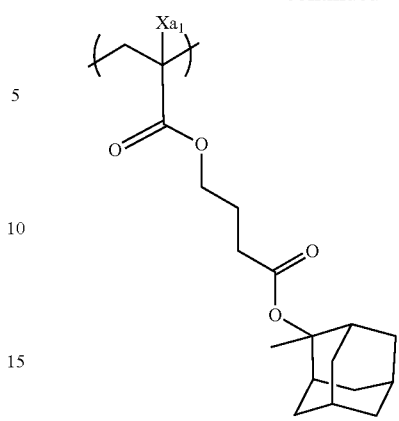
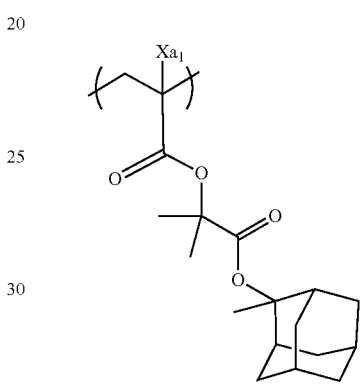
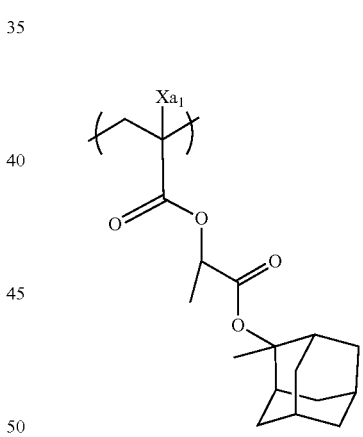
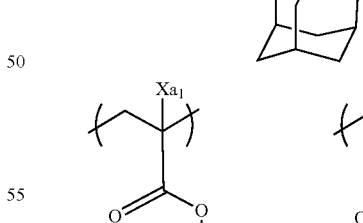
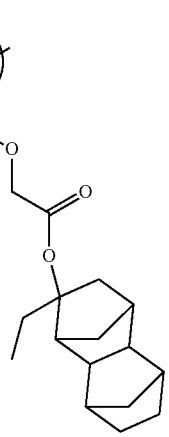

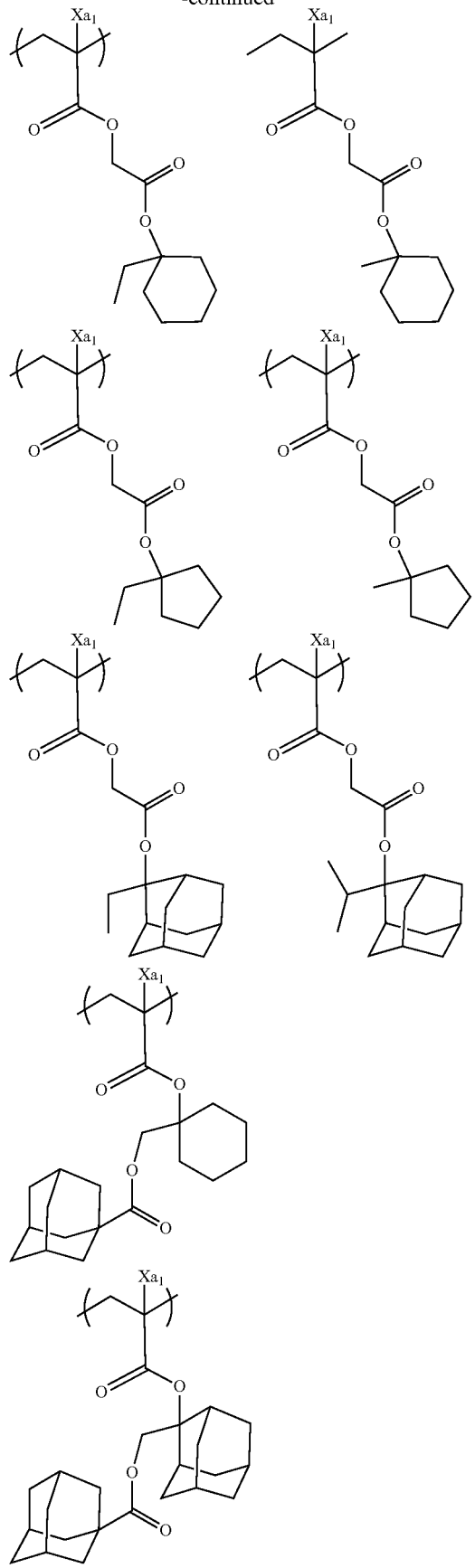
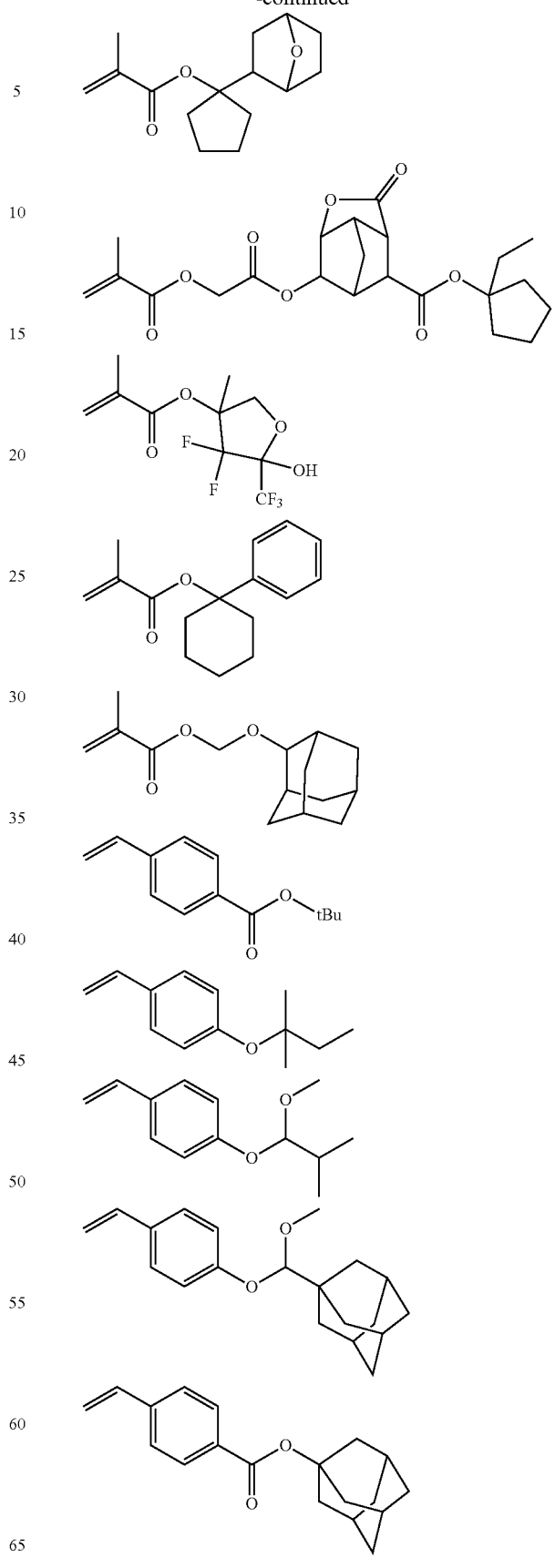

(Repeating Unit Having Acid Group)

The resin (A) may have a repeating unit having an acid group.

The repeating unit having an acid group is preferably a repeating unit represented by General Formula (B).

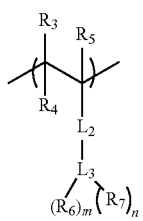

(B)

$R_3$ represents a hydrogen atom or a monovalent organic group which may have a fluorine atom or an iodine atom. As the monovalent organic group which may have a fluorine atom or an iodine atom, a group represented by -$L_4$-$R_8$ is preferable. $L_4$ represents a single bond or an ester group. Examples of $R_8$ include an alkyl group which may have a fluorine atom or an iodine atom, a cycloalkyl group which may have a fluorine atom or an iodine atom, an aryl group which may have a fluorine atom or an iodine atom, and a group consisting of a combination of these.

$R_4$ and $R_5$ each independently represent a hydrogen atom, a fluorine atom, an iodine atom, or an alkyl group which may have a fluorine atom or an iodine atom.

$L_2$ represents a single bond or an ester group.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be monocyclic or polycyclic, and examples thereof include a cycloalkyl ring group.

$R_6$ represents a hydroxyl group or a fluorinated alcohol group (preferably a hexafluoroisopropanol group). In a case where $R_6$ is a hydroxyl group, $L_3$ is preferably an (n+m+1)-valent aromatic hydrocarbon ring group.

$R_7$ represents a halogen atom. Examples of the halogen atom include a fluorine atom, a chlorine atom, a bromine atom, and an iodine atom.

m represents an integer of 1 or more. m is preferably an integer of 1 to 3, and more preferably an integer of 1 or 2.

n represents 0 or an integer of 1 or more. n is preferably an integer of 1 to 4.

(n+m+1) is preferably an integer of 1 to 5.

The repeating unit having an acid group is also preferably a repeating unit represented by General Formula (I).

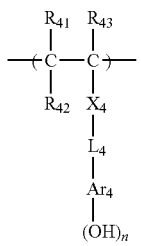

(I)

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. Here, $R_{42}$ and $Ar_4$ may be bonded to each other to form a ring. In this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents an (n+1)-valent aromatic ring group. In a case where $Ar_4$ is bonded to $R_{42}$ to form a ring, $Ar_4$ represents an (n+2)-valent aromatic ring group.

n represents an integer of 1 to 5.

As the alkyl group represented by $R_{41}$, $R_{42}$, and $R_{43}$ in General Formula (I), an alkyl group having 20 or less carbon atoms, such as a methyl group, an ethyl group, a propyl group, an isopropyl group, a n-butyl group, a sec-butyl group, a hexyl group, a 2-ethylhexyl group, an octyl group, or a dodecyl group is preferable, an alkyl group having 8 or less carbon atoms is more preferable, and an alkyl group having 3 or less carbon atoms is even more preferable.

The cycloalkyl group represented by $R_{41}$, $R_{42}$, and $R_{43}$ in General Formula (I) may be monocyclic or polycyclic. Among these, a monocyclic cycloalkyl group having 3 to 8 carbon atoms such as a cyclopropyl group, a cyclopentyl group, or a cyclohexyl group is preferable.

Examples of the halogen atom represented by $R_{41}$, $R_{42}$, and $R_{43}$ in General Formula (I) include a fluorine atom, a chlorine atom, a bromine atom, and an iodine atom. Among these, a fluorine atom is preferable.

As the alkyl group contained in the alkoxycarbonyl group represented by $R_{41}$, $R_{42}$, and $R_{43}$ in General Formula (I), the same alkyl group as the alkyl group represented by $R_{41}$, $R_{42}$, and $R_{43}$ described above is preferable.

$Ar_4$ represents an (n+1)-valent aromatic ring group. A divalent aromatic ring group obtained in a case where n is 1 is preferably an arylene group having 6 to 18 carbon atoms such as a phenylene group, a tolylene group, a naphthylene group, or an anthracenylene group which may have a substituent or an aromatic ring group containing a heteroring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, or a thiazole ring.

Specific examples of the (n+1)-valent aromatic ring group obtained in a case where n is an integer of 2 or greater include groups obtained by removing (n−1) pieces of any hydrogen atoms from the specific examples of the divalent aromatic ring group described above. The (n+1)-valent aromatic ring group may further have a substituent.

Examples of the substituent that the alkyl group, the cycloalkyl group, the alkoxycarbonyl group, the alkylene group, and the (n+1)-valent aromatic ring group described above can have include the alkyl group exemplified above as $R_{41}$, $R_{42}$, and $R_{43}$ in General Formula (I), an alkoxy group such as a methoxy group, an ethoxy group, a hydroxyethoxy group, a propoxy group, a hydroxypropoxy group, or a butoxy group; an aryl group such as a phenyl group; and the like.

Examples of the alkyl group represented by $R_{64}$ in —CONR$_{64}$— ($R_{64}$ represents a hydrogen atom or an alkyl group) represented by $X_4$ include an alkyl group having 20 or less carbon atoms such as a methyl group, an ethyl group, a propyl group, an isopropyl group, a n-butyl group, a sec-butyl group, a hexyl group, a 2-ethylhexyl group, an octyl group, or a dodecyl group. Among these, an alkyl group having 8 or less carbon atoms is preferable.

$X_4$ is preferably a single bond, —COO—, or —CONH—, and more preferably a single bond or —COO—.

The alkylene group represented by $L_4$ is preferably an alkylene group having 1 to 8 carbon atoms such as a methylene group, an ethylene group, a propylene group, a butylene group, a hexylene group, or an octylene group.

$Ar_4$ is preferably an aromatic ring group having 6 to 18 carbon atoms, and more preferably a benzene ring group, a naphthalene ring group, or a biphenylene ring group.

Specific examples of the repeating unit represented by General Formula (I) will be shown below, but the present invention is not limited thereto. In the formulas, a represents 1 or 2.

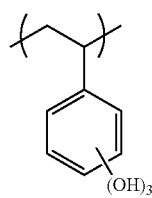
(B-1)

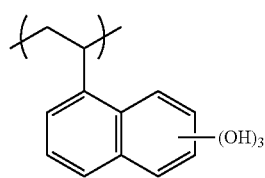
(B-2)

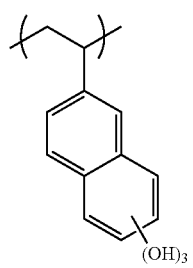
(B-3)

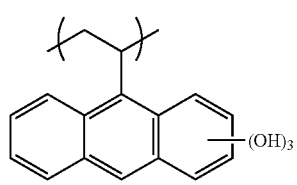
(B-4)

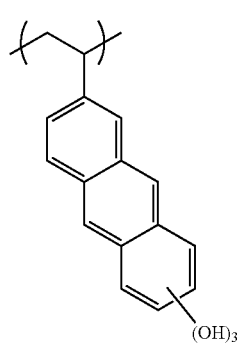
(B-5)

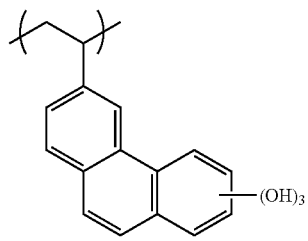
(B-6)

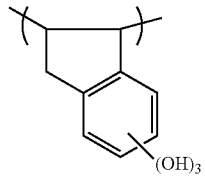
(B-7)

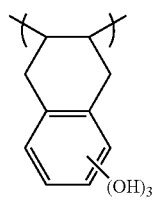
(B-8)

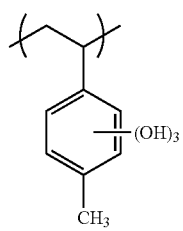
(B-9)

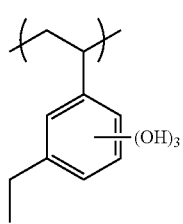
(B-10)

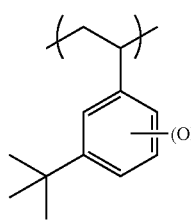
(B-11)

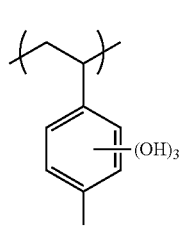
(B-12)

(B-13) 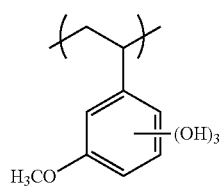
(B-14) 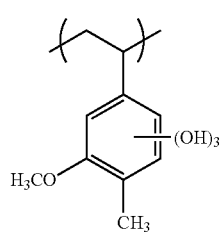
(B-15) 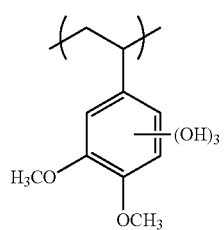
(B-16) 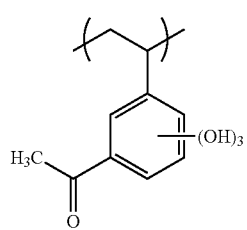
(B-17) 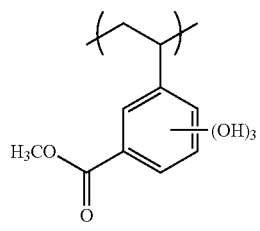
(B-18) 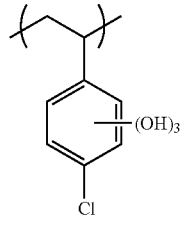
(B-19) 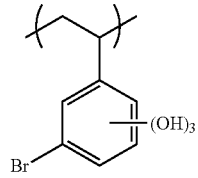
(B-20) 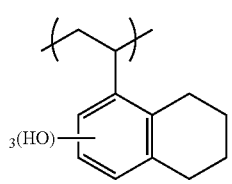
(B-21) 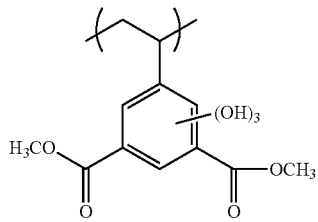
(B-22) 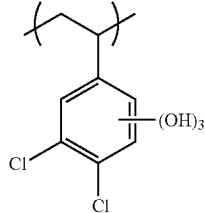
(B-23) 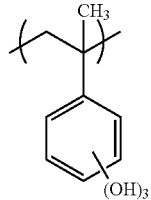
(B-24) 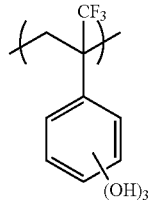
(B-25) 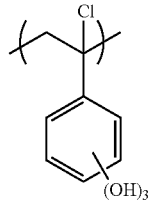
(B-26) 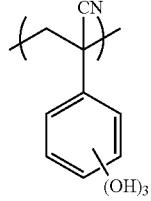

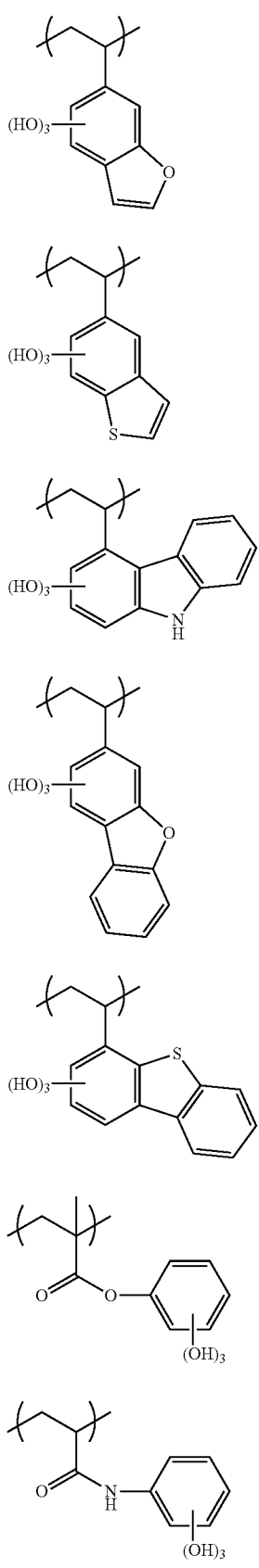
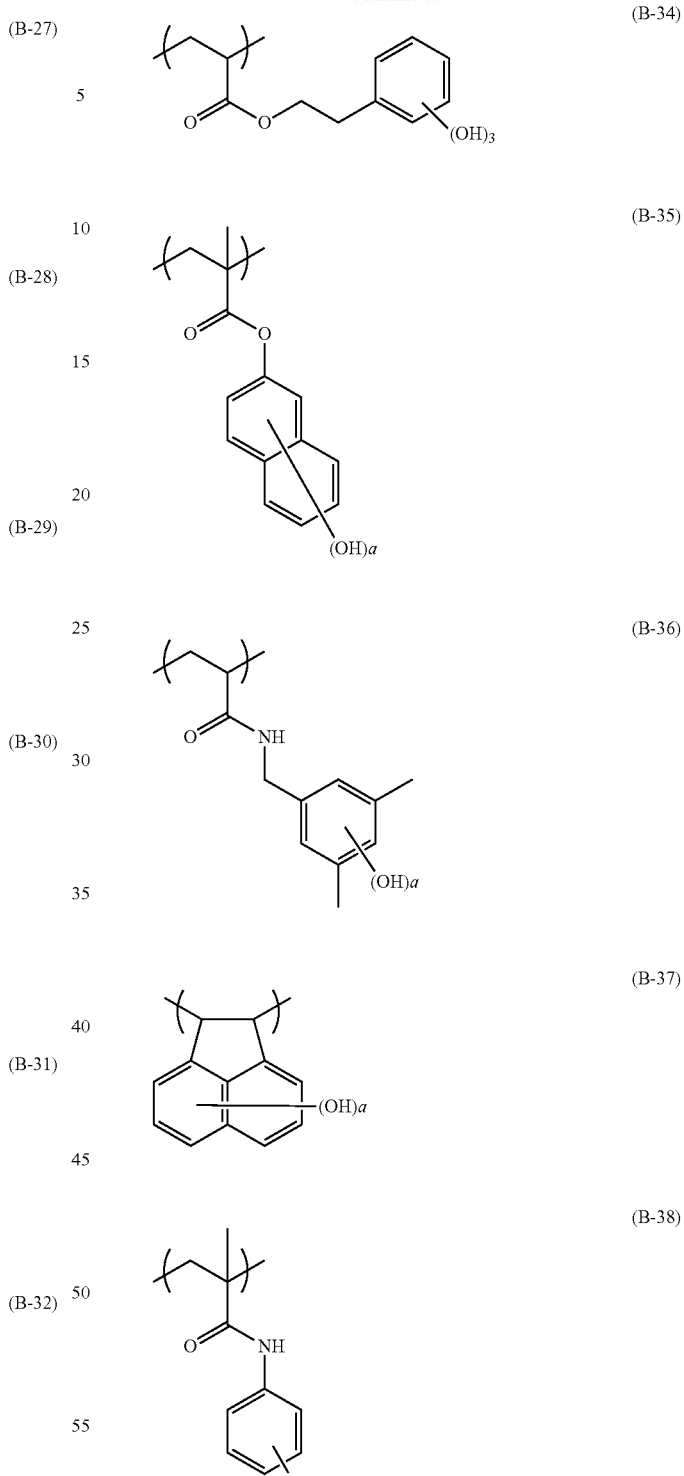
<<Repeat Unit (A-1) Derived from Hydroxystyrene>>
The resin (A) preferably has a repeating unit (A-1) derived from hydroxystyrene as the repeating unit having an acid group.
Examples of the repeating unit (A-1) derived from hydroxystyrene include a repeating unit represented by General Formula (1).

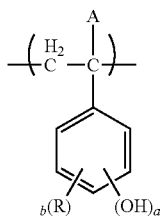
(1)

In General Formula (1),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group. In a case where there is a plurality of Rs, they may be the same or different from each other. In a case where the repeating unit has a plurality of Rs, they may be bonded to each other to form a ring. As R, a hydrogen atom is preferable.

a represents an integer of 1 to 3, and b represents an integer of 0 to (5-a).

As the repeating unit (A-1), a repeating unit represented by General Formula (A-I) is preferable.

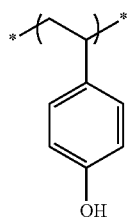
(A-I)

The composition containing the resin (A) having the repeating unit (A-1) is preferable for KrF exposure, EB exposure, or EUV exposure. In this case, the content of the repeating unit (A-1) with respect to the total content of repeating units in the resin (A) is preferably 30 to 100 mol %, more preferably 40 to 100 mol %, and even more preferably 50 to 100 mol %.

(Repeating Unit (A-2) Containing at Least One Kind of Structure Selected from the Group Consisting of Lactone Structure, Sultone Structure, Carbonate Structure, and Hydroxyadamantane Structure)

The resin (A) may have a repeating unit (A-2) having at least one kind of structure selected from the group consisting of a lactone structure, a carbonate structure, a sultone structure, and a hydroxyadamantane structure.

<<Repeating Unit Having Lactone Structure or Sultone Structure>>

The lactone structure or sultone structure in the repeating unit having a lactone structure or a sultone structure is not particularly limited. The lactone structure or the sultone structure is preferably a 5- to 7-membered lactone structure or a 5- to 7-membered sultone structure, and more preferably a 5- to 7-membered lactone structure fused with another ring structure by forming a bicyclo structure or a spiro structure or a 5- to 7-membered sultone structure fused with another ring structure by forming a bicyclo structure or a spiro structure. It is even more preferable that the resin (A) have a repeating unit having a lactone structure represented by any of General Formulas (LC1-1) to (LC1-21) or a sultone structure represented by any of General Formulas (SL1-1) to (SL1-3). Furthermore, the lactone structure or the sultone structure may be directly bonded to the main chain. As the lactone structure or the sultone structure, structures represented by General Formula (LC1-1), General Formula (LC1-4), General Formula (LC1-5), General Formula (LC1-8), General Formula (LC1-16), General Formula (LC1-21), or General Formula (SL1-1) are preferable.

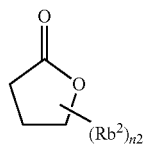
LC1-1

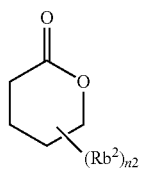
LC1-2

LC1-3

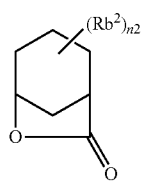
LC1-4

LC1-5

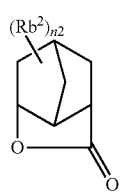
LC1-6

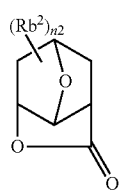

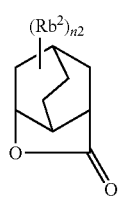

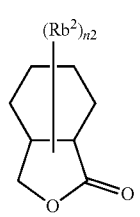
LC1-7

LC1-8 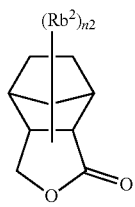
LC1-9 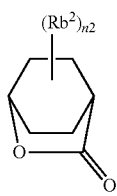
LC1-10 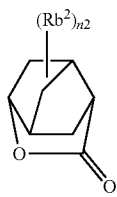
LC1-11 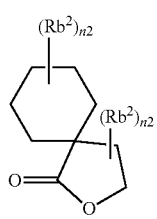
LC1-12 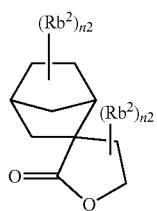
LC1-13 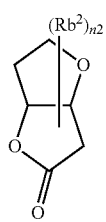
LC1-14 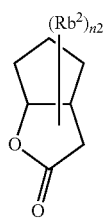
LC1-15 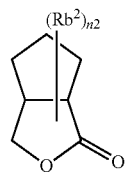
LC1-16 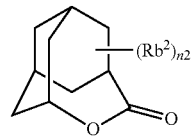
LC1-17 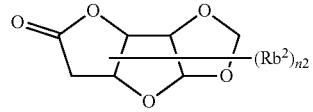
LC1-18 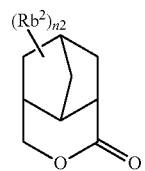
LC1-19 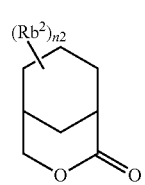
LC1-20 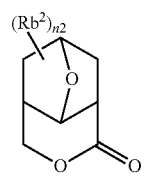
LC1-22 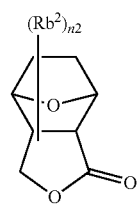
SL1-1 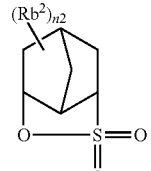
SL1-2 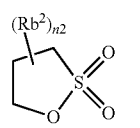

-continued

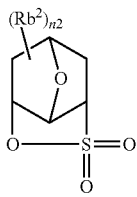
SL1-3

The lactone structure portion or the sultone structure portion may or may not have a substituent ($Rb^2$). The substituent ($Rb^2$) is preferably an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom other than a fluorine atom, a hydroxyl group, a cyano group, or an acid-decomposable group, and more preferably an alkyl group having 1 to 4 carbon atoms, a cyano group, or an acid-decomposable group. n2 represents an integer of 0 to 4. In a case where n2 is 2 or more, the plurality of substituents ($Rb^2$) may be the same or different from each other. Furthermore, the plurality of substituents ($Rb^2$) may be bonded to each other to form a ring.

As the repeating unit having a lactone structure or a sultone structure, from the viewpoint of tolerance of focal depth and pattern linearity, a repeating unit represented by Formula III is preferable.

In addition, from the viewpoint of tolerance of focal depth and pattern linearity, the resin having a repeating unit having an acid-decomposable group preferably has a repeating unit represented by Formula III.

Formula III

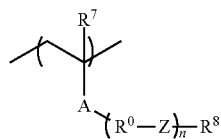

In Formula III,

A represents an ester bond (a group represented by —COO—) or an amide bond (a group represented by —CONH—).

n is the number of repeating structures represented by —$R^0$—Z—, and represents an integer of 0 to 5. n is preferably 0 or 1, and more preferably 0. In a case where n is 0, —$R^0$—Z— is non-existent, and A and $R^8$ are bonded through a single bond.

$R^0$ represents an alkylene group, a cycloalkylene group, or a combination of these. In a case where there is a plurality of $R^0$'s, $R^0$'s each independently represent an alkylene group, a cycloalkylene group, or a combination of these.

Z represents a single bond, an ether bond, an ester bond, an amide bond, a urethane bond, or a urea bond. In a case where there is a plurality of Zs, Zs each independently represent a single bond, an ether bond, an ester bond, an amide bond, a urethane bond, or a urea bond.

$R^8$ represents a monovalent organic group having a lactone structure or a sultone structure.

$R^7$ represents a hydrogen atom, a halogen atom other than a fluorine atom, or a monovalent organic group (preferably a methyl group).

The alkylene group or the cycloalkylene group represented by $R^0$ may have a substituent.

Z is preferably an ether bond or an ester bond, and more preferably an ester bond.

As the repeating unit having a lactone structure or a sultone structure, at least one kind of repeating unit selected from the group consisting of repeating units represented by General Formulas (A-II) to (A-V) is also preferable.

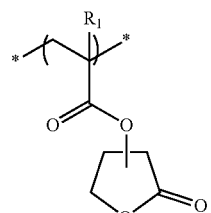
(A-II)

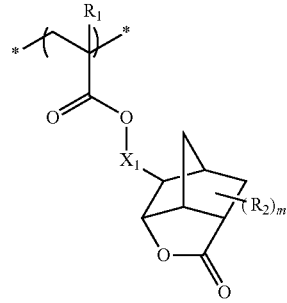
(A-III)

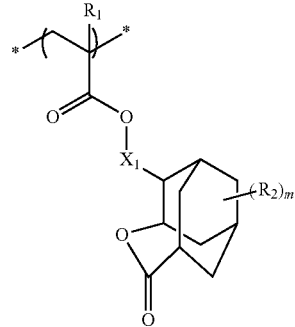
(A-IV)

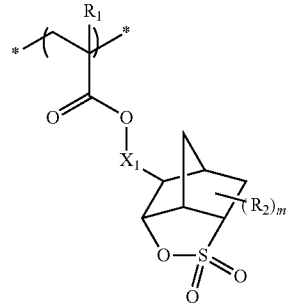
(A-V)

In General Formulas (A-II) to (A-V), $R_1$ represents a hydrogen atom or an alkyl group having 1 to 3 carbon atoms.

$R_2$ represents an alkyl group having 1 to 4 carbon atoms, a cyano group, or —CO—O—$R_{21}$. $R_{21}$ represents an alkyl group having 1 to 4 carbon atoms.

$X_1$ represents a single bond, an alkylene group having 1 to 3 carbon atoms, or —$R_3$—CO—O—, and $R_3$ represents an alkylene group having 1 to 3 carbon atoms.

m represents 0 or 1.

Specific examples of monomers corresponding to the repeating unit represented by Formula III or the repeating units represented by General Formulas (A-II) to (A-V) will be shown below. The following specific examples correspond to monomers in which R[7] in Formula III and R[1] in General Formulas (A-II) to (A-V) represent a methyl group. The methyl group can be optionally substituted with a hydrogen atom or an alkyl group having 2 or 3 carbon atoms.

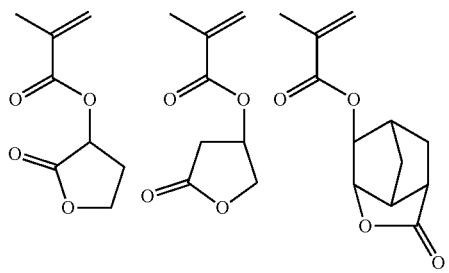

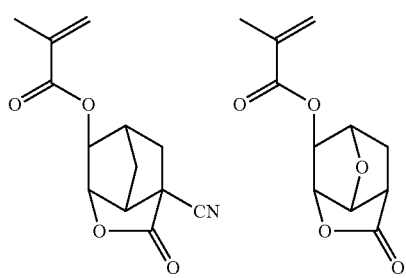

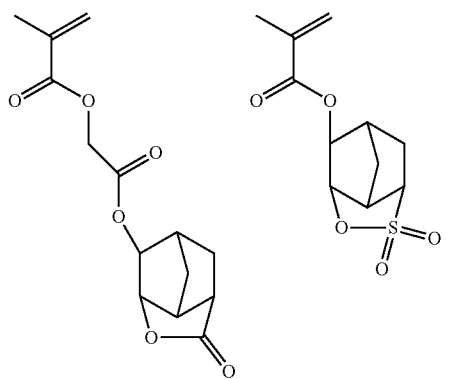

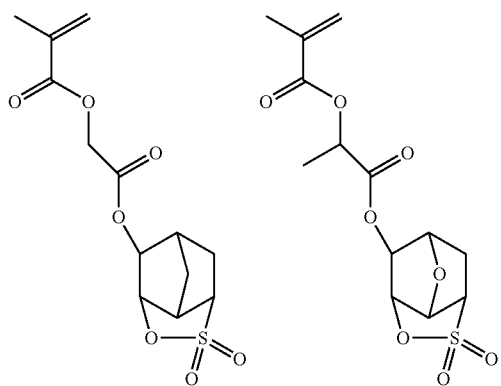

-continued

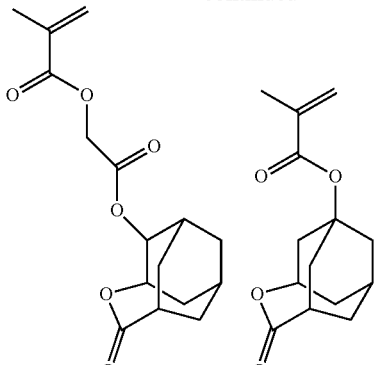

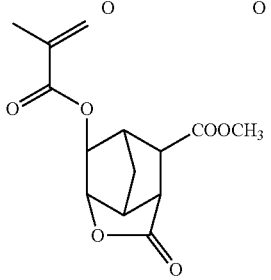

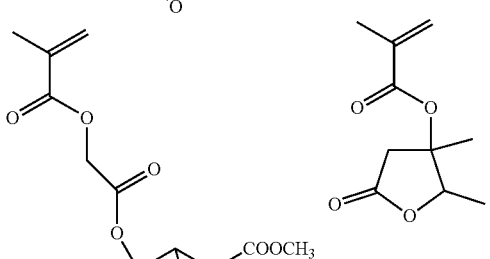

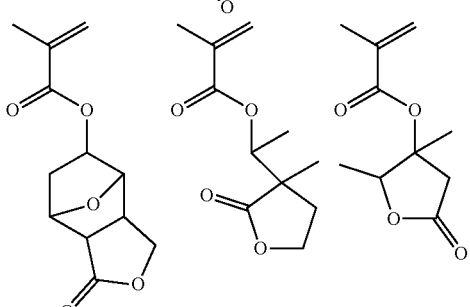

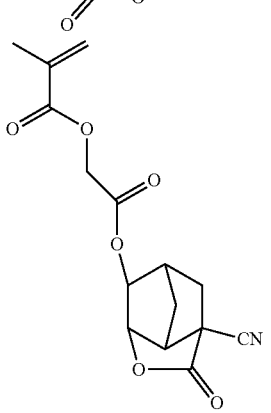

In addition to the above monomers, the following monomers are also preferably used as the repeating unit having a lactone structure or a sultone structure.

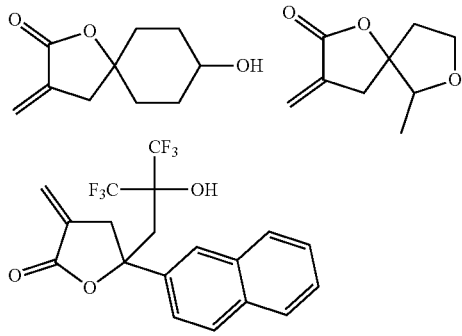

<<Repeating Unit Having Carbonate Structure>>

The resin (A) may have a repeating unit having a carbonate structure. The carbonate structure is preferably a cyclic carbonate structure.

The repeating unit having a cyclic carbonate structure is preferably a repeating unit represented by Formula A-1.

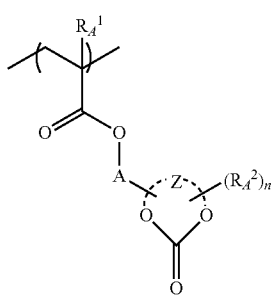

Formula A-1

In Formula A-1, $R_A^1$ represents a hydrogen atom, a halogen atom other than a fluorine atom, or a monovalent organic group (preferably a methyl group), n represents an integer of 0 or more, and $R_A^2$ represents a substituent. $R_A^2$ each independently represents a substituent in a case where n is 2 or more, A represents a single bond or a divalent linking group, and Z represents an atomic group that forms a monocyclic structure or polycyclic structure together with a group represented by —O—C(=O)—O— in the formula.

As the repeating unit having a carbonate structure, a repeating unit represented by General Formula (A-VI) is more preferable.

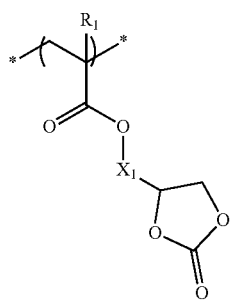

(A-VI)

In General Formula (A-VI), $R_1$ represent a hydrogen atom or an alkyl group having 1 to 3 carbon atoms.

$X_1$ represents a single bond, an alkylene group having 1 to 3 carbon atoms, or —$R_3$—CO—O—, and $R_3$ represents an alkylene group having 1 to 3 carbon atoms.

It is also preferable that the resin (A) have, as the repeating unit having at least one kind of structure selected from the group consisting of a lactone structure, a sultone structure, and a carbonate structure, the repeating unit described in paragraphs "0370" to "0414" of US2016/0070167A.

<<Repeating Unit Having Hydroxyadamantane Structure>>

The resin (A) may have a repeating unit having a hydroxyadamantane structure. Examples of the repeating unit having a hydroxyadamantane structure include a repeating unit represented by General Formula (AIIa).

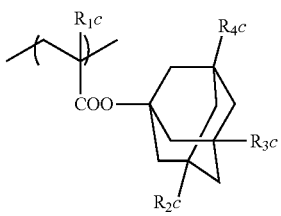

(AIIa)

In General Formula (AIIa), $R_{1c}$ represents a hydrogen atom, a methyl group, a trifluoromethyl group, or a hydroxymethyl group. $R_{2c}$ to $R_{4c}$ each independently represent a hydrogen atom or a hydroxyl group. Here, at least one of $R_{2c}$, $R_{3c}$, or $R_{4c}$ represents a hydroxyl group. It is preferable that one or two out of $R_{2c}$, $R_{3c}$, or $R_{4c}$ be hydroxyl groups and the rest be a hydrogen atom.

As the repeating unit having a hydroxyadamantane structure, a repeating unit represented by General Formula (A-VII) is more preferable.

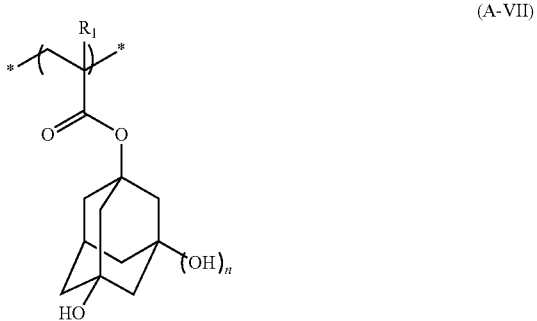

(A-VII)

In General Formula (A-VII), $R_1$ represent a hydrogen atom or an alkyl group having 1 to 3 carbon atoms. n represents 0 or 1.

Specific examples of the repeating unit having a hydroxyadamantane structure will be shown below, but the present invention is not limited thereto.

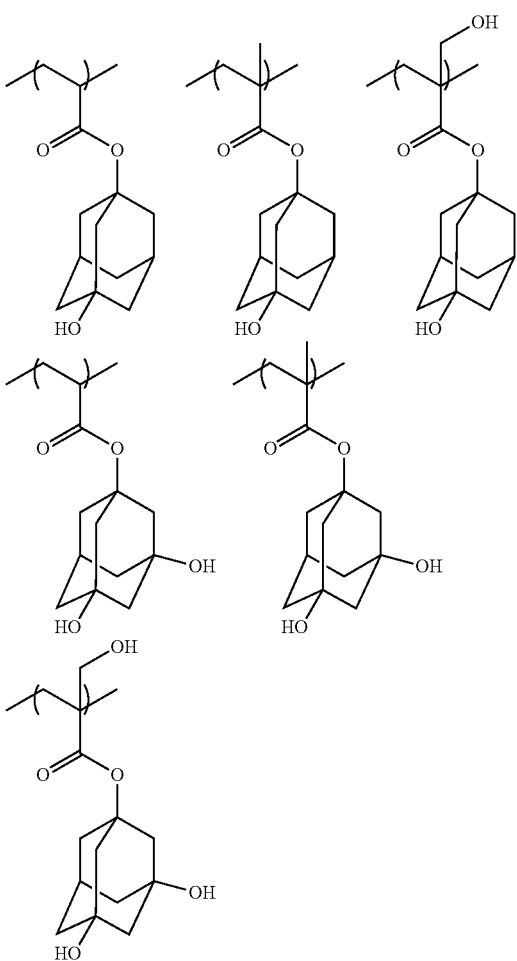

In a case where the resin (A) has the repeating unit having a hydroxyadamantane structure, the content of the repeating unit having a hydroxyadamantane structure with respect to the total content of repeating units in the resin (A) is preferably 5 to 40 mol %, more preferably 5 to 30 mol %, and even more preferably 10 to 25 mol %.

The resin (A) may have only one kind of repeating unit (A-2) having at least one kind of structure selected from the group consisting of a lactone structure, a carbonate structure, a sultone structure, and a hydroxyadamantane structure, or may have two or more kinds of repeating units (A-2) in combination.

As the repeating unit (A-2), a repeating unit is preferable which is derived from a (meth)acrylate containing at least one kind of structure selected from the group consisting of a lactone structure, a carbonate structure, a sultone structure, and a hydroxyadamantane structure.

The content of the repeating unit (A-2) (total content in a case where the resin (A) has a plurality of repeating units (A-2)) contained in the resin (A) with respect to the total content of repeating units in the resin (A) is preferably 5 to 70 mol %, more preferably 10 to 65 mol %, and even more preferably 20 to 60 mol %.

It is preferable that the resin (A) have at least one of the repeating unit (A-1) derived from hydroxystyrene described above or the repeating unit (A-2) containing at least one kind of structure selected from the group consisting of a lactone structure, a carbonate structure, a sultone structure, and a hydroxyadamantane structure.

Particularly, it is preferable that the repeating unit (A-1) be the repeating unit represented by General Formula (A-I), and the repeating unit (A-2) contain at least one kind of repeating unit selected from the group consisting of the repeating units represented by General Formulas (A-II) to (A-VII).

The repeating unit (A-1), the repeating unit (A-2), and the repeating units represented by General Formulas (A-I) to (A-VII) as well as the preferred aspects thereof are as described above.

(Other Repeating Units)

The resin (A) may have repeating units other than the repeating unit (A-a) having an acid-decomposable group, the repeating unit having an acid group, and the repeating unit (A-2) described above.

<<Repeating Unit Having Fluorine Atom or Iodine Atom>>

The resin (A) may have a repeating unit having a fluorine atom or an iodine atom. Here, the repeating unit having a fluorine atom or an iodine atom does not include the repeating unit (A-a) having an acid-decomposable group, the repeating unit having an acid group, and the repeating unit (A-2).

As the repeating unit having a fluorine atom or an iodine atom, a repeating unit represented by Formula (C) is preferable.

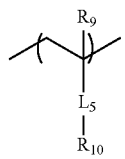

(C)

$L_5$ represents a single bond or an ester group.

$R_9$ represents a hydrogen atom or an alkyl group which may have a fluorine atom or an iodine atom.

$R_{10}$ represents a hydrogen atom, an alkyl group which may have a fluorine atom or an iodine atom, a cycloalkyl group which may have a fluorine atom or an iodine atom, an aryl group which may have a fluorine atom or an iodine atom, or a group consisting of a combination of these.

The content of the repeating unit having a fluorine atom or an iodine atom with respect to the total content of repeating units in the resin (A) is preferably 0 to 50 mol %, more preferably 5 to 45 mol %, and even more preferably 10 to 40 mol %.

<<Repeating Unit Having Photoacid Generating Group>>

The resin (A) may have, as a repeating unit other than the above ones, a repeating unit having a group that generates an acid by irradiation with radiation (hereinafter, also called "photoacid generating group").

In this case, the repeating unit having a photoacid generating group can be regarded as the photoacid generator (P).

Examples of such a repeating unit include a repeating unit represented by General Formula (4).

(4)

$R^{41}$ represents a hydrogen atom or a methyl group. $L^{41}$ represents a single bond or a divalent linking group. $L^{42}$ represents a divalent linking group. $R^{40}$ represents a structural moiety generating an acid on a side chain by being decomposed by irradiation with radiation.

Specific examples of the repeating unit represented by General Formula (4) will be shown below, but the present invention is not limited thereto.

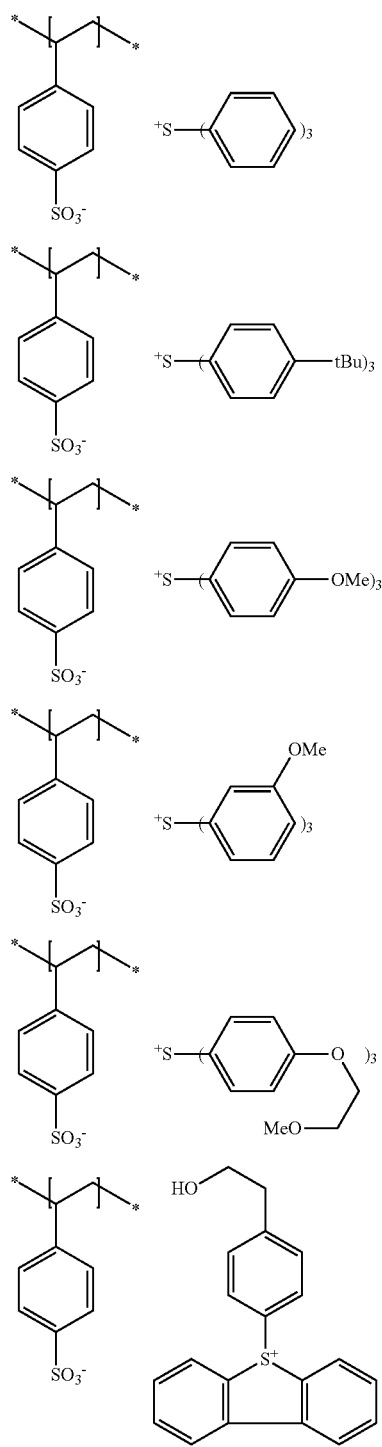
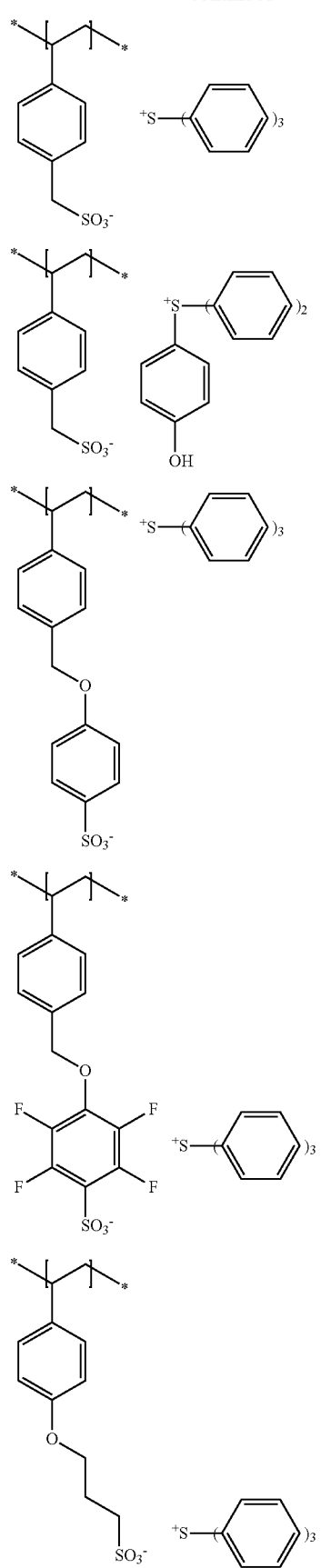

-continued

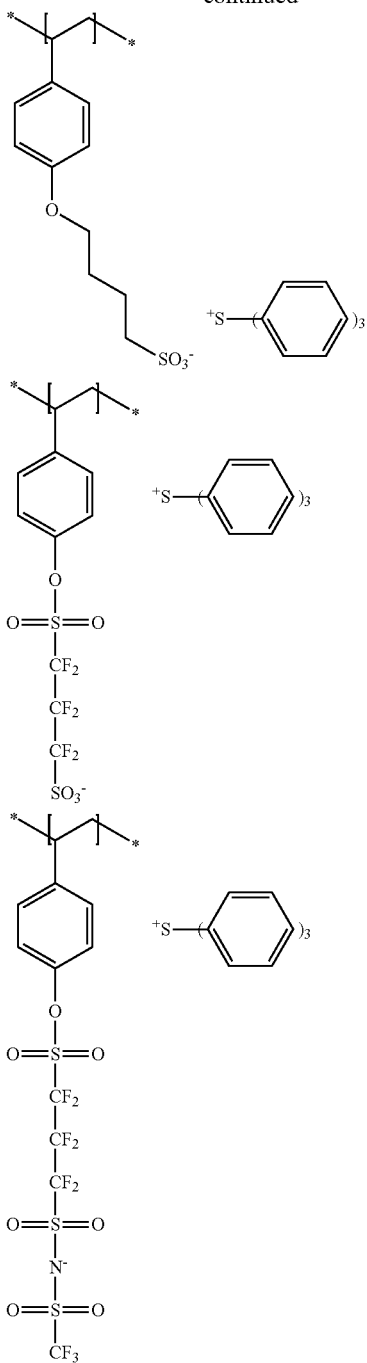

Examples of the repeating unit represented by General Formula (4) also include the repeating units described in paragraphs "0094" to "0105" in JP2014-041327A.

The content of the repeating unit having a photoacid generating group with respect to the total content of repeating units in the resin (A) is preferably 1 to 40 mol %, more preferably 5 to 35 mol %, and even more preferably 5 to 30 mol %.

<<Repeating Unit Having Alkali-Soluble Group>>

The resin (A) may have a repeating unit having an alkali-soluble group.

Examples of the alkali-soluble group include a carboxyl group, a sulfonamide group, a sulfonylimide group, a bis(sulfonyl)imide group, and an aliphatic alcohol in which the α-position is substituted with an electron-withdrawing group (for example, a hexafluoroisopropanol group). Among these, a carboxyl group is preferable. In a case where the resin (A) has a repeating unit having an alkali-soluble group, the resolution for contact holes is increased.

Examples of the repeating unit having an alkali-soluble group include a repeating unit having an alkali-soluble group that is directly bonded to the main chain of the resin, such as a repeating unit composed of an acrylic acid or a methacrylic acid, and a repeating unit having an alkali-soluble group that is bonded to the main chain of the resin through a linking group. The linking group may have a monocyclic or polycyclic hydrocarbon structure.

As the repeating unit having an alkali-soluble group, a repeating unit composed of an acrylic acid or a methacrylic acid is preferable.

The content of the repeating unit having an alkali-soluble group with respect to the total content of repeating units in the resin (A) is preferably 0 to 20 mol %, more preferably 3 to 15 mol %, and even more preferably 5 to 10 mol %.

Specific examples of the repeating unit having an alkali-soluble group will be shown below, but the present invention is not limited thereto. In the specific examples, Rx represents H, $CH_3$, $CH_2OH$, or $CF_3$.

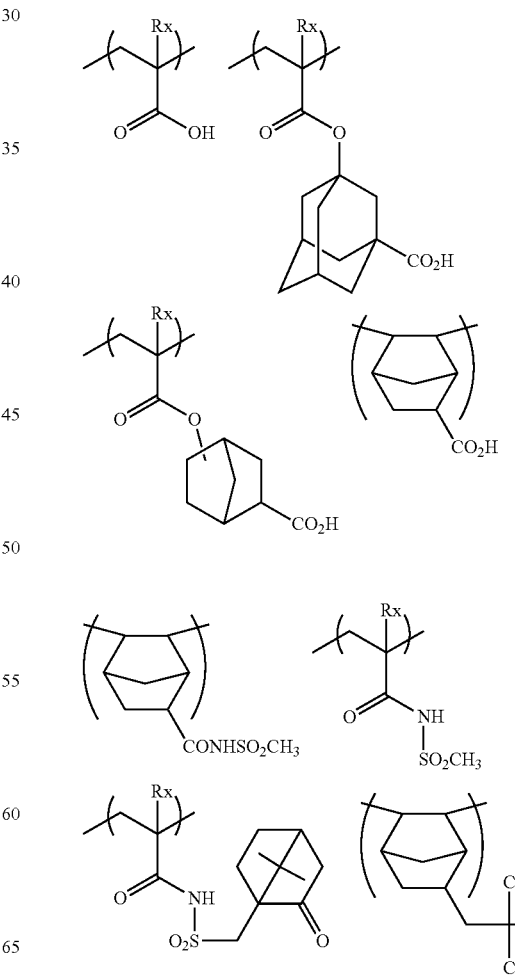

-continued

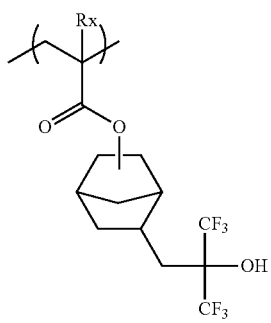

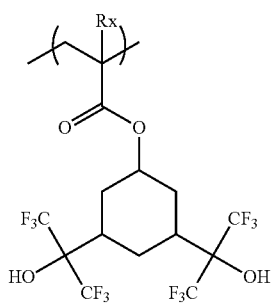

<<Repeating Unit Having Neither Acid-Decomposable Group Nor Polar Group>>

The resin (A) may further have a repeating unit having neither an acid-decomposable group nor a polar group. The repeating unit having neither an acid-decomposable group nor a polar group preferably has an alicyclic hydrocarbon structure.

Examples of the repeating unit having neither an acid-decomposable group nor a polar group include the repeating units described in paragraphs "0236" and "0237" of US2016/0026083A and the repeating units described in paragraph "0433" of US2016/0070167A.

Preferred examples of monomers corresponding to the repeating unit having neither an acid-decomposable group nor a polar group will be shown below.

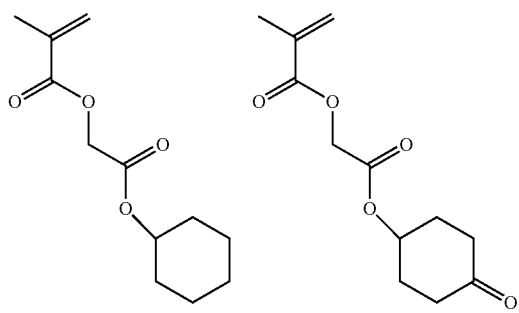

-continued

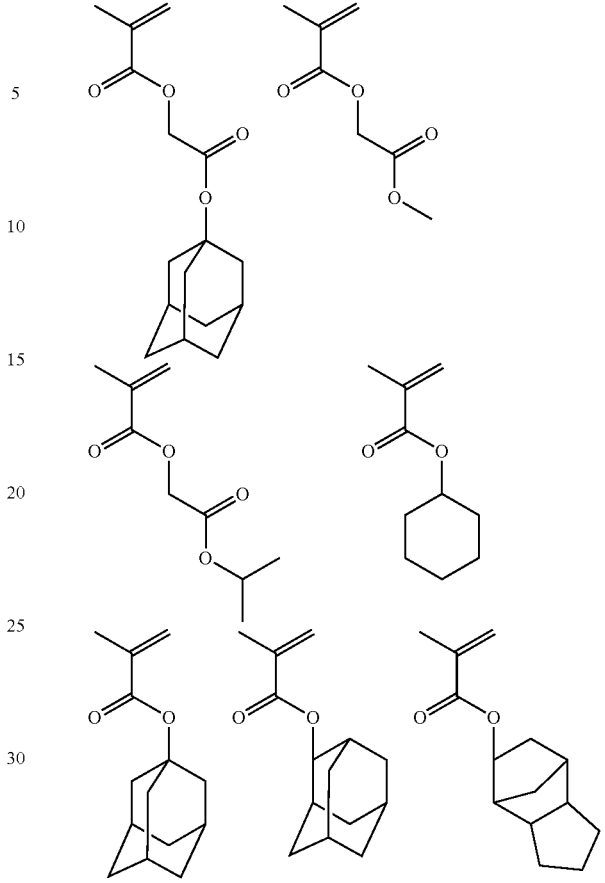

The resin (a) may have only one kind of repeating unit having neither an acid-decomposable group nor a polar group, or may have two or more kinds of such repeating units in combination.

The content of the repeating unit having neither an acid-decomposable group nor a polar group with respect to the total content of repeating units in the resin (A) is preferably 5 to 40 mol %, more preferably 5 to 30 mol %, and even more preferably 5 to 25 mol %.

For the purpose of controlling dry etching resistance, suitability for a standard developer, substrate adhesiveness, resist profile, resolution, heat resistance, sensitivity, and the like, the resin (A) may have various repeating structural units in addition to the repeating structural units described above.

(Characteristics of Resin (A))

It is preferable that all the repeating units contained in the resin (A) be composed of repeating units derived from (meth)acrylate-based monomers. In this case, it is possible to use any of a resin in which all repeating units are derived from methacrylate-based monomers, a resin in which all repeating units are derived from acrylate-based monomers, and a resin in which all repeating units are derived from methacrylate-based monomers and acrylate-based monomers. The content of the repeating unit derived from an acrylate-based monomer is preferably 50 mol % or less with respect to the total content of repeating units in the resin (A).

In a case where the composition is for argon fluoride (ArF) exposure, from the viewpoint of transmittance of ArF light, it is preferable that the resin (A) substantially have no aromatic group. More specifically, the content of the repeating unit having an aromatic group with respect to the total content of repeating units in the resin (A) is preferably 5 mol % or less, and more preferably 3 mol % or less. Ideally, the content of such a repeating unit is 0 mol %. In other words, it is even more preferable that the resin (A) do not have a repeating unit having an aromatic group.

Furthermore, in a case where the composition is for ArF exposure, it is preferable that the resin (A) have a monocyclic or polycyclic alicyclic hydrocarbon structure and contain neither a fluorine atom nor a silicon atom.

In a case where the composition is for krypton fluoride (KrF) exposure, EB exposure, or EUV exposure, the resin (A) preferably has a repeating unit having an aromatic hydrocarbon group, and more preferably has a repeating unit having a phenolic hydroxyl group.

Examples of the repeating unit having a phenolic hydroxyl group include the repeating unit (A-1) derived from hydroxystyrene and a repeating unit derived from hydroxystyrene (meth)acrylate.

Furthermore, in a case where the composition is for KrF exposure, EB exposure, or EUV exposure, the resin (A) also preferably has a repeating unit having a structure in which hydrogen atoms of a phenolic hydroxyl group are protected with a group (leaving group) decomposed and dissociated by the action of an acid.

In a case where the composition is for KrF exposure, EB exposure, or EUV exposure, the content of the repeating unit having an aromatic hydrocarbon group contained in the resin (A) with respect to the total content of repeating units in the resin (A) is preferably 30 to 100 mol %, more preferably 40 to 100 mol %, and even more preferably 50 to 100 mol %.

The resin (A) can be synthesized according to a conventional method (for example, radical polymerization).

The weight-average molecular weight (Mw) of the resin (A) is preferably 1,000 to 200,000, more preferably 3,000 to 20,000, and even more preferably 5,000 to 15,000. In a case where the weight-average molecular weight (Mw) of the resin (A) is 1,000 to 200,000, it is possible to prevent the deterioration of heat resistance and dry etching resistance, prevent the deterioration of developability, and prevent film-forming properties from deteriorating due to the increase in viscosity. The weight-average molecular weight (Mw) of the resin (A) is a value measured by the aforementioned GPC method and expression in terms of polystyrene.

The dispersity (molecular weight distribution) of the resin (A) is generally 1 to 5, preferably 1 to 3, and more preferably 1.1 to 2.0. The smaller the dispersity, the better the resolution and resist shape, the smoother the side wall of the pattern, and the better the roughness.

In the composition, the content of the resin (A) with respect to the total solid content of the composition is preferably 50% to 99.9% by mass, and more preferably 60% to 99.0% by mass.

One kind of resin (A) may be used alone, or two or more kinds of resins (A) may be used in combination.

(Photoacid Generator (P))

The actinic ray-sensitive or radiation-sensitive resin composition contains a photoacid generator (P). The photoacid generator (P) is not particularly limited as long as it is a compound that generates an acid by irradiation with radiation.

The photoacid generator (P) may be in the form of a low-molecular-weight compound, or may be in the form of a compound incorporated into a part of a polymer. Furthermore, the photoacid generator (P) in the form of a low-molecular-weight compound and the photoacid generator (P) in the form of a compound incorporated into a part of a polymer may be used in combination.

In a case where the photoacid generator (P) is in the form of a low-molecular-weight compound, the weight-average molecular weight (Mw) thereof is preferably 3,000 or less, more preferably 2,000 or less, and even more preferably 1,000 or less.

In a case where the photoacid generator (P) is in the form of a compound incorporated into a part of a polymer, this compound may be incorporated into a part of the resin (A) or into a resin different from the resin (A).

In the present invention, the photoacid generator (P) is preferably in the form of a low-molecular-weight compound.

The photoacid generator (P) is not particularly limited as long as it is known. As the photoacid generator (P), a compound that generates an organic acid by irradiation with radiation is preferable, and a photoacid generator having a fluorine atom or an iodine atom in a molecule is more preferable.

Examples of the organic acid include sulfonic acid (such as aliphatic sulfonic acid, aromatic sulfonic acid, or camphorsulfonic acid), carboxylic acid (such as aliphatic carboxylic acid, aromatic carboxylic acid, or aralkylcarboxylic acid), carbonyl sulfonylimidate, bis(alkylsulfonyl)imidate, tris(alkylsulfonyl)methidate, and the like.

The volume of the acid generated by the photoacid generator (P) is not particularly limited. However, from the viewpoint of improving resolution by inhibiting the acid generated by exposure from diffusing to unexposed portions, the volume of the acid is preferably 240 $Å^3$ or more, more preferably 305 $Å^3$ or more, even more preferably 350 $Å^3$ or more, and particularly preferably 400 $Å^3$ or more. From the viewpoint of sensitivity or solubility in a coating solvent, the volume of the acid generated by the photoacid generator (P) is preferably 1,500 $Å^3$ or less, more preferably 1,000 $Å^3$ or less, and even more preferably 700 $Å^3$ or less.

The above values of volume are determined using "Win-MOPAC" manufactured by Fujitsu Limited. To calculate the above values of volume, first, the chemical structure of the acid relating to each case is input, and then a molecular force field is calculated using the Molecular Mechanics (MM) 3 method with the aforementioned structure as the initial structure so as to determine the most stable conformation of each acid. Thereafter, for the most stable conformation, a molecular orbital is calculated using the Parameterized Model number (PM) 3 method, which makes it possible to calculate "accessible volume" of each acid.

The structure of the acid generated by the photoacid generator (P) is not particularly limited. In view of improving resolution by inhibiting the diffusion of the acid, it is preferable that the acid generated by the photoacid generator (P) and the resin (A) have a strong interaction. Therefore, in a case where the acid generated by the photoacid generator (P) is an organic acid, for example, it is preferable that the acid have a polar group in addition to an organic acid group such as a sulfonic acid group, a carboxylic acid group, a carbonylsulfonylimidate group, a bissulfonylimidate group, or a trissulfonylmethidate group.

Examples of the polar group include an ether group, an ester group, an amide group, an acyl group, a sulfo group, a sulfonyloxy group, a sulfonamide group, a thioether group, a thioester group, a urea group, a carbonate group, a carbamate group, a hydroxyl group, and a mercapto group.

The number of polar groups contained in the generated acid is not particularly limited, but is preferably 1 or more and more preferably 2 or more. Here, from the viewpoint of inhibiting excessive development, the number of polar groups is preferably less than 6, and more preferably less than 4.
As the photoacid generator (P), for example, the following compounds are preferable. For each compound, the calculated volume of an acid generated from each compound by exposure is also listed (unit: Å$^3$).
-continued
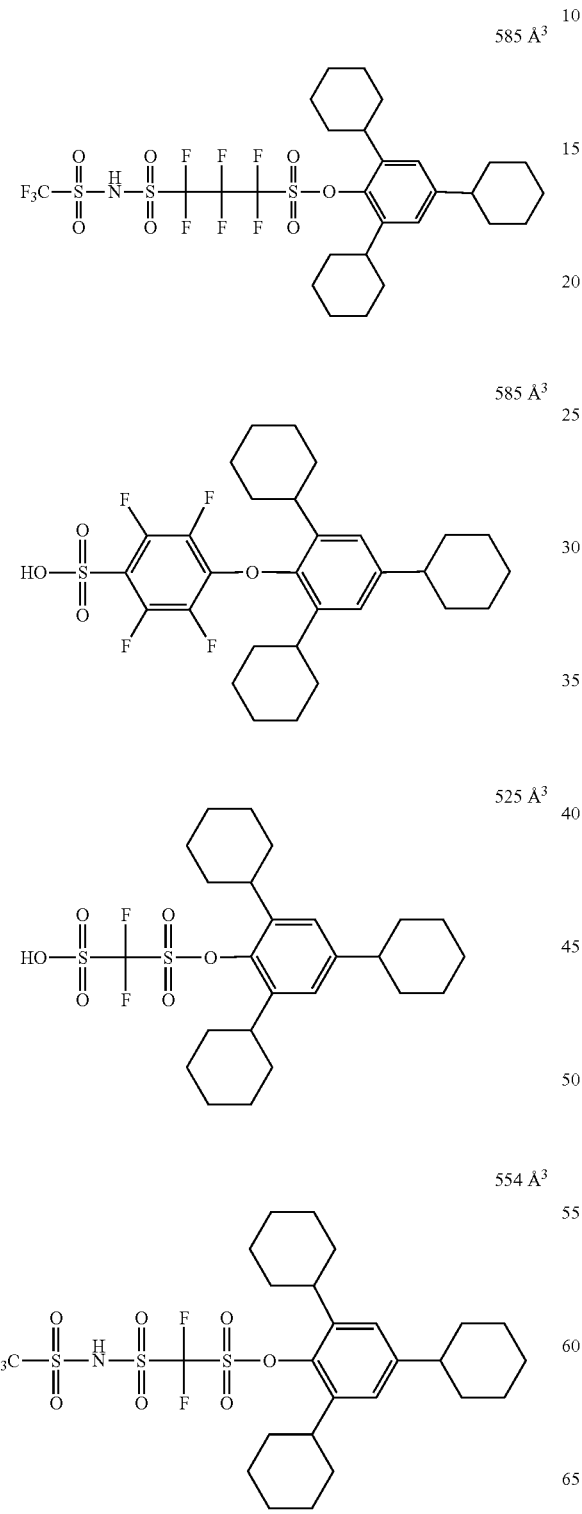
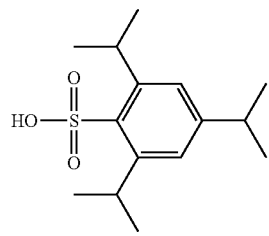
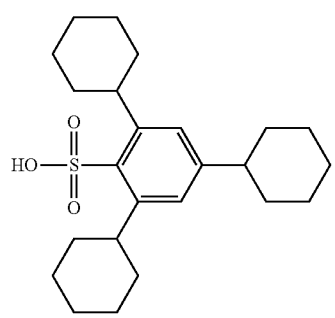
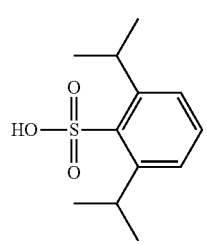
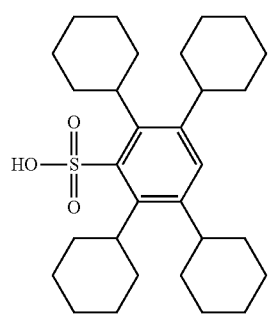
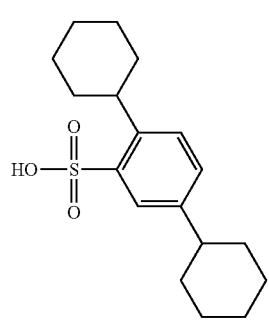
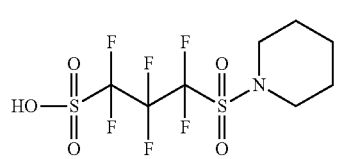

65
-continued
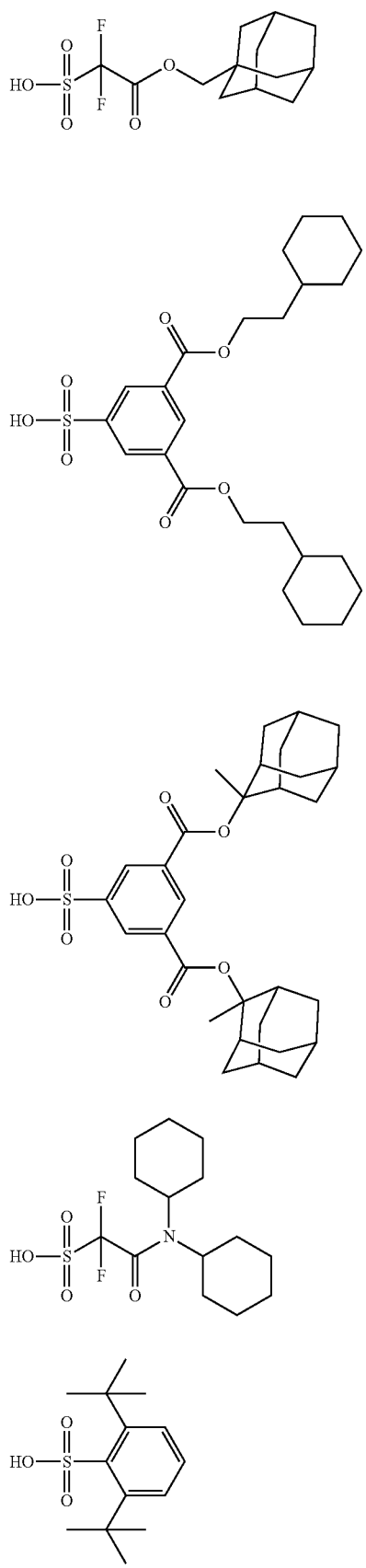
271 Å³
457 Å³
511 Å³
311 Å³
280 Å³
66
-continued
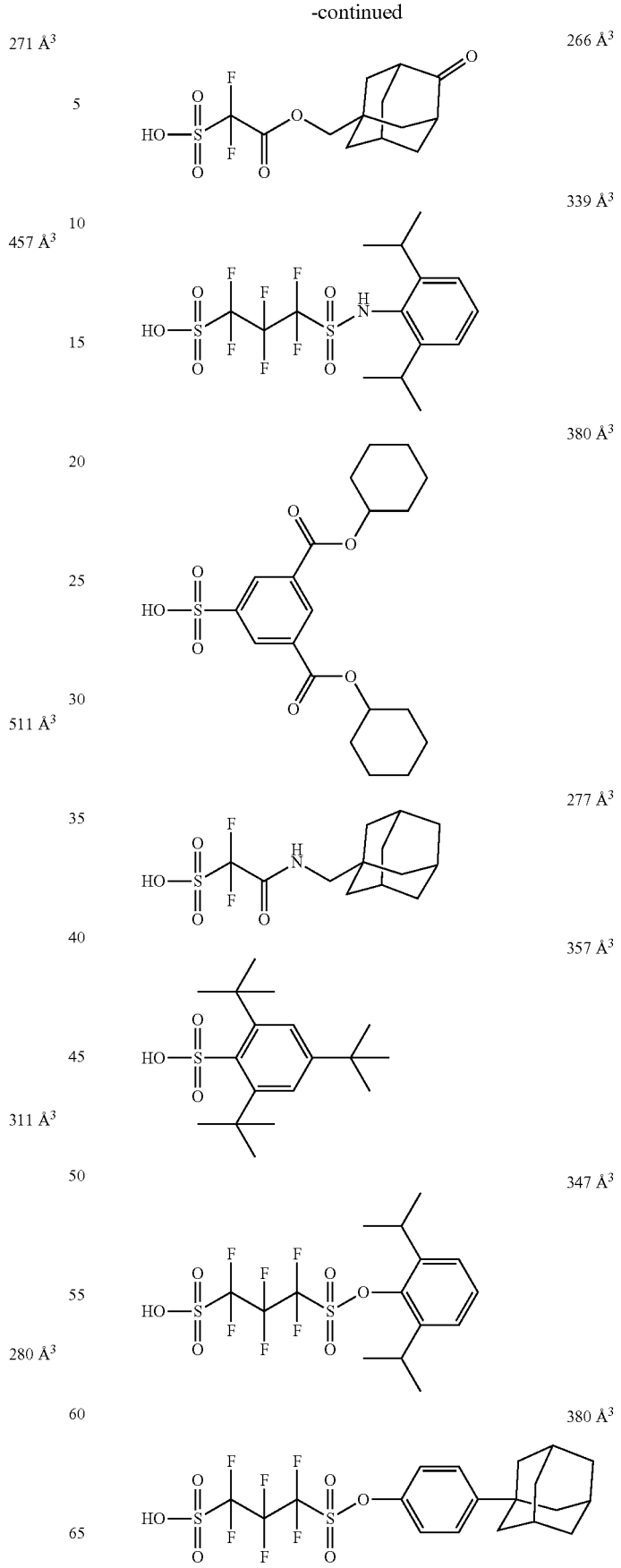
266 Å³
339 Å³
380 Å³
277 Å³
357 Å³
347 Å³
380 Å³

-continued
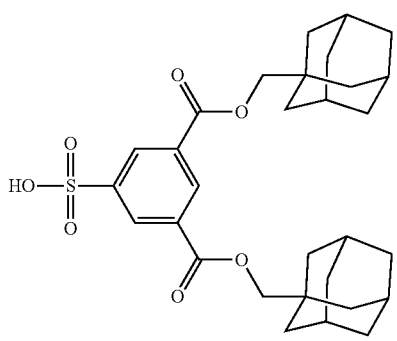
519 Å³
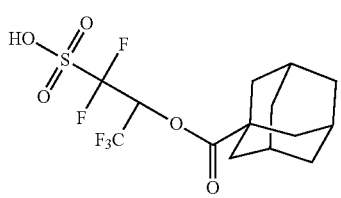
291 Å³
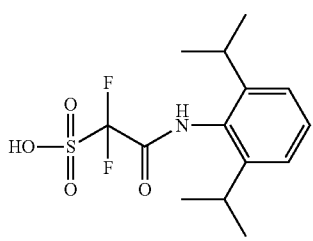
297 Å³
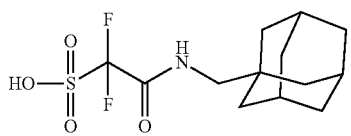
277 Å³
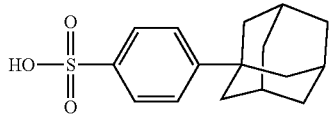
281 Å³
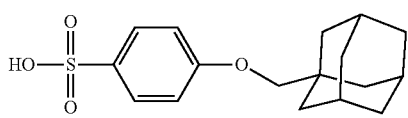
310 Å³
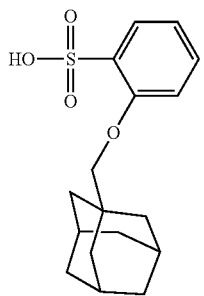
309 Å³
-continued
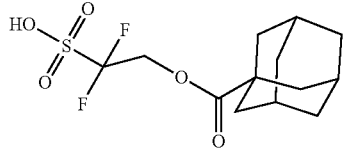
270 Å³
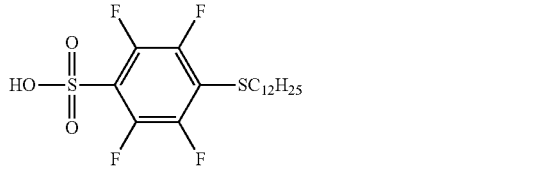
393 Å³
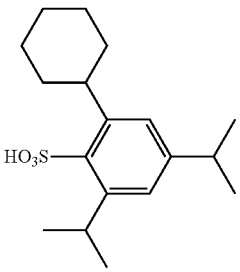
350 Å³
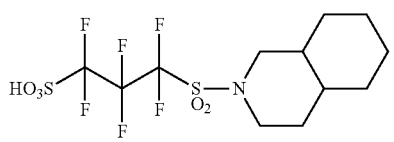
311 Å³
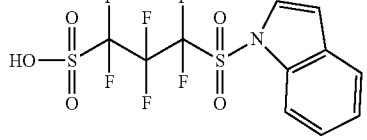
250 Å³
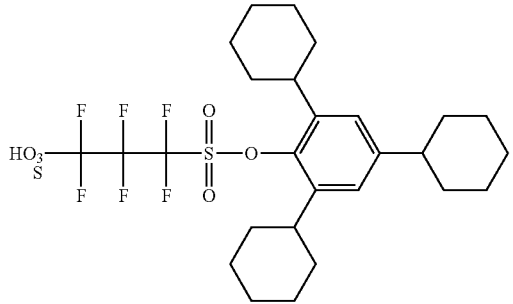
535 Å³
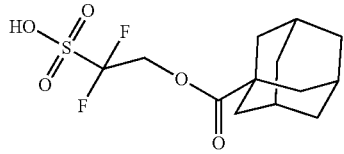
290 Å³
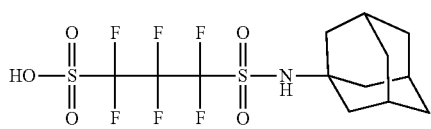
315 Å³

Particularly, the photoacid generator (P) is preferably a photoacid generator composed of an anionic moiety and a cationic moiety.

As the photoacid generator (P), a compound represented by General Formula (ZI) or a compound represented by General Formula (ZII) is preferable.

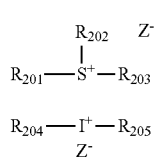

In General Formula (ZI), $R_{201}$, $R_{202}$, and $R_{203}$ each independently represent an organic group.

The number of carbon atoms in the organic group as $R_{201}$, $R_{202}$, and $R_{203}$ is preferably 1 to 30, and more preferably 1 to 20.

Two out of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two out of $R_{201}$ to $R_{203}$ include an alkylene group (for example, a butylene group, a pentylene group, or the like).

$Z^-$ represents a non-nucleophilic anion (anion with a significantly low ability to induce a nucleophilic reaction).

Examples of the non-nucleophilic anion include a sulfonate anion (such as an aliphatic sulfonate anion, an aromatic sulfonate anion, or a camphorsulfonate anion), a carboxylate anion (such as an aliphatic carboxylate anion, an aromatic carboxylate anion, or an aralkylcarboxylate anion), a sulfonylimide anion, a bis(alkylsulfonyl)imide anion, a tris(alkylsulfonyl)methide anion, and the like.

The aliphatic moiety in the aliphatic sulfonate anion and the aliphatic carboxylate anion may be an alkyl group or a cycloalkyl group. As the aliphatic moiety, a linear or branched alkyl group having 1 to 30 carbon atoms and a cycloalkyl group having 3 to 30 carbon atoms are preferable.

The aromatic ring group in the aromatic sulfonate anion and the aromatic carboxylate anion is preferably an aryl group having 6 to 14 carbon atoms. Examples thereof include a phenyl group, a tolyl group, and a naphthyl group.

Specific examples of the substituents that the alkyl group, cycloalkyl group, and aryl group described above can have include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms).

The aralkyl group in the aralkylcarboxylate anion is preferably an aralkyl group having 7 to 12 carbon atoms. Examples thereof include a benzyl group, a phenethyl group, a naphthylmethyl group, a naphthylethyl group, and a naphthylbutyl group.

Examples of the sulfonylimide anion include a saccharin anion.

As the alkyl group in the bis(alkylsulfonyl)imide anion and the tris(alkylsulfonyl)methide anion, an alkyl group having 1 to 5 carbon atoms is preferable. Examples of substituents of these alkyl groups include a halogen atom, an alkyl group substituted with a halogen atom, an alkoxy group, an alkylthio group, an alkyloxysulfonyl group, an aryloxysulfonyl group, and a cycloalkylaryloxysulfonyl group. Among these, a fluorine atom or an alkyl group substituted with a fluorine atom is preferable.

The alkyl groups in the bis(alkylsulfonyl)imide anion may be bonded to each other to form a ring structure. The formation of a ring structure increases acid strength.

Examples of other non-nucleophilic anions include fluorinated phosphorus (for example, $PF_6^-$), fluorinated boron (for example, $BF_4^-$), and fluorinated antimony (for example, $SbF_6^-$).

As the non-nucleophilic anion, an aliphatic sulfonate anion in which at least the α-position of sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, or a tris(alkylsulfonyl)methide anion in which the alkyl group is substituted with a fluorine atom is preferable. Among these, a perfluoroaliphatic sulfonate anion (preferably having 4 to 8 carbon atoms) or benzenesulfonate anion having a fluorine atom is more preferable, and a nonafluorobutanesulfonate anion, a perfluorooctanesulfonate anion, a pentafluorobenzenesulfonate anion, or a 3,5-bis(trifluoromethyl)benzenesulfonate anion is even more preferable.

From the viewpoint of acid strength, it is preferable that pKa of the generated acid be −1 or less because then sensitivity is improved.

Furthermore, as the non-nucleophilic anion, an anion represented by General Formula (AN1) is also preferable.

In the formula,

Xf each independently represents a fluorine atom or an alkyl group substituted with at least one fluorine atom.

$R^1$ and $R^2$ each independently represent a hydrogen atom, a fluorine atom, or an alkyl group. In a case where there is a plurality of $R^1$'s and $R^2$'s, $R^1$'s may be the same or different from each other, and $R^2$'s may be the same or different from each other.

L represents a divalent linking group. In a case where there is a plurality of Ls in the formula, Ls may be the same or different from each other.

A represents a cyclic organic group.

x represents an integer of 1 to 20, y represents an integer of 0 to 10, and z represents an integer of 0 to 10.

General Formula (AN1) will be more specifically described.

The number of carbon atoms of the alkyl group in the alkyl group substituted with a fluorine atom represented by Xf is preferably 1 to 10, and more preferably 1 to 4. As the alkyl group substituted with a fluorine atom represented by Xf, a perfluoroalkyl group is preferable.

As Xf, a fluorine atom or a perfluoroalkyl group having 1 to 4 carbon atoms is preferable. Specific examples of Xf include fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, $CH_2CH_2C_4F_9$, and the like. Among these, a fluorine atom or $CF_3$ is preferable. It is particularly preferable that Xf's both represent a fluorine atom.

The alkyl group represented by $R^1$ and $R^2$ may have a substituent (preferably a fluorine atom), and the number of carbon atoms in the substituent is preferably 1 to 4. As the substituent, a perfluoroalkyl group having 1 to 4 carbon atoms is preferable. Specific examples of alkyl group having a substituent represented by $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, $CH_2CH_2C_4F_9$, and the like. Among these, $CF_3$ is preferable.

As $R^1$ and $R^2$, a fluorine atom or $CF_3$ is preferable.

x is preferably an integer of 1 to 10, and more preferably 1 to 5.

y is preferably an integer of 0 to 4, and more preferably 0.

z is preferably an integer of 2 to 5, and more preferably an integer of 0 to 3.

The divalent linking group represented by L is not particularly limited. Examples thereof include —COO—, —CO—, —O—, —S—, —SO—, —SO$_2$—, an alkylene group, a cycloalkylene group, an alkenylene group, a linking group consisting of a plurality of these groups linked to each other, and the like. The total number of carbon atoms in these linking groups is preferably 12 or less. Among these, —COO—, —OCO—, —CO—, or —O— is preferable, and —COO— or —OCO— is more preferable.

The cyclic organic group represented by A is not particularly limited as long as it has a cyclic structure. Examples thereof include an alicyclic group, an aromatic ring group, a heterocyclic group (not only an aromatic heterocyclic group but also an non-aromatic heterocyclic group), and the like.

The alicyclic group may be monocyclic or polycyclic, and is preferably a monocyclic cycloalkyl group such as a cyclopentyl group, a cyclohexyl group, or a cyclooctyl group and a polycyclic cycloalkyl group such as a norbornyl group, a tricyclodecanyl group, a tetracyclodecanyl group, a tetracyclododecanyl group, or an adamantyl group. Among these, alicyclic groups having a bulky structure having 7 or more carbon atoms, such as a norbornyl group, a tricyclodecanyl group, a tetracyclodecanyl group, a tetracyclododecanyl group, and an adamantyl group, are preferable, because these can inhibit diffusion in a film during the post-exposure heating step and improve Mask Error Enhancement Factor (MEEF).

Examples of the aromatic ring group include a benzene ring, a naphthalene ring, a phenanthrene ring, an anthracene ring, and the like.

Examples of the heterocyclic group include groups derived from a furan ring, a thiophene ring, a benzofuran ring, a benzothiophene ring, a dibenzofuran ring, a dibenzothiophene ring, a pyridine ring, and the like. Among these, groups derived from a furan ring, a thiophene ring, and a pyridine ring are preferable.

Examples of the cyclic organic group also include a group having a lactone structure. Specific examples thereof include groups having lactone structures represented by any of General Formulas (LC1-1) to (LC1-17) described above.

The cyclic organic group may have a substituent. Examples of the substituent include an alkyl group (which may be a linear, branched, or cyclic alkyl group preferably having 1 to 12 carbon atoms), a cycloalkyl group (which may be monocyclic or polycyclic, the polycyclic cycloalkyl group may be a spiro ring, the cycloalkyl group preferably has 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, a sulfonate group, and the like. The carbon constituting the cyclic organic group (carbon that contributes to ring formation) may be carbonyl carbon.

Examples of the organic group represented by $R_{201}$, $R_{202}$, and $R_{203}$ include an aryl group, an alkyl group, a cycloalkyl group, and the like.

It is preferable that at least one out of $R_{201}$, $R_{202}$, or $R_{203}$ be an aryl group. It is more preferable that all three of these be aryl groups. As the aryl group, in addition to a phenyl group, a naphthyl group, and the like, a heteroaryl group such as an indole residue and a pyrrole residue can also be adopted.

As the alkyl group represented by $R_{201}$ to $R_{203}$, a linear or branched alkyl group having 1 to 10 carbon atoms is preferable, and a methyl group, an ethyl group, a n-propyl group, an i-propyl group, or a n-butyl group is more preferable.

As the cycloalkyl group represented by $R_{201}$ to $R_{203}$, a cycloalkyl group having 3 to 10 carbon atoms is preferable, and a cyclopropyl group, a cyclobutyl group, a cyclopentyl group, a cyclohexyl group, or a cycloheptyl group is more preferable.

Examples of substituents that these groups may have include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), and the like.

In General Formula (ZII), $R_{204}$ and $R_{205}$ each independently represent an aryl group, an alkyl group, or a cycloalkyl group.

The aryl group, alkyl group, and cycloalkyl group represented by $R_{204}$ and $R_{205}$ have the same definitions as the groups described above as the aryl group, alkyl group, and cycloalkyl group represented by $R_{201}$ to $R_{203}$ in General Formula (ZI).

Examples of substituents that the aryl group, alkyl group, and cycloalkyl group represented by $R_{204}$ and $R_{205}$ may have include the substituents that the aryl group, alkyl group, and cycloalkyl group represented by $R_{201}$ to $R_{203}$ in the aforementioned compound (ZI) may have.

$Z^-$ represents a non-nucleophilic anion, and examples thereof are the same as the examples of the non-nucleophilic anion represented by $Z^-$ in General Formula (ZI).

As the sulfonium cation in General Formula (ZI) and the iodonium cation in General Formula (ZII), for example, the following ones are preferable.
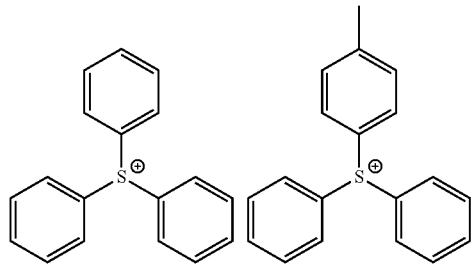
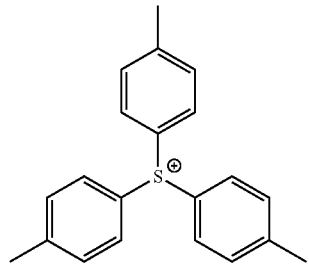
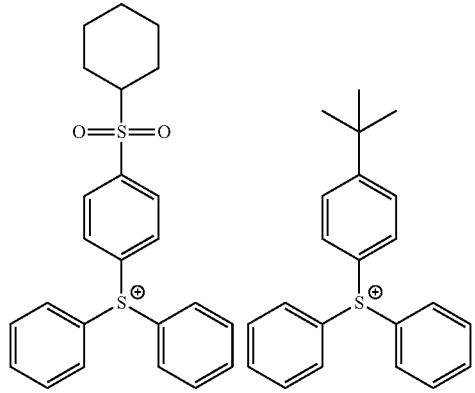
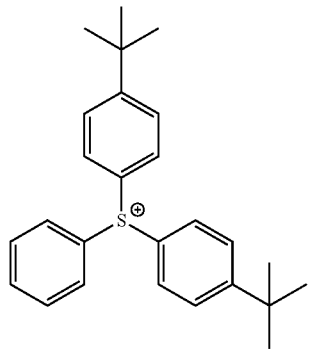
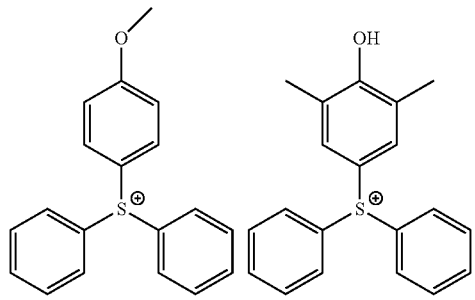
-continued
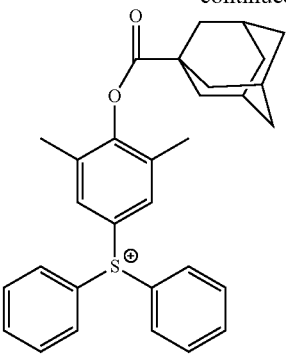
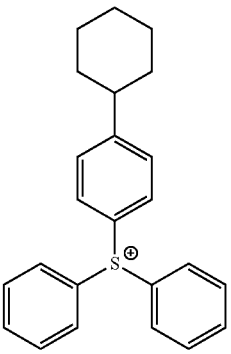
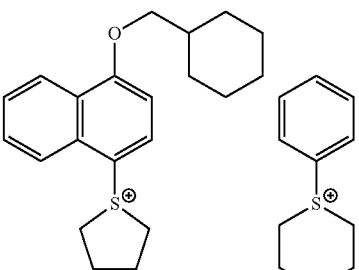
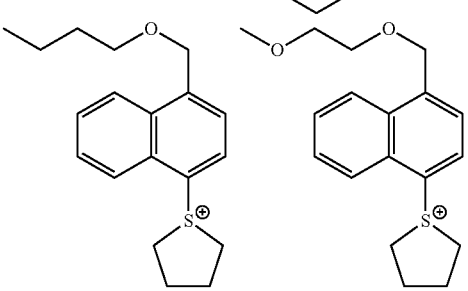
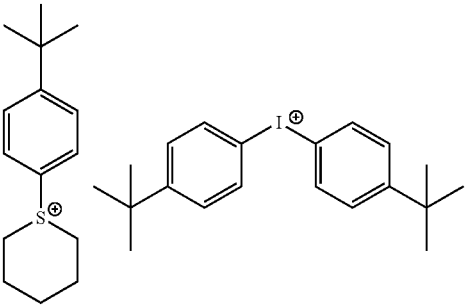

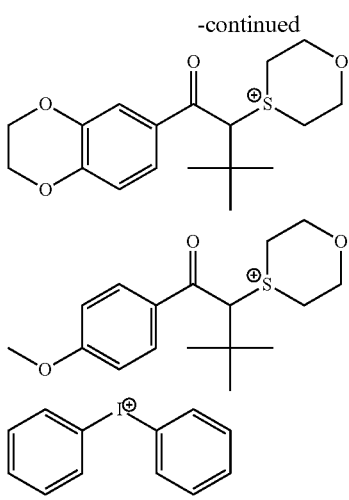

As the photoacid generator (P), for example, the following compounds represented by General Formulas (B-I) to (B-V) are preferable.

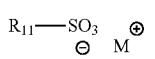
(B-I)

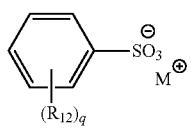
(B-II)

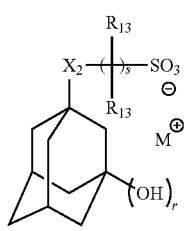
(B-III)

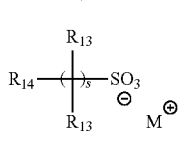
(B-IV)

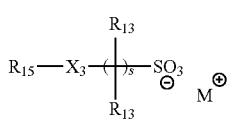
(B-V)

In General Formulas (B-I) to (B-V), $M^+$ represents a sulfonium cation or an iodonium cation. As $M^+$ in General Formulas (B-I) to (B-V), the sulfonium cation in General Formula (ZI) or the iodonium cation in General Formula (ZII) including the preferred embodiments thereof are preferable.

In General Formula (B-I), $R_{11}$ represents an alkyl group having 1 to 8 carbon atoms which may be substituted with a fluorine atom. As $R_{11}$, an alkyl group having 1 to 8 carbon atoms substituted with at least one fluorine atom is preferable, a perfluoroalkyl group having 1 to 8 carbon atoms is more preferable, and a perfluoroalkyl group having 2 to 4 carbon atoms is even more preferable.

In General Formula (B-II), $R_{12}$ represents a hydrogen atom, an alkyl group having 1 to 6 carbon atoms, or —$CF_3$. $R_{12}$ is preferably an alkyl group having 3 to 6 carbon atoms, and more preferably a linear or branched alkyl group having 3 to 6 carbon atoms or a cyclohexyl group. Furthermore, $R_{12}$ is preferably at the ortho-position or the para-position with respect to the (—$SO_3$—) group.

In General Formula (B-II), q represents an integer of 1 to 5. q is preferably an integer of 2 to 4, and more preferably 2 or 3.

In General Formula (B-III), $R_{13}$ represents a hydrogen atom, a fluorine atom, or $CF_3$. It is preferable that at least one $R_{13}$ represent a fluorine atom or $CF_3$.

In General Formula (B-III), $X_2$ represents —CO—O—, —$CH_2$—CO—O—, or —$CH_2$—O—CO—.

In General Formula (B-III), r represents an integer of 0 to 2. r is preferably 0 or 1.

In General Formula (B-III), s represents an integer of 1 to 3. s is preferably 1 or 2.

In General Formula (B-IV), $R_{13}$ represents a hydrogen atom, a fluorine atom, or $CF_3$. It is preferable that at least one $R_{13}$ in General Formula (B-IV) represent a fluorine atom or $CF_3$. It is more preferable that two or more $R_{13}$'s represent a fluorine atom or $CF_3$.

In General Formula (B-IV), $R_{14}$ represents a monovalent polycyclic group which may have a substituent. The monovalent polycyclic group is not particularly limited as long as it is a group consisting of a plurality of ring structures. Examples thereof include polycyclic organic groups among the cyclic organic groups represented by A in General Formula (AN1). More specifically, examples of $R_{14}$ include polycyclic cycloalkyl groups such as a norbornane ring group, a tetracyclodecane ring group, a tetracyclododecane ring group, and an adamantane ring group. Among these, a norbornane ring group or an adamantane ring group is preferable.

In General Formula (B-V), $R_{13}$ represents a hydrogen atom, a fluorine atom, or $CF_3$. It is preferable that at least one $R_{13}$ in General Formula (B-V) represent a fluorine atom or $CF_3$. It is more preferable that two or more $R_{13}$'s represent a fluorine atom or $CF_3$.

In General Formula (B-V), $R_{15}$ represents a monovalent organic group. Examples of the monovalent organic group represented by $R_{15}$ include an alkyl group, a cycloalkyl group, an aryl group, an aralkyl group, and an alkenyl group. Among these, an alkyl group having 1 to 6 carbon atoms is preferable.

In General Formula (B-V), $X_3$ represents —O—CO—O—, —$SO_2$—, or —$SO_2$—$NR_{16}$—. $R_{16}$ represents a hydrogen atom or an alkyl group, or represents an alkylene group that is bonded to $R_{15}$ to form a ring structure.

General Formula (B-V) preferably represents a compound in which $X_3$ represents —$SO_2$—$NR_{16}$—, and an alkylene group having 4 to 6 carbon atoms formed by bonding of $R_{15}$ and $R_{16}$ and nitrogen atoms in the —$NR_{16}$— group form a heteroring which may have a substituent.

The composition preferably contains, as the photoacid generator (P), at least one kind of compound selected from the group consisting of the compounds represented by General Formulas (B-I) to (B-V).

Examples of the photoacid generator (P) include those described in paragraphs "0368" to "0377" of JP2014-41328A and paragraphs "0240" to "0262" of JP2013-228681A (paragraph "0339" of US2015/004533A as the corresponding specification). What are described in these documents are incorporated into the present specification.

Specifically, for example, the following compounds are also preferable, but the present invention is not limited thereto.
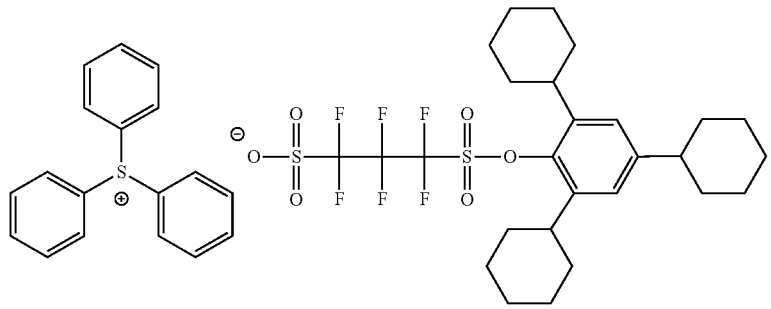
(z1)
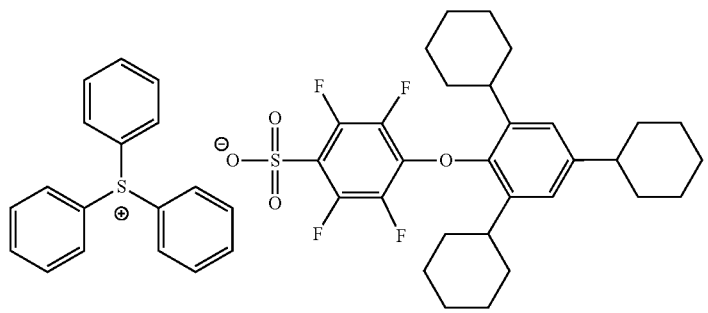
(z2)
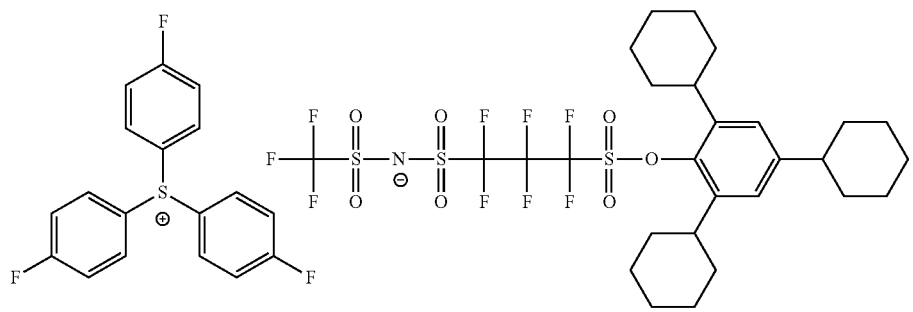
(z3)
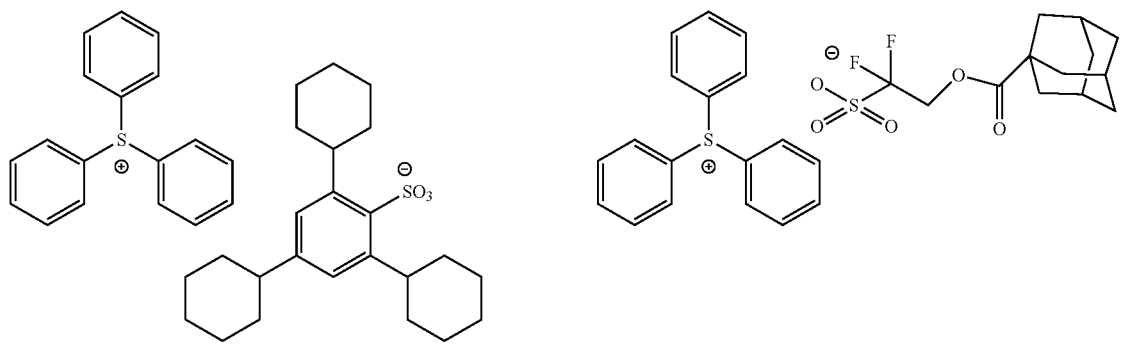
(z4) (z5)
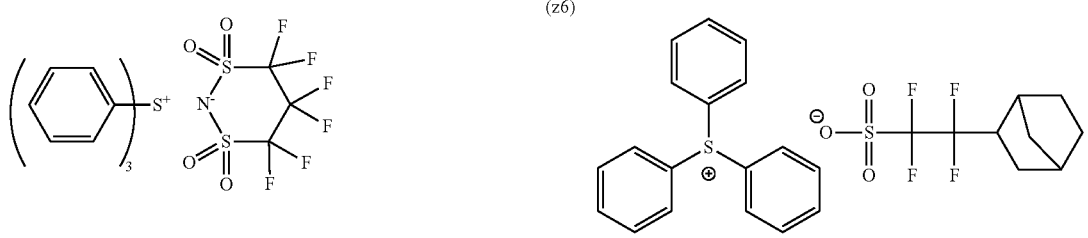
(z6) (z7)

-continued
(z8)
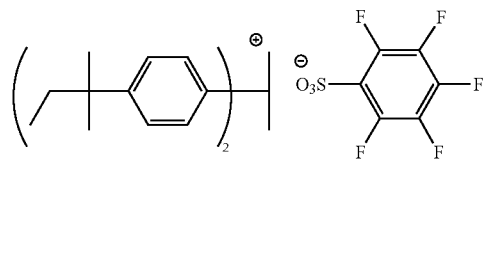
(z9)
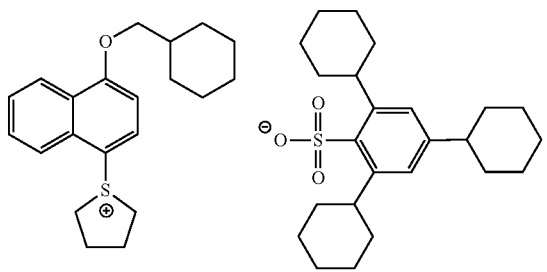
(z10)
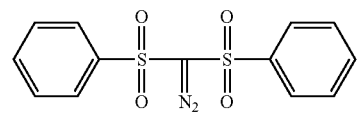
(z11)
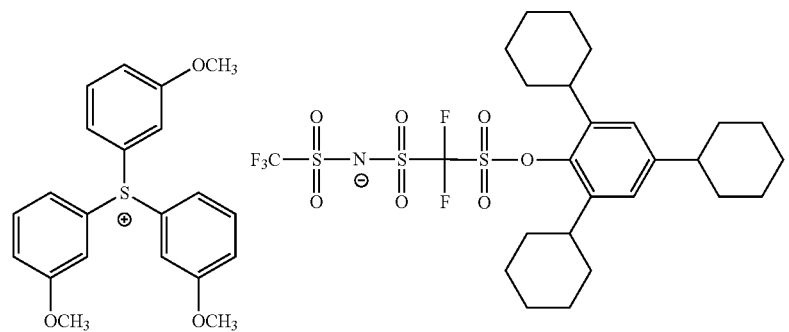
(z12)
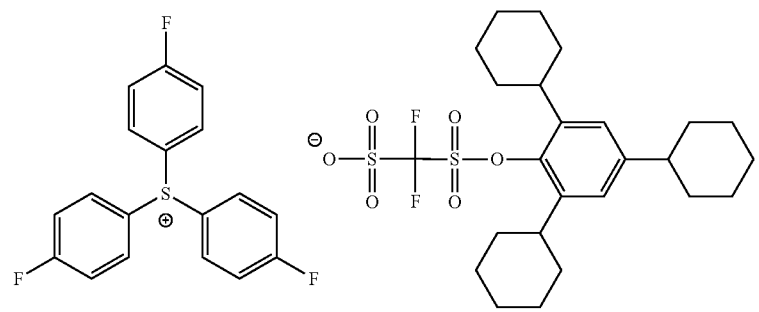
(z13)
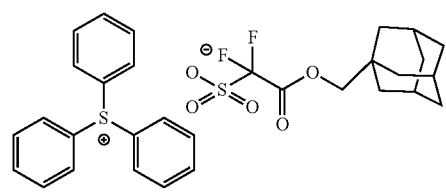
(z14)
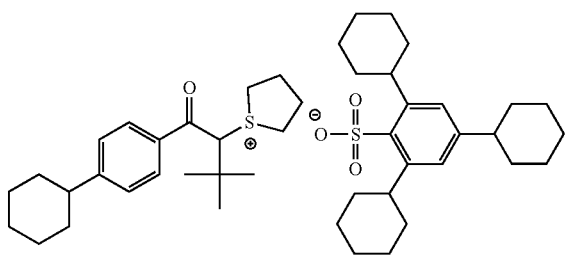

(z15)
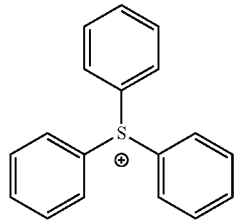
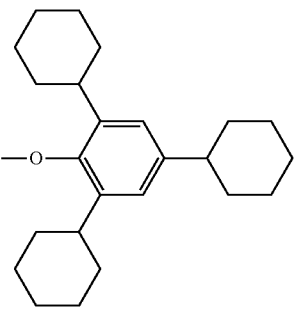
(z16)
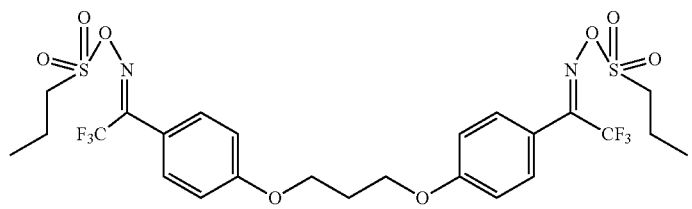
(z17)
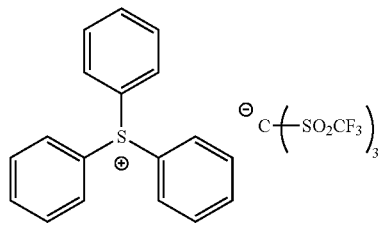
(z18)
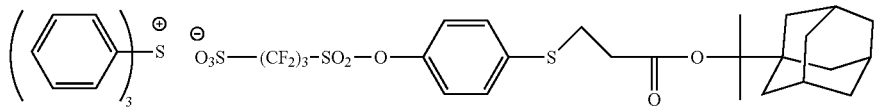
(z19)
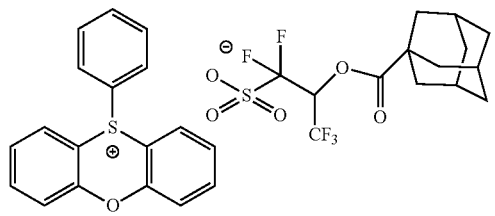
(z20)
(z21)
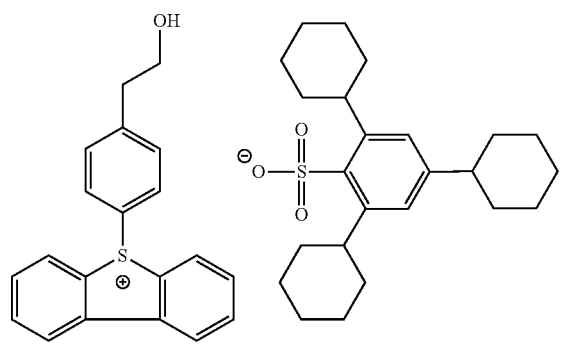
(z21)
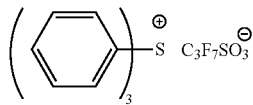
(z22)
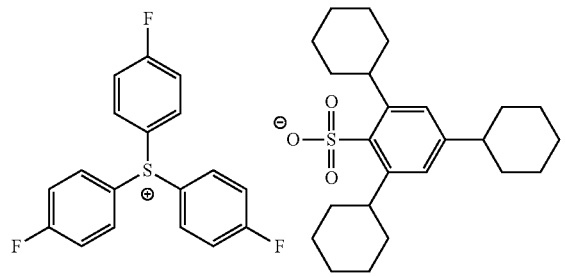

-continued
(z23)
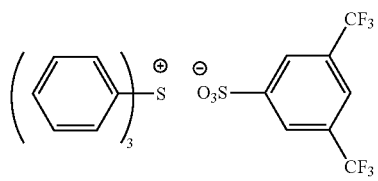
(z24)
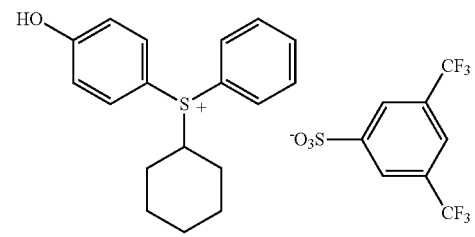
(z25)
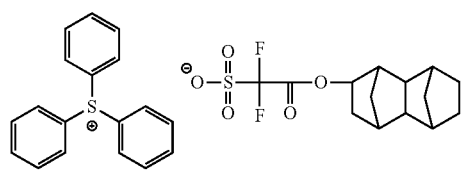
(z26)
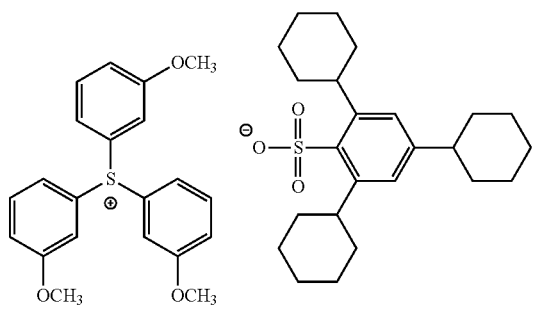
(z27)
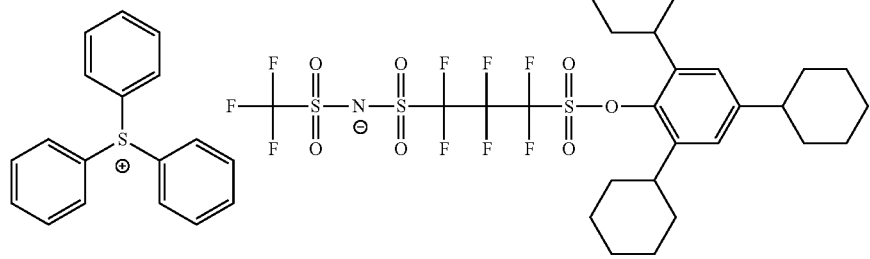
(z28)
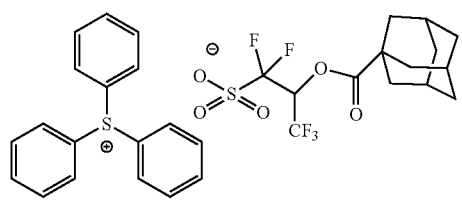
(z29)
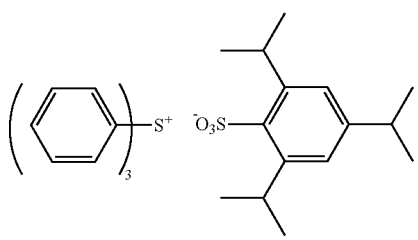
(z30)
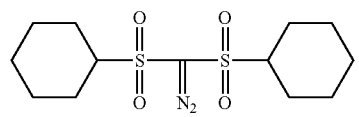
(z31)
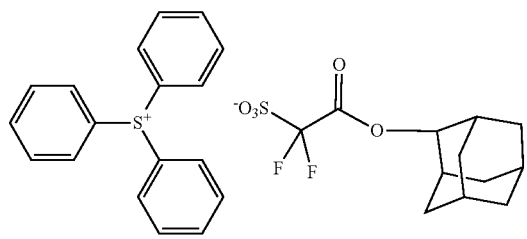
(z32)
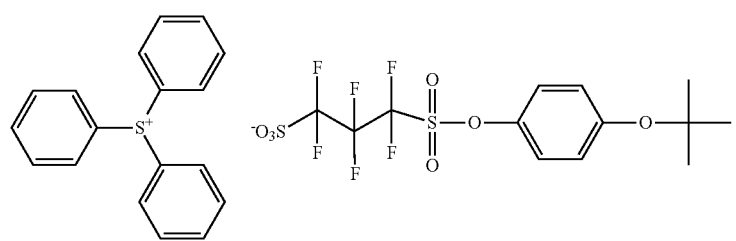

(z33)
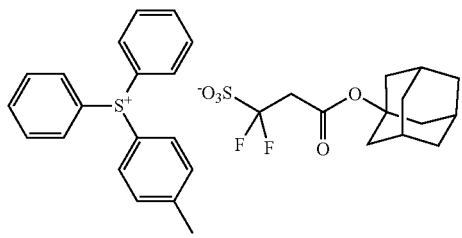

(z34)
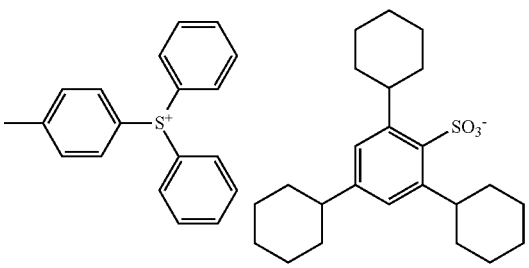

(z35)
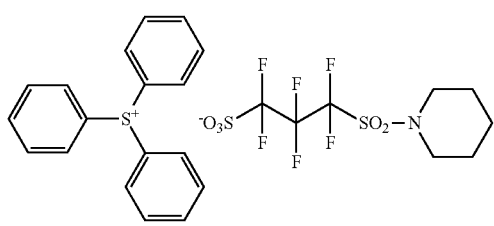

(z36)
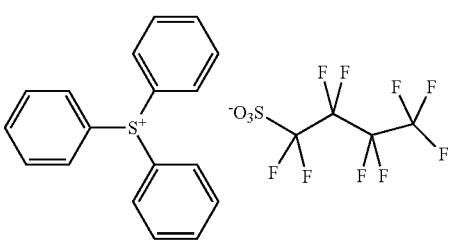

(z37)
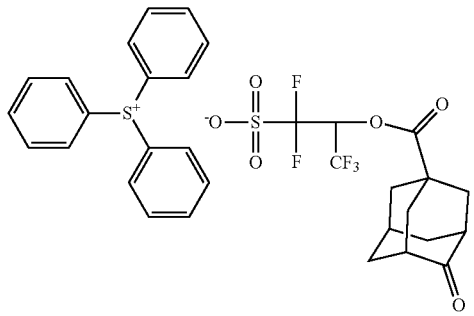

In the composition, the content of the photoacid generator (P) is not particularly limited. The content of the photoacid generator (P) with respect to the total solid content of the composition is preferably 5% to 50% by mass, more preferably 10% to 40% by mass, and even more preferably 10% to 35% by mass.

One kind of photoacid generator (P) may be used alone, or two or more kinds of photoacid generators (P) may be used in combination. In a case where two or more kinds of photoacid generators (P) are used in combination, the total amount thereof is preferably within the above range.

(Acid Diffusion Control Agent (Q))

The composition may contain an acid diffusion control agent (Q).

The acid diffusion control agent (Q) acts as a quencher that traps acids generated from the photoacid generator (P) during exposure so as to inhibit the acid-decomposable resin in the unexposed portion from having a reaction due to a surplus of acids generated. As the acid diffusion control agent (Q), for example, it is possible to use a basic compound (DA), a basic compound (DB) which undergoes the reduction or loss of basicity by irradiation with radiation, an onium salt (DC) which is converted into an acid relatively weaker than the photoacid generator (P), a low-molecular-weight compound (DD) which has a nitrogen atom and has a group dissociated by the action of an acid, an onium salt compound (DE) which has a nitrogen atom in a cationic moiety, and the like.

In the composition, known acid diffusion control agents can be appropriately used. As the acid diffusion control agent (Q), for example, known compounds disclosed in paragraphs "0627" to "0664" of US2016/0070167A, paragraphs "0095" to "0187" of US2015/0004544A, paragraphs "0403" to "0423" of US2016/0237190A, and paragraphs "0259" to "0328" of US2016/0274458A can be preferably used.

In a case where the composition contains the acid diffusion control agent (Q), the content of the acid diffusion control agent (Q) (total content in a case where the composition contains two or more kinds of acid diffusion control agents (Q)) with respect to the total solid content of the composition is preferably 0.1% to 10.0% by mass, and more preferably 0.1% to 5.0% by mass.

In the composition, one kind of acid diffusion control agent (Q) may be used alone, or two or more kinds of acid diffusion control agents (Q) may be used in combination.

(Hydrophobic Resin (E))

The composition may contain a hydrophobic resin different from the resin (A) as a hydrophobic resin (E).

It is preferable to design the hydrophobic resin (E) such that the resin is distributed only within the surface of a resist film. However, unlike a surfactant, the hydrophobic resin does not need to have a hydrophilic group in a molecule and may not make a contribution to the homogeneous mixing of a polar substance with a nonpolar substance.

The addition of the hydrophobic resin (E) brings about effects such as the control of static and dynamic contact angle formed between water and the resist film surface and the inhibition of outgas.

From the viewpoint of the distribution of the hydrophobic resin (E) only within the surface layer of a film, the hydrophobic resin (E) preferably has any one or more kinds of groups among "fluorine atom", "silicon atom", and "$CH_3$ partial structure included in a side chain portion of the resin", and more preferably has two or more kinds of groups among the above. Furthermore, it is preferable that the hydrophobic resin (E) have a hydrocarbon group having 5 or more carbon atoms. These groups may be positioned in the main chain of the resin or may substitute a side chain of the resin.

In a case where the hydrophobic resin (E) contains a fluorine atom and/or a silicon atom, the fluorine atom and/or the silicon atom in the hydrophobic resin may be contained in the main chain or the side chain of the resin.

In a case where the hydrophobic resin (E) has a fluorine atom, as a partial structure having the fluorine atom, a fluorine atom-containing alkyl group, a fluorine atom-containing cycloalkyl group, or a fluorine atom-containing aryl group is preferable.

The fluorine atom-containing alkyl group (preferably having 1 to 10 carbon atoms and more preferably having 1 to 4 carbon atoms) is a linear or branched alkyl group in which at least one hydrogen atom is substituted with a fluorine atom and which may further have a substituent other than a fluorine atom.

The fluorine atom-containing cycloalkyl group is a monocyclic or polycyclic cycloalkyl group in which at least one hydrogen atom is substituted with a fluorine atom and which may further have a substituent other than a fluorine atom.

Examples of the fluorine atom-containing aryl group include an aryl group in which at least one hydrogen atom is substituted with a fluorine atom, such as a phenyl group or a naphthyl group. The fluorine atom-containing aryl group may further have a substituent other than a fluorine atom.

Examples of the repeating unit having a fluorine atom or a silicon atom include the repeating units exemplified in paragraph "0519" in US2012/0251948A.

As described above, it is also preferable that the hydrophobic resin (E) have a $CH_3$ partial structure in a side chain portion.

Herein, the $CH_3$ partial structure that the side chain portion of the hydrophobic resin has includes a $CH_3$ partial structure having an ethyl group, a propyl group, or the like.

A methyl group directly bonded to the main chain of the hydrophobic resin (E) (for example, an α-methyl group of a repeating unit having a methacrylic acid structure) contributes little for the hydrophobic resin (E) to be distributed only within the surface due to the influence of the main chain. Accordingly, such a methyl group is not included in the $CH_3$ partial structure in the present invention.

In a case where the composition contains the hydrophobic resin (E), the content of the hydrophobic resin (E) with respect to the total solid content of the composition is preferably 0.01% to 20% by mass, and more preferably 0.1% to 15% by mass.

(Solvent (F))

The composition may contain a solvent (F).

In a case where the composition is a radiation-sensitive resin composition for EUV, the solvent (F) preferably contains at least one of (M1) propylene glycol monoalkyl ether carboxylate and (M2) at least one compound selected from the group consisting of propylene glycol monoalkyl ether, lactate, acetate, alkoxypropionate, linear ketone, cyclic ketone, lactone, or alkylene carbonate. In this case, the solvent may further contain components other than the components (M1) and (M2).

It is preferable to use the solvent containing the component (M1) or (M2) in combination with the resin (A) described above, because then the coating properties of the composition are improved, and a pattern with a small number of development defects can be formed.

As the component (M1), at least one compound selected from the group consisting of propylene glycol monomethylether acetate (PGMEA), propylene glycol monomethylether propionate, and propylene glycol monoethylether acetate is preferable, and propylene glycol monomethylether acetate (PGMEA) is more preferable.

As the components (M2), the following ones are preferable.

As the propylene glycol monoalkyl ether, propylene glycol monomethylether (PGME) or propylene glycol monoethylether is preferable.

As the lactate, ethyl lactate, butyl lactate, or propyl lactate is preferable.

As the acetate, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

Furthermore, butyl butyrate is also preferable.

As the alkoxypropionate, methyl 3-methoxypropionate (MMP) or ethyl 3-ethoxypropionate (EEP) is preferable.

As the linear ketone, 1-octanone, 2-octanone, 1-nonanonone, 2-nonanonone, acetone, 2-heptanone, 4-heptanone, 1-hexanone, 2-hexanone, diisobutyl ketone, phenylacetone, methyl ethyl ketone, methyl isobutyl ketone, acetylacetone, acetonylacetone, ionone, diacetonyl alcohol, acetyl carbinol, acetophenone, methyl naphthyl ketone, or methyl amyl ketone is preferable.

As the cyclic ketone, methylcyclohexanone, isophorone, or cyclohexanone is preferable.

As the lactone, γ-butyrolactone is preferable.

As the alkylene carbonate, propylene carbonate is preferable.

As the component (M2), propylene glycol monomethylether (PGME), ethyl lactate, ethyl 3-ethoxypropionate, methyl amyl ketone, cyclohexanone, butyl acetate, pentyl acetate, γ-butyrolactone, or propylene carbonate is more preferable.

As the solvent (F), a mixed solvent composed of two or more kinds of solvents containing propylene glycol monomethylether acetate is preferable.

The content of the solvent (F) in the composition is preferably set so that the concentration of solid contents is 0.5% to 30% by mass, and more preferably set so that the concentration of solid contents is 1% to 20% by mass. In a case where the content is set within this range, the coating properties of the composition are further improved.

(Other Additives)

The composition may further contain a surfactant, an alkali-soluble resin having a phenolic hydroxyl group, a dissolution inhibiting compound, a dye, a plasticizer, a photosensitizer, a light absorbing agent, and/or a compound that enhances solubility in a developer (for example, a phenolic compound having a weight-average molecular weight (Mw) of 1,000 or less or an alicyclic or aliphatic compound having a carboxyl group).

Those skilled in the related art can easily synthesize the phenolic compound having a weight-average molecular weight (Mw) of 1,000 or less with reference to, for example, the methods described in JP1992-122938A (JP-H04-

122938A), JP1990-28531A (JP-H02-28531A), U.S. Pat. No. 4,916,210A, EP219294A, and the like.

Specific examples of the alicyclic or aliphatic compound having a carboxyl group include carboxylic acid derivatives having a steroid structure such as cholic acid, deoxycholic acid, and lithocholic acid, adamantanecarboxylic acid derivatives, adamantanedicarboxylic acid, cyclohexanecarboxylic acid, and cyclohexanedicarboxylic acid.

EXAMPLES

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Accordingly, the scope of the present invention is not limited to the following examples.

For preparing chemical liquids of examples and comparative examples, the handling of containers, and the preparation, filling, storage, and analytical measurement of chemical liquids were all performed in a clean room of a level satisfying ISO class 2 or 1.

(Filter)

As filters, the following filters were used.

"PP 200 nm": Polypropylene filter, manufactured by Pall Corporation., pore size of 200 nm "IEX 50 nm": Ion exchange resin filter, manufactured by Entegris, pore size of 50 nm "PTFE 30 nm": Polytetrafluoroethylene filter, manufactured by Entegris, pore size of 30 nm "PTFE 50 nm": Polytetrafluoroethylene filter, manufactured by Entegris, pore size of 50 nm "UPE 1 nm": Ultra-high-molecular-weight polyethylene filter, manufactured by Pall Corporation., pore size of 1 nm "UPE 3 nm": Ultra-high-molecular-weight polyethylene filter, manufactured by Pall Corporation., pore size of 3 nm <Substance to be Purified>

To manufacture chemical liquids to be used in examples and comparative examples, each solvent described in the column of "Solvent type" in the column of "Raw material" in Table 1 was used as a substance to be purified. As each solvent, a commercially available product was used.

<Purification Procedure>

The substance to be purified was subjected to the purification treatment described in Table 1.

In the column of "Distillation" in the Table 1, "Condition 1" means that atmospheric distillation was performed once by using a distillation column (theoretical number of plates: 15).

Then, the distilled and purified substance to be purified was stored in a storage tank. The substance to be purified stored in the storage tank was filtered by being passed through the filters 1 to 3 described in Table 1 in this order, and stored in a storage tank.

Thereafter, as shown in Table 1 which will be described later, in the example for which "Performed" is listed in the column of "First circulation", a recirculation filtration treatment was performed in which the substance to be purified stored in the storage tank was filtered through the filters 4 and 5 (or filter 4 in a case where only the filter 4 was used) described in Table 1, then circulated to the upstream side of the filter 4 after being filtered through the filter 5 (or the filter 4 in a case where only the filter 4 was used), and then filtered again through the filters 4 and 5. After the recirculation filtration treatment, the chemical liquid was stored in a container.

As shown in Table 1 which will be described later, in the example for which "N/A" is listed in the column of "First circulation", the substance to be purified stored in the storage tank was filtered through the filter 4 described in Table 1 without being subjected to the aforementioned circulation treatment.

The liquid contact portion of various devices (such as a distillation column, piping, and a storage tank) coming into contact with the substance to be purified in the series of purification process described above was constituted with electropolished stainless steel.

The content of a metal component in the chemical liquid were measured by the following method.

<Content of Metal Component>

The content of the metal component (metal ions and metal-containing particles) in the chemical liquid was measured by a method using ICP-MS and SP-ICP-MS.

The used devices are as follows.

Manufacturer: PerkinElmer

Model: NexION350S

The following analysis software was used for analysis.

Syngistix nano application module dedicated for "SP-ICP-MS"

Syngistix for ICP-MS software

<Evaluation Method>

(Residue Evaluation)

First, a silicon substrate having a diameter of 300 mm was coated with an organic antireflection film-forming composition ARC29SR (manufactured by Nissan Chemical Corporation) and baked at 205° C. for 60 seconds, thereby forming an antireflection film having a film thickness of 78 nm.

In order to improve coating properties, a prewet solution (manufactured by FUJIFILM Electronic Materials Co., Ltd., cyclohexanone) was added dropwise to the surface of the antireflection film in the silicon substrate on which the antireflection film was formed, and spin coating was performed.

Then, the antireflection film was coated with any of the compositions 1 to 4 that will be described later, and subjected to prebaking according to the conditions described in the column of "Prebake" in Table 1, thereby forming a coating film having a film thickness of 50 nm.

Thereafter, by using an ArF excimer laser scanner (NA: 0.75), pattern exposure was performed on the coating film at 25 [mJ/cm$^2$]. The substrate was then heated at 120° C. for 60 seconds. Then, the substrate was subjected to puddle development for 30 seconds using the alkali developer described in Table 1. Subsequently, the silicon substrate was rotated at a rotation speed of 4,000 rpm for 30 seconds, thereby forming a positive resist pattern. Next, in examples and comparative examples for which "Performed" is listed in the column of "Water rinsing" in Table 1, the positive resist pattern was washed with water. Thereafter, the positive resist pattern was washed with the chemical liquid (alcohol-based solvent) described in each of the examples and comparative examples. The obtained positive resist pattern was then post-baked at 200° C. for 300 seconds. Through the above steps, an L/S pattern at line/space of 1:1 was obtained. The line width was 65 nm.

In Comparative Example 1, "Not performed" is listed in the column of "Water rinsing", which means that the positive resist pattern was not washed with water.

The space portion of the L/S pattern obtained as above was observed, and the residue defects (remaining residues) were evaluated according to the following standard.

"A": The number of residue defects was 5/wafer or less.

"B": The number of residue defects was more than 5/wafer and 10/wafer or less.

"C": The number of residue defects was more than 10/wafer and 20/wafer or less.

"D": The number of residue defects was more than 20/wafer and 30/wafer or less.

"E": The number of residue defects was more than 30/wafer.

(LWR Evaluation)

A silicon wafer was coated with an organic antireflection film-forming composition ARC29SR (manufactured by Brewer Science, Inc.) and then baked at 205° C. for 60 seconds, thereby forming an antireflection film having a film thickness of 98 nm.

Then, the antireflection film was coated with any of the compositions 1 to 4 that will be described later and baked at 100° C. for 60 seconds, thereby forming a coating film (resist film) having a film thickness of 50 nm.

Thereafter, by using an ArF excimer laser immersion scanner (manufactured by ASML; XT1700i, NA 1.20, C-Quad, outer sigma 0.730, inner sigma 0.630, XY polarized), the obtained coating film was exposed through a 6% halftone mask with a 1:1 line-and-space pattern having a line width of 75 nm. Ultrapure water was used as the immersion liquid. The exposed coating film was baked at 120° C. for 60 seconds, then developed with the alkali developer shown in Table 1 for 30 seconds, then washed with water, and then rinsed for 30 seconds with the chemical liquid of each of the examples and comparative examples shown in Table 1. Then, spin drying was performed, thereby obtaining a positive line-shaped pattern.

The obtained pattern was evaluated by the following method. The evaluation results are shown in Table 1.

The obtained line-and-space pattern having a line width of 75 nm (1:1) was observed from above the pattern by using a length-measuring scanning electron microscope (SEM (S-9380II, Hitachi, Ltd.)), and the line width was measured at random points (160 points). The variation of the measured line width was evaluated by 3σ. The lower the value of LWR, the smaller the variation of the pattern line width, and the better the performance.

"A": 3σ is 4 nm or less.
"B": 3σ is more than 4 nm and 5 nm or less.
"C": 3σ is more than 5 nm and 6 nm or less.
"D": 3σ is more than 6 nm and 7 nm or less.
"E": 3σ is more than 7 nm.

<CDU Evaluation>

A silicon wafer was coated with an organic antireflection film-forming composition ARC29SR (manufactured by Brewer Science, Inc.) and then baked at 205° C. for 60 seconds, thereby forming an antireflection film having a film thickness of 98 nm.

Then, the antireflection film was coated with any of the compositions 1 to 4 that will be described later and baked at 100° C. for 60 seconds, thereby forming a coating film (resist film) having a film thickness of 50 nm.

By using an ArF excimer laser immersion scanner (manufactured by ASML; XT1700i, NA 1.20, C-Quad, outer sigma 0.810, inner sigma 0.65, XY polarized), the obtained wafer was patternwise exposed through a halftone square pattern mask having 80 nm hole portions and a pitch between holes of 480 nm. Ultrapure water was used as an immersion liquid. The wafer was then heated at 100° C. for 60 seconds.

Thereafter, the wafer was developed with the alkali developer shown in Table 1 for 30 seconds, then washed with water, and then rinsed for 30 seconds with the chemical liquid of each of the examples and comparative examples shown in Table 1. Subsequently, spin drying was performed, thereby obtaining a positive hole-shaped pattern.

The obtained pattern was evaluated by the following method. The evaluation results are shown in Table 1.

The obtained pattern was observed from above the pattern by using a length-measuring scanning electron microscope (SEM (S-9380I1, Hitachi, Ltd.)), and the size of a total of 500 holes was measured. The standard deviation thereof was determined, and 3σ was calculated. The lower the value of 3σ, the smaller the variation in dimensions, which shows that the performance is excellent.

"A": 3σ is 5 nm or less.
"B": 3σ is more than 5 nm and 6 nm or less.
"C": 3σ is more than 6 nm and 7 nm or less.
"D": 3σ is more than 7 nm and 8 nm or less.
"E": 3σ is more than 8 nm.

(Composition 1)

Acid-decomposable resin (resin represented by the following formula (weight-average molecular weight (Mw): 7,500): the numerical value described in each repeating unit means mol %): 100 parts by mass

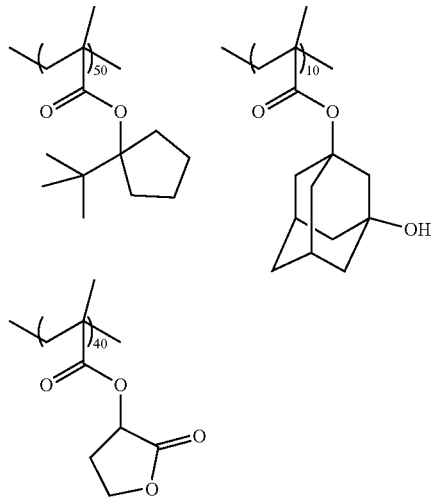

The following photoacid generator: 8 parts by mass

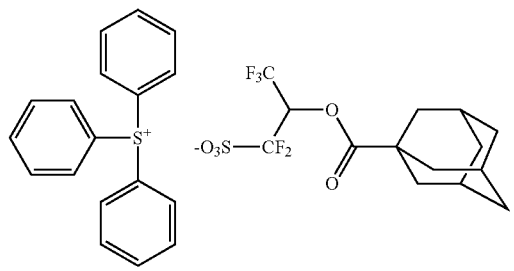

The following quencher: 5 parts by mass (the mass ratio was 0.1:0.3:0.3:0.2 in this order from the left).

Among the following quenchers, a polymer-type quencher has a weight-average molecular weight (Mw) of 5,000. The numerical value described in each repeating unit means molar ratio.

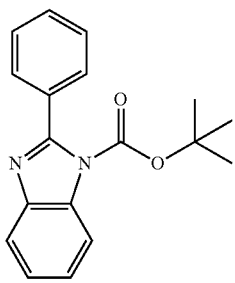

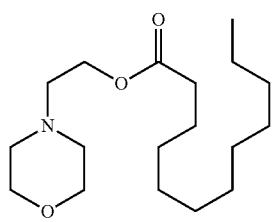

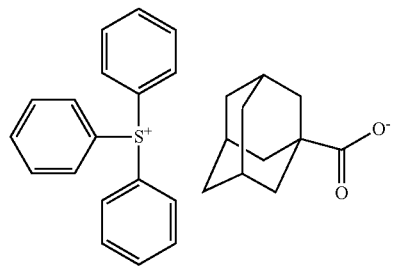

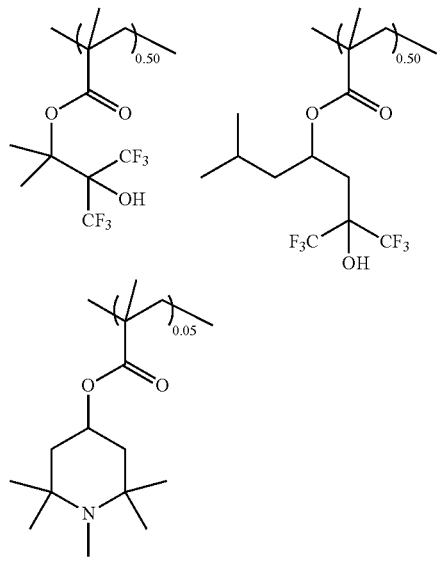

The following hydrophobic resins: 4 parts by mass (the mass ratio was 0.5:0.5 in this order from the left).

Among the following hydrophobic resins, the hydrophobic resin on the left side has a weight-average molecular weight (Mw) of 7,000, and the hydrophobic resin on the right side has a weight-average molecular weight (Mw) of 8,000. In each of the hydrophobic resins, the numerical value described in each repeating unit means molar ratio.

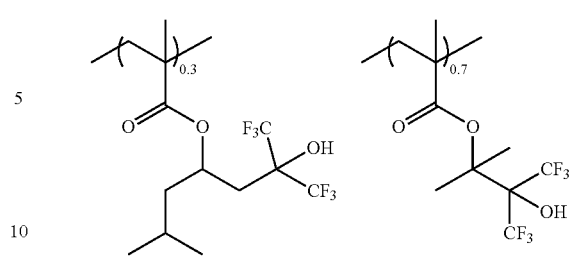

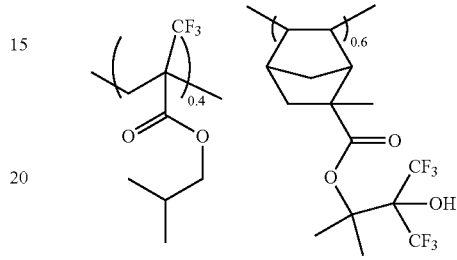

Solvent:

Propylene glycol monomethylether acetate (PGMEA): 3 parts by mass

Cyclohexanone: 600 parts by mass

γ-Butyrolactone (γ-BL): 100 parts by mass (Composition 2)

Acid-decomposable resin (resin represented by the following formula (weight-average molecular weight (Mw) 8,000): the numerical value described in each repeating unit means mol %): 100 parts by mass

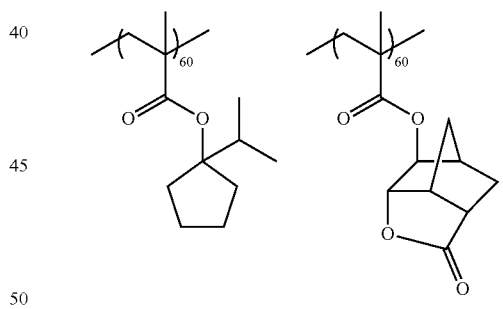

The following photoacid generator: 12 parts by mass (the mass ratio was 0.5:0.5 in this order from the left).

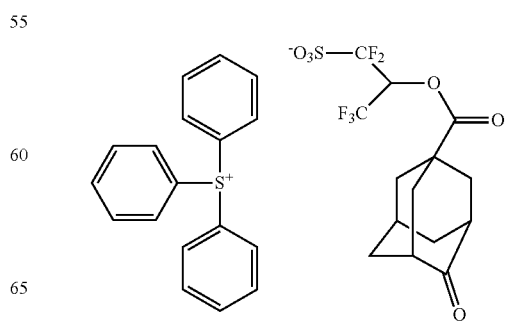

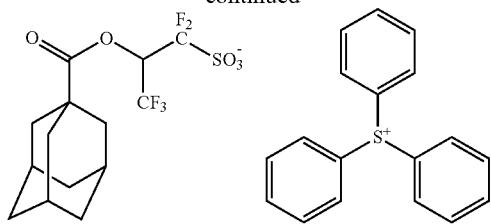

The following quencher: 5 parts by mass (the mass ratio was 0.3:0.7 in this order from the left).

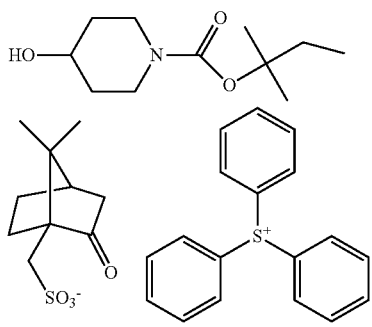

The following hydrophobic resins: 5 parts by mass (the mass ratio was 0.8:0.2 in this order from the top).

Among the following hydrophobic resins, the hydrophobic resin on the upper side has a weight-average molecular weight (Mw) of 8,000, and the hydrophobic resin on the lower side has a weight-average molecular weight (Mw) of 6,000. In each of the hydrophobic resins, the numerical value described in each repeating unit means molar ratio.

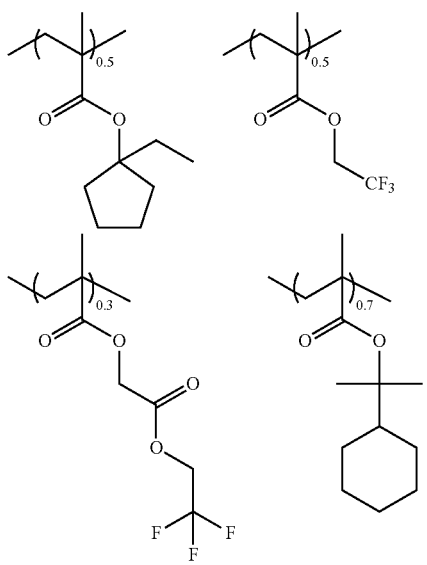

Solvent:
Propylene glycol monomethylether acetate (PGMEA): 3 parts by mass
Cyclohexanone: 600 parts by mass
γ-Butyrolactone (γ-BL): 100 parts by mass (Composition 3)

Acid-decomposable resin (resin represented by the following formula (weight-average molecular weight (Mw) 8,000): the numerical value described in each repeating unit means mol %): 100 parts by mass

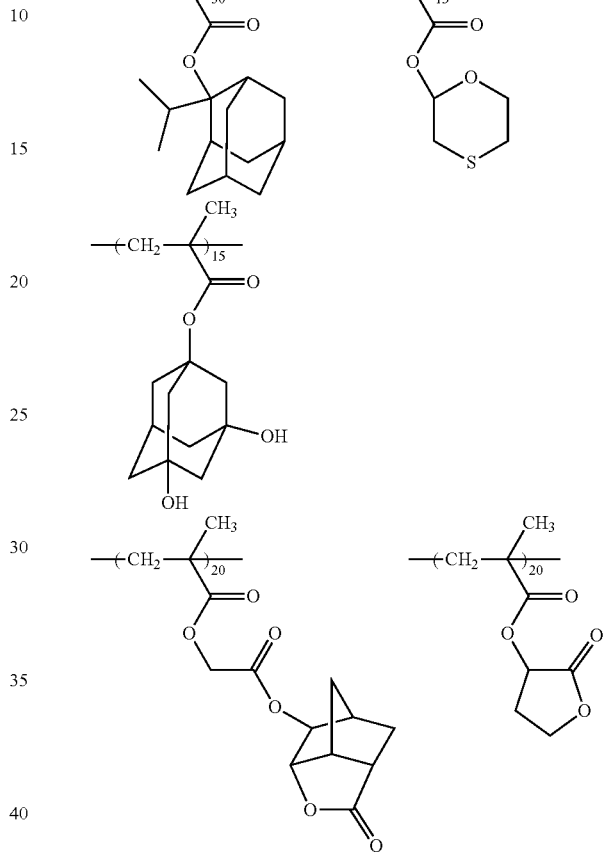

The following photoacid generator: 15 parts by mass

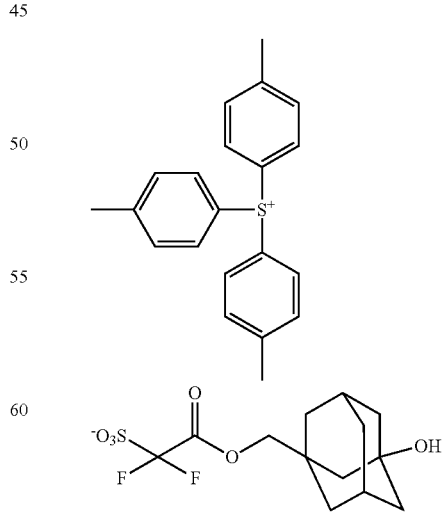

The following quencher: 7 parts by mass (the mass ratio was 1:1 in this order from the left).

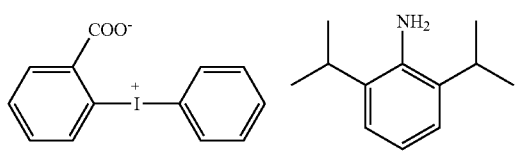

The following hydrophobic resins: 20 parts by mass (the mass ratio was 3:7 in this order from the top).

Among the following hydrophobic resins, the hydrophobic resin on the upper side has a weight-average molecular weight (Mw) of 10,000, and the hydrophobic resin on the lower side has a weight-average molecular weight (Mw) of 7,000. In the following hydrophobic resins, the molar ratio of repeating units is 0.67 and 0.33 in order from the left.

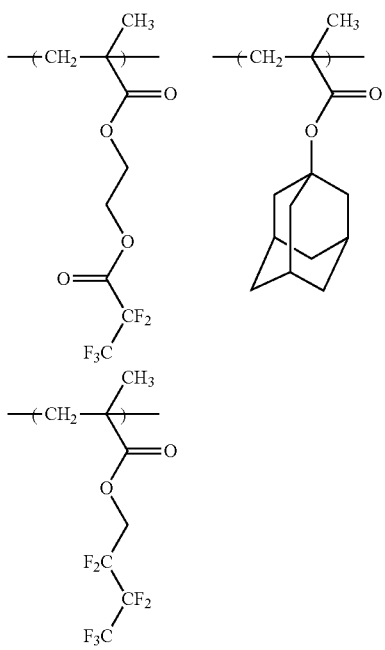

Solvent:
Propylene glycol monomethyl ether acetate (PGMEA): 50 parts by mass
PGME (propylene glycol monomethyl ether): 100 parts by mass
2-Heptanone: 100 parts by mass
γ-Butyrolactone (γ-BL): 500 parts by mass
(Composition 4)
Acid-decomposable resin (resin represented by the following formula (weight-average molecular weight (Mw) 6,500): the numerical value described in each repeating unit means mol %): 80 parts by mass

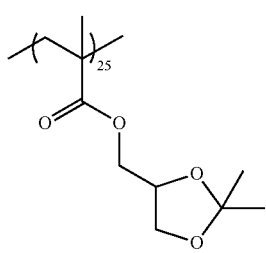

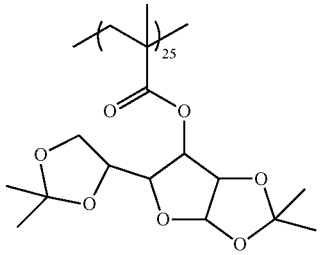

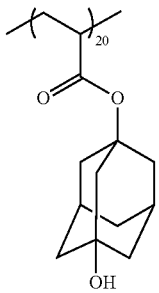

The following photoacid generator: 15 parts by mass

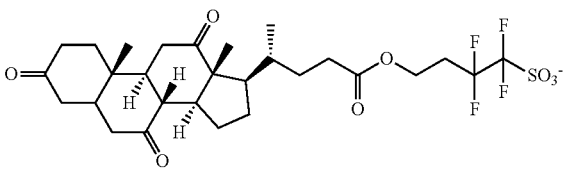

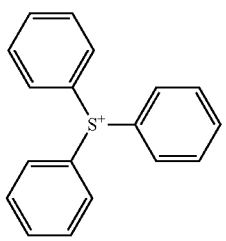

The following quencher: 5 parts by mass

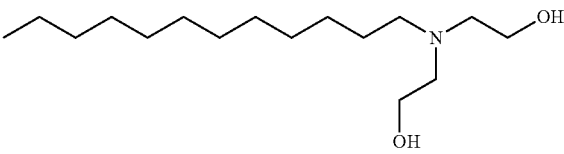 [SMILES: CCCCCCCCCCCCN(CCO)CCO]

The following hydrophobic resin (weight-average molecular weight (Mw) 5,000): 60 parts by mass

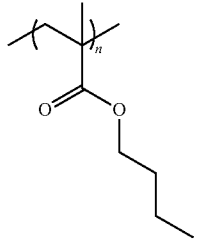

Solvent:
Propylene glycol monomethyl ether acetate (PGMEA): 70 parts by mass
Methyl-2-Hydroxybutyrate (HBM): 100 parts by mass
Cyclohexanone: 700 parts by mass In Table 1, the column of "alkali developer" shows the components contained in each alkali developer, and each symbol represents the following.
TMAH: Tetramethylammonium hydroxide
"EDTA": Ethylenediaminetetraacetic acid
"DTPA": Diethylenetriaminepentaacetic acid
"DBSA": p-Dodecylbenzenesulfonic acid
"Surfynol 440": Surfynol 440
"Surfynol 480": Surfynol 480

The concentration in the column of "Alkali developer" is the concentration of each compound with respect to the total amount of the alkali developer.

Each alkali developer contains water in addition to the components described in Table 1.

The column of "C log P" in Table 1 shows the C log P value of the used solvent (for example, methyl isobutyl carbinol in Example 1). For Example 23, this column shows the C log P value of "isopropyl alcohol".

"Vapor pressure (kPa)" in Table 1 shows the vapor pressure of the used solvent at 25° C. For Example 23, this column shows the vapor pressure of "isopropyl alcohol" at 25° C.

"Carbon number" in Table 1 shows the number of carbon atoms contained in the used solvent. For example 23, this column shows the carbon number of "isopropyl alcohol".

"C/O ratio" in Table 1 shows the ratio of the number of carbon atoms to the number of oxygen atoms contained in the used solvent. For example 23, this column shows the ratio of "isopropyl alcohol".

The column of "Solvent concentration (% by mass)" in Table 1 shows the content (% by mass) of the solvent with respect to the total mass of the chemical liquid of each of the examples and comparative examples. For example 23, this column shows the content of "isopropyl alcohol".

The column of "Metal component (ppt by mass)" in Table 1 shows the content (ppt by mass) of the metal component with respect to the total mass of the chemical liquid of each of the examples and comparative examples.

TABLE 1

| | Raw material | | | | |
|---|---|---|---|---|---|
| | Solvent type | ClogP | Vapor pressure (kPa) | Carbon number | C/O ratio |
| Example 1 | Methyl isobutyl carbinol | 1.57 | 0.49 | 6 | 6 |
| Example 2 | Methyl isobutyl carbinol | 1.57 | 0.49 | 6 | 6 |
| Example 3 | Methyl isobutyl carbinol | 1.57 | 0.49 | 6 | 6 |
| Example 4 | Methyl isobutyl carbinol | 1.57 | 0.49 | 6 | 6 |
| Example 5 | Methyl isobutyl carbinol | 1.57 | 0.49 | 6 | 6 |
| Example 6 | Methyl isobutyl carbinol | 1.57 | 0.49 | 6 | 6 |
| Example 7 | Methyl isobutyl carbinol | 1.57 | 0.49 | 6 | 6 |
| Example 8 | Methyl isobutyl carbinol | 1.57 | 0.49 | 6 | 6 |
| Example 9 | Methyl isobutyl carbinol | 1.57 | 0.49 | 6 | 6 |
| Example 10 | Methyl isobutyl carbinol | 1.57 | 0.49 | 6 | 6 |
| Example 11 | Methyl isobutyl carbinol | 1.57 | 0.49 | 6 | 6 |
| Example 12 | Methyl isobutyl carbinol | 1.57 | 0.49 | 6 | 6 |
| Example 13 | Methyl isobutyl carbinol | 1.57 | 0.49 | 6 | 6 |
| Example 14 | Methyl isobutyl carbinol | 1.57 | 0.49 | 6 | 6 |
| Example 15 | Methyl isobutyl carbinol | 1.57 | 0.49 | 6 | 6 |
| Example 16 | Methyl isobutyl carbinol | 1.57 | 0.49 | 6 | 6 |
| Example 17 | Methyl isobutyl carbinol | 1.57 | 0.49 | 6 | 6 |
| Example 18 | Methyl isobutyl carbinol | 1.57 | 0.49 | 6 | 6 |
| Example 19 | Methyl isobutyl carbinol | 1.57 | 0.49 | 6 | 6 |
| Example 20 | Methyl isobutyl carbinol | 1.57 | 0.49 | 6 | 6 |
| Example 21 | Methyl isobutyl carbinol | 1.57 | 0.49 | 6 | 6 |
| Example 22 | Isopropyl alcohol | 0.16 | 10.81 | 6 | 6 |
| Example 23 | Isopropyl alcohol + water | 0.16 | 10.81 | 3 | 3 |
| Example 24 | 2,6-Dimethyl-4-heptanol | 2.98 | 0.05 | 9 | 9 |
| Example 25 | 2,4-Diethyl-1,5-pentanediol | 1.16 | 0.01 | 9 | 4.5 |
| Example 26 | 2-Ethyl-1-hexanol | 2.82 | 0.03 | 8 | 8 |
| Example 27 | 3-Methyl-1,5-pentanediol | −0.25 | 0.07 | 6 | 3 |
| Example 28 | 2-Octanol | 2.82 | 0.05 | 8 | 8 |
| Example 29 | 3-Methyl-1-butanol | 1.22 | 0.56 | 5 | 5 |
| Example 30 | 2,4-Dimethyl-3-pentanol | 1.92 | 0.37 | 7 | 7 |
| Example 31 | 2-Methylpentane-2,4-diol | 0 | 0.03 | 6 | 3 |
| Example 32 | 3,5,5-Trimethyl-1-hexanol | 2.98 | 0.03 | 9 | 9 |
| Example 33 | 2-Methylcyclohexanol | 1.83 | 0.08 | 7 | 7 |
| Example 34 | 1,3-Butanediol | −0.69 | 0.03 | 4 | 2 |
| Example 35 | 2-Ethyl-1,3-hexanediol | 1.25 | 0.01 | 8 | 4 |
| Example 36 | 2-Butyl-2-ethyl-1,3-propanediol | 1.78 | 0.01 | 9 | 4.5 |
| Example 37 | 3-Methyl-1,3-butanediol | −0.34 | 0.03 | 5 | 2.5 |
| Example 38 | Trimethylolpropane | −0.85 | 0.01 | 6 | 2 |
| Comparative Example 1 | Methyl isobutyl carbinol | 1.57 | 0.49 | 6 | 6 |
| Comparative Example 2 | Butyl acetate | 1.77 | 1.20 | 6 | 3 |

TABLE 1-2

| | Purification treatment | | | | | | |
|---|---|---|---|---|---|---|---|
| | Distillation | Filter 1 | Filter 2 | Filter 3 | Filter 4 | Filter 5 | Circulation |
| Example 1 | Condition 1 | PP 200 nm | IEX 50 nm | PTFE 50 nm | UPE 3 nm | | Performed |
| Example 2 | Condition 1 | PP 200 nm | IEX 50 nm | PTFE 50 nm | UPE 3 nm | | Not performed |
| Example 3 | Condition 1 | PP 200 nm | IEX 50 nm | PTFE 50 nm | UPE 3 nm | | Performed |
| Example 4 | Condition 1 | PP 200 nm | IEX 50 nm | PTFE 50 nm | UPE 3 nm | UPE 3 nm | Performed |
| Example 5 | Condition 1 | PP 200 nm | IEX 50 nm | PTFE 50 nm | UPE 3 nm | | Performed |

TABLE 1-2-continued

|  | Purification treatment | | | | | | |
|---|---|---|---|---|---|---|---|
|  | Distillation | Filter 1 | Filter 2 | Filter 3 | Filter 4 | Filter 5 | Circulation |
| Example 6 | Condition 1 | PP 200 nm | IEX 50 nm | PTFE 50 nm | UPE 3 nm |  | Performed |
| Example 7 | Condition 1 | PP 200 nm | IEX 50 nm | PTFE 50 nm | UPE 3 nm |  | Performed |
| Example 8 | Condition 1 | PP 200 nm | IEX 50 nm | PTFE 50 nm | UPE 3 nm |  | Performed |
| Example 9 | Condition 1 | PP 200 nm | IEX 50 nm | PTFE 50 nm | UPE 3 nm |  | Performed |
| Example 10 | Condition 1 | PP 200 nm | IEX 50 nm | PTFE 50 nm | UPE 3 nm |  | Performed |
| Example 11 | Condition 1 | PP 200 nm | IEX 50 nm | PTFE 50 nm | UPE 3 nm |  | Performed |
| Example 12 | Condition 1 | PP 200 nm | IEX 50 nm | PTFE 50 nm | UPE 3 nm |  | Performed |
| Example 13 | Condition 1 | PP 200 nm | IEX 50 nm | PTFE 50 nm | UPE 3 nm |  | Performed |
| Example 14 | Condition 1 | PP 200 nm | IEX 50 nm | PTFE 50 nm | UPE 3 nm |  | Performed |
| Example 15 | Condition 1 | PP 200 nm | IEX 50 nm | PTFE 50 nm | UPE 3 nm |  | Performed |
| Example 16 | Condition 1 | PP 200 nm | IEX 50 nm | PTFE 50 nm | UPE 3 nm |  | Performed |
| Example 17 | Condition 1 | PP 200 nm | IEX 50 nm | PTFE 50 nm | UPE 3 nm |  | Performed |
| Example 18 | Condition 1 | PP 200 nm | IEX 50 nm | PTFE 50 nm | UPE 3 nm |  | Performed |
| Example 19 | Condition 1 | PP 200 nm | IEX 50 nm | PTFE 50 nm | UPE 3 nm |  | Performed |
| Example 20 | Condition 1 | PP 200 nm | IEX 50 nm | PTFE 50 nm | UPE 3 nm |  | Performed |
| Example 21 | Condition 1 | PP 200 nm | IEX 50 nm | PTFE 50 nm | UPE 3 nm |  | Performed |
| Example 22 | Condition 1 | PP 200 nm | IEX 50 nm | PTFE 50 nm | UPE 3 nm |  | Performed |
| Example 23 | Condition 1 | PP 200 nm | IEX 50 nm | PTFE 50 nm | UPE 3 nm |  | Performed |
| Example 24 | Condition 1 | PP 200 nm | IEX 50 nm | PTFE 50 nm | UPE 3 nm |  | Performed |
| Example 25 | Condition 1 | PP 200 nm | IEX 50 nm | PTFE 50 nm | UPE 3 nm |  | Performed |
| Example 26 | Condition 1 | PP 200 nm | IEX 50 nm | PTFE 50 nm | UPE 3 nm |  | Performed |
| Example 27 | Condition 1 | PP 200 nm | IEX 50 nm | PTFE 50 nm | UPE 3 nm |  | Performed |
| Example 28 | Condition 1 | PP 200 nm | IEX 50 nm | PTFE 50 nm | UPE 3 nm |  | Performed |
| Example 29 | Condition 1 | PP 200 nm | IEX 50 nm | PTFE 50 nm | UPE 3 nm |  | Performed |
| Example 30 | Condition 1 | PP 200 nm | IEX 50 nm | PTFE 50 nm | UPE 3 nm |  | Performed |
| Example 31 | Condition 1 | PP 200 nm | IEX 50 nm | PTFE 50 nm | UPE 3 nm |  | Performed |
| Example 32 | Condition 1 | PP 200 nm | IEX 50 nm | PTFE 50 nm | UPE 3 nm |  | Performed |
| Example 33 | Condition 1 | PP 200 nm | IEX 50 nm | PTFE 50 nm | UPE 3 nm |  | Performed |
| Example 34 | Condition 1 | PP 200 nm | IEX 50 nm | PTFE 50 nm | UPE 3 nm |  | Performed |
| Example 35 | Condition 1 | PP 200 nm | IEX 50 nm | PTFE 50 nm | UPE 3 nm |  | Performed |
| Example 36 | Condition 1 | PP 200 nm | IEX 50 nm | PTFE 50 nm | UPE 3 nm |  | Performed |
| Example 37 | Condition 1 | PP 200 nm | IEX 50 nm | PTFE 50 nm | UPE 3 nm |  | Performed |
| Example 38 | Condition 1 | PP 200 nm | IEX 50 nm | PTFE 50 nm | UPE 3 nm |  | Performed |
| Comparative Example 1 | Condition 1 | PP 200 nm | IEX 50 nm | PTFE 50 nm | UPE 3 nm |  | Performed |
| Comparative Example 2 | Condition 1 | PP 200 nm | IEX 50 nm | PTFE 50 nm | UPE 3 nm |  | Performed |

TABLE 3

|  | Chemical liquid | | Actinic ray- | Prebake | |
|---|---|---|---|---|---|
|  | Solvent concentration (% by mass) | Metal component (ppt by mass) | sensitive or radiation-sensitive resin composition | Temperature (° C.) | Time (sec) |
| Example 1 | 99.95 | 86 | Composition 1 | 100 | 60 |
| Example 2 | 99.95 | 112 | Composition 1 | 100 | 60 |
| Example 3 | 99.95 | 28 | Composition 1 | 100 | 60 |
| Example 4 | 99.95 | 0.05 | Composition 1 | 100 | 60 |
| Example 5 | 99.95 | 86 | Composition 1 | 100 | 60 |
| Example 6 | 99.95 | 86 | Composition 1 | 100 | 60 |
| Example 7 | 99.95 | 86 | Composition 1 | 100 | 60 |
| Example 8 | 99.95 | 86 | Composition 1 | 100 | 60 |
| Example 9 | 99.95 | 86 | Composition 1 | 100 | 60 |
| Example 10 | 99.95 | 86 | Composition 1 | 100 | 60 |
| Example 11 | 99.95 | 86 | Composition 1 | 100 | 60 |
| Example 12 | 99.95 | 86 | Composition 1 | 100 | 60 |
| Example 13 | 99.95 | 86 | Composition 1 | 100 | 60 |
| Example 14 | 99.95 | 86 | Composition 2 | 100 | 60 |
| Example 15 | 99.95 | 86 | Composition 3 | 100 | 60 |
| Example 16 | 99.95 | 86 | Composition 4 | 100 | 60 |
| Example 17 | 99.95 | 86 | Composition 1 | 90 | 120 |
| Example 18 | 99.95 | 86 | Composition 1 | 75 | 100 |
| Example 19 | 99.95 | 86 | Composition 1 | 100 | 240 |
| Example 20 | 99.95 | 86 | Composition 1 | 100 | 120 |
| Example 21 | 99.95 | 86 | Composition 1 | 100 | 180 |
| Example 22 | 99.95 | 86 | Composition 1 | 100 | 60 |
| Example 23 | 80 | 72 | Composition 1 | 100 | 60 |
| Example 24 | 99.95 | 71 | Composition 1 | 100 | 60 |
| Example 25 | 99.95 | 75 | Composition 1 | 100 | 60 |
| Example 26 | 99.95 | 79 | Composition 1 | 100 | 60 |
| Example 27 | 99.95 | 81 | Composition 1 | 100 | 60 |
| Example 28 | 99.95 | 92 | Composition 1 | 100 | 60 |
| Example 29 | 99.95 | 85 | Composition 1 | 100 | 60 |
| Example 30 | 99.95 | 84 | Composition 1 | 100 | 60 |
| Example 31 | 99.95 | 83 | Composition 1 | 100 | 60 |
| Example 32 | 99.95 | 82 | Composition 1 | 100 | 60 |
| Example 33 | 99.95 | 79 | Composition 1 | 100 | 60 |
| Example 34 | 99.95 | 78 | Composition 1 | 100 | 60 |
| Example 35 | 99.95 | 75 | Composition 1 | 100 | 60 |
| Example 36 | 99.95 | 84 | Composition 1 | 100 | 60 |
| Example 37 | 99.95 | 86 | Composition 1 | 100 | 60 |
| Example 38 | 99.95 | 81 | Composition 1 | 100 | 60 |
| Comparative Example 1 | 99.95 | 86 | Composition 1 | 100 | 60 |
| Comparative Example 2 | 99.95 | 91 | Composition 1 | 100 | 60 |

TABLE 1-4

| | Alkali developer | | | | | | water rinsing |
|---|---|---|---|---|---|---|---|
| | Type | Concentration (% by mass) | Type | Concentration (ppm by mass) | Type | Concentration (ppm by mass) | |
| Example 1 | TMAH | 2.3 | | | | | Performed |
| Example 2 | TMAH | 2.3 | | | | | Performed |
| Example 3 | TMAH | 2.3 | | | | | Performed |
| Example 4 | TMAH | 2.3 | | | | | Performed |
| Example 5 | TMAH | 0.5 | | | | | Performed |
| Example 6 | TMAH | 1.0 | | | | | Performed |
| Example 7 | TMAH | 5.0 | | | | | Performed |
| Example 8 | TMAH | 10.0 | | | | | Performed |
| Example 9 | TMAH | 2.3 | EDTA | 500 | | | Performed |
| Example 10 | TMAH | 2.3 | DTPA | 500 | | | Performed |
| Example 11 | TMAH | 2.3 | | | DBSA | 100 | Performed |
| Example 12 | TMAH | 2.3 | | | Surfynol 440 | 50 | Performed |
| Example 13 | TMAH | 2.3 | | | Surfynol 480 | 200 | Performed |
| Example 14 | TMAH | 2.3 | | | | | Performed |
| Example 15 | TMAH | 2.3 | | | | | Performed |
| Example 16 | TMAH | 2.3 | | | | | Performed |
| Example 17 | TMAH | 2.3 | | | | | Performed |
| Example 18 | TMAH | 2.3 | | | | | Performed |
| Example 19 | TMAH | 2.3 | | | | | Performed |
| Example 20 | TMAH | 2.3 | | | | | Performed |
| Example 21 | TMAH | 2.3 | | | | | Performed |
| Example 22 | TMAH | 2.3 | | | | | Performed |
| Example 23 | TMAH | 2.3 | | | | | Performed |
| Example 24 | TMAH | 2.3 | | | | | Performed |
| Example 25 | TMAH | 2.3 | | | | | Performed |
| Example 26 | TMAH | 2.3 | | | | | Performed |
| Example 27 | TMAH | 2.3 | | | | | Performed |
| Example 28 | TMAH | 2.3 | | | | | Performed |
| Example 29 | TMAH | 2.3 | | | | | Performed |
| Example 30 | TMAH | 2.3 | | | | | Performed |
| Example 31 | TMAH | 2.3 | | | | | Performed |
| Example 32 | TMAH | 2.3 | | | | | Performed |
| Example 33 | TMAH | 2.3 | | | | | Performed |
| Example 34 | TMAH | 2.3 | | | | | Performed |
| Example 35 | TMAH | 2.3 | | | | | Performed |
| Example 36 | TMAH | 2.3 | | | | | Performed |
| Example 37 | TMAH | 2.3 | | | | | Performed |
| Example 38 | TMAH | 2.3 | | | | | Performed |
| Comparative Example 1 | TMAH | 2.3 | | | | | Not performed |
| Comparative Example 2 | TMAH | 2.3 | | | | | Performed |

TABLE 5

| | Evaluation | | |
|---|---|---|---|
| | Residue | CDU | LWR |
| Example 1 | A | A | A |
| Example 2 | C | B | B |
| Example 3 | A | A | A |
| Example 4 | B | A | A |
| Example 5 | D | C | C |
| Example 6 | A | B | A |
| Example 7 | A | B | A |
| Example 8 | B | D | D |
| Example 9 | A | A | A |
| Example 10 | A | A | A |
| Example 11 | A | A | A |
| Example 12 | A | A | A |
| Example 13 | A | A | A |
| Example 14 | A | A | A |
| Example 15 | A | A | A |
| Example 16 | C | A | A |
| Example 17 | A | A | A |
| Example 18 | B | C | C |
| Example 19 | C | B | B |
| Example 20 | A | A | A |
| Example 21 | A | A | A |
| Example 22 | B | A | A |
| Example 23 | D | A | A |
| Example 24 | B | A | A |
| Example 25 | B | A | A |
| Example 26 | B | A | A |
| Example 27 | B | A | A |
| Example 28 | B | A | A |
| Example 29 | A | A | A |
| Example 30 | A | A | A |
| Example 31 | B | A | A |
| Example 32 | B | A | A |
| Example 33 | B | A | A |
| Example 34 | C | B | B |
| Example 35 | B | A | A |
| Example 36 | B | A | A |
| Example 37 | B | A | A |
| Example 38 | C | B | B |
| Comparative Example 1 | E | E | E |
| Comparative Example 2 | E | E | E |

In Table 1-1 to Table 1-5, the data relating to each of the examples and comparative examples is shown in each row.

For example, in Example 1, methyl isobutyl carbinol was used as shown in Table 1-1, and the distillation condition was "Condition 1" as shown in Table 1-2, the solvent concentration (% by mass) of the chemical liquid was 99.95% by mass as shown in Table 1-3, the type of alkali developer was "TMAH" as shown in Table 1-4, and the residue evaluation result was "A" as shown in Table 1-5. For other examples and comparative examples, the data is interpreted in the same manner.

As shown in Table 1, the resist pattern forming method according to an embodiment of the present invention can bring about a desired effect.

Particularly, by the comparison of Examples 1 to 4, it has been confirmed that the effect is further improved in a case where the content of the metal component is 0.10 to 100 ppt by mass with respect to the total mass of the chemical liquid.

From the comparison of Examples 5 to 8, it has been confirmed that the effect is further improved in a case where the content of the quaternary ammonium salt is 0.75% to 7.5% by mass with respect to the total mass of the alkali developer.

From the comparison of Examples 17 to 21, it has been confirmed that the effect is further improved in a case where the heating temperature in Step G (prebaking) is 80° C. to 120° C. and the heating time is 30 to 180 seconds.

Furthermore, from the comparison between Examples 23 and 24, it has confirmed that the effect is further improved in a case where the content of the alcohol-based solvent is 85.000% to 99.999% by mass with respect to the total mass of the chemical liquid.

By the comparison of Examples 34 and 38 and other examples, it has been confirmed that the effect is further improved in a case where the ratio of the number of carbon atoms to the number of oxygen atoms contained in the alcohol-based solvent is 3.0 or more (in a case where the C log P value of the alcohol-based solvent is −0.50 to 3.00).

From Table 1, it has been confirmed that the effect is further improved in a case where the alcohol-based solvent is methyl isobutyl carbinol, 3-methyl-1-butanol, or 2,4-dimethyl-3-pentanol.

What is claimed is:

1. A resist pattern forming method, comprising:
   a step A of forming a film on a substrate by using an actinic ray-sensitive or radiation-sensitive resin composition containing a photoacid generator and a resin whose polarity is increased by the action of an acid;
   a step B of exposing the film;
   a step C of developing the exposed film by using an alkali developer;
   a step D of washing the developed film by using water; and
   a step E of washing the film washed in the step D by using a chemical liquid containing an alcohol-based solvent and a metal component,
   wherein the alkali developer contains a quaternary ammonium salt,
   a content of the metal component is 0.10 to 100 ppt by mass with respect to a total mass of the chemical liquid.

2. The resist pattern forming method according to claim 1, wherein a content of the quaternary ammonium salt is 0.75% to 7.5% by mass with respect to a total mass of the alkali developer.

3. The resist pattern forming method according to claim 1, further comprising:
   a step F of drying a resist pattern obtained in the step E after the step E.

4. The resist pattern forming method according to claim 1, further comprising:
   a step G of heating the film between the step A and the step B.

5. The resist pattern forming method according to claim 1, wherein the alkali developer contains at least one kind of component selected from the group consisting of a surfactant and a chelating agent.

6. The resist pattern forming method according to claim 1, wherein a C log P value of the alcohol-based solvent is more than −1.00 and 3.00 or less.

7. The resist pattern forming method according to claim 1, wherein the alcohol-based solvent has 3 to 12 carbon atoms.

8. The resist pattern forming method according to claim 1, wherein a ratio of the number of carbon atoms contained in the alcohol-based solvent to the number of oxygen atoms contained in the alcohol-based solvent is 3.0 or more.

9. The resist pattern forming method according to claim 1, wherein the alcohol-based solvent has a vapor pressure of 0.01 to 10.0 kPa at 25° C.

10. The resist pattern forming method according to claim 1, wherein the alcohol-based solvent is selected from the group consisting of methyl isobutyl carbinol, 2,6-dimethyl-4-heptanol, 2,4-diethyl-1,5-pentanediol, 2-ethyl-1-hexanol, 3-methyl-1,5-pentanediol, 2-octanol, 3-methyl-1-butanol, 2,4-dimethyl-3-pentanol, 2-methylpentane-2,4-diol, 3,5,5-trimethyl-1-hexanol, 2-methylcyclohexanol, 1,3-butanediol, 2-ethyl-1,3-hexanediol, 2-butyl-2-ethyl-1,3-propanediol, 3-methyl-1,3-butanediol, and trimethylolpropane.

11. The resist pattern forming method according to claim 1, wherein the alcohol-based solvent is methyl isobutyl carbinol, 3-methyl-1-butanol, or 2,4-dimethyl-3-pentanol.

12. The resist pattern forming method according to claim 1, wherein a content of the alcohol-based solvent is 85.000% to 99.999% by mass with respect to a total mass of the chemical liquid.

13. A semiconductor chip manufacturing method, comprising:
   the resist pattern forming method according to claim 1.

14. The resist pattern forming method according to claim 2, further comprising:
   a step F of drying a resist pattern obtained in the step E after the step E.

15. The resist pattern forming method according to claim 2, further comprising:
   a step G of heating the film between the step A and the step B.

16. The resist pattern forming method according to claim 2, wherein the alkali developer contains at least one kind of component selected from the group consisting of a surfactant and a chelating agent.

17. The resist pattern forming method according to claim 2, wherein a C log P value of the alcohol-based solvent is more than −1.00 and 3.00 or less.

18. The resist pattern forming method according to claim 2, wherein the alcohol-based solvent has 3 to 12 carbon atoms.

19. The resist pattern forming method according to claim 2, wherein a ratio of the number of carbon atoms contained in the alcohol-based solvent to the number of oxygen atoms contained in the alcohol-based solvent is 3.0 or more.

* * * * *